(12) United States Patent  
Sasaki

(10) Patent No.: US 10,355,075 B2  
(45) Date of Patent: Jul. 16, 2019

(54) SEMICONDUCTOR DEVICES INCLUDING INSULATIVE MATERIALS EXTENDING BETWEEN CONDUCTIVE STRUCTURES

(71) Applicant: Micron Technology, Inc., Boise, ID (US)

(72) Inventor: Takashi Sasaki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/157,962

(22) Filed: Oct. 11, 2018

(65) Prior Publication Data

US 2019/0043941 A1     Feb. 7, 2019

Related U.S. Application Data

(60) Division of application No. 15/045,490, filed on Feb. 17, 2016, now Pat. No. 10,164,004, which is a continuation of application No. 14/462,766, filed on Aug. 19, 2014, now Pat. No. 9,299,709.

(30) Foreign Application Priority Data

Sep. 5, 2013  (JP) ............................... 2013-0184310

(51) Int. Cl.
*H01L 49/02*    (2006.01)
*H01L 27/108*   (2006.01)

(52) U.S. Cl.
CPC ........ *H01L 28/87* (2013.01); *H01L 27/10814* (2013.01); *H01L 27/10855* (2013.01); *H01L 27/10894* (2013.01); *H01L 28/90* (2013.01)

(58) Field of Classification Search
None
See application file for complete search history.

(56) References Cited

U.S. PATENT DOCUMENTS

| 5,780,339 A | 7/1998 | Liu |
| 6,465,351 B1 * | 10/2002 | Jeong ................ H01L 27/10852 |
| | | 257/E21.013 |
| 6,924,526 B2 | 8/2005 | Fukuda et al. |
| 6,992,346 B2 * | 1/2006 | Kim .................. H01L 21/32051 |
| | | 257/303 |

(Continued)

FOREIGN PATENT DOCUMENTS

JP     2012-099793     5/2012

*Primary Examiner* — Bilkis Jahan
(74) *Attorney, Agent, or Firm* — Wells St. John P.S.

(57) ABSTRACT

Disclosed herein is a device that includes: a semiconductor substrate; a first insulating layer over a surface of the semiconductor substrate; first and second contact plugs each including side and upper surfaces, the side surfaces of the first and second contact plugs being surrounded by the first insulating film, the upper surfaces of the first and second contact plugs being substantially on the same plane with an upper surface of the first insulating layer; a second insulating layer over the first insulating layer; a first conductive layer including a bottom portion on the first contact plug and a side portion surrounded by the second insulating layer; a third insulating layer over the first conductive layer; and a second conductive layer on the second contact plug, a part of a side surface of the second conductive layer being surrounded by both the second and third insulating layers.

11 Claims, 51 Drawing Sheets

(56) References Cited

U.S. PATENT DOCUMENTS

| | | |
|---|---|---|
| 2002/0127867 A1* | 9/2002 | Lee .................. H01L 27/11502 |
| | | 438/694 |
| 2003/0230811 A1 | 12/2003 | Kim |
| 2006/0024899 A1 | 2/2006 | Crenshaw et al. |
| 2006/0076599 A1 | 4/2006 | Goo |
| 2006/0118885 A1* | 6/2006 | Song .................. H01L 27/0629 |
| | | 257/379 |
| 2006/0131632 A1* | 6/2006 | Chae ................ H01L 27/10852 |
| | | 257/300 |
| 2007/0182017 A1 | 8/2007 | Park |
| 2009/0218654 A1 | 9/2009 | Goo |
| 2010/0012980 A1 | 1/2010 | Song et al. |
| 2010/0054021 A1 | 3/2010 | Thies |
| 2010/0221889 A1* | 9/2010 | Youn ................ H01L 27/10811 |
| | | 438/396 |
| 2011/0057239 A1 | 3/2011 | Arao |
| 2012/0086084 A1 | 4/2012 | Kikuchi |
| 2013/0056850 A1* | 3/2013 | Kume ............... H01L 27/10808 |
| | | 257/532 |

* cited by examiner

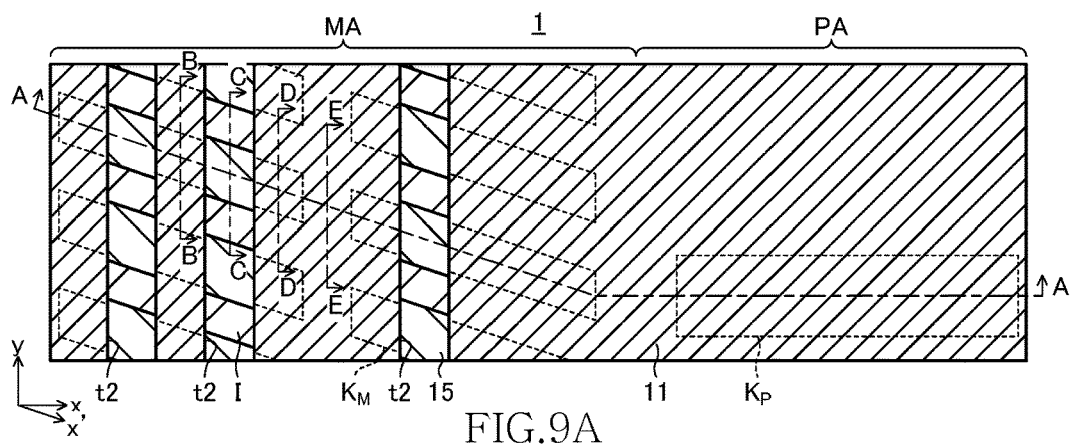
FIG.9A
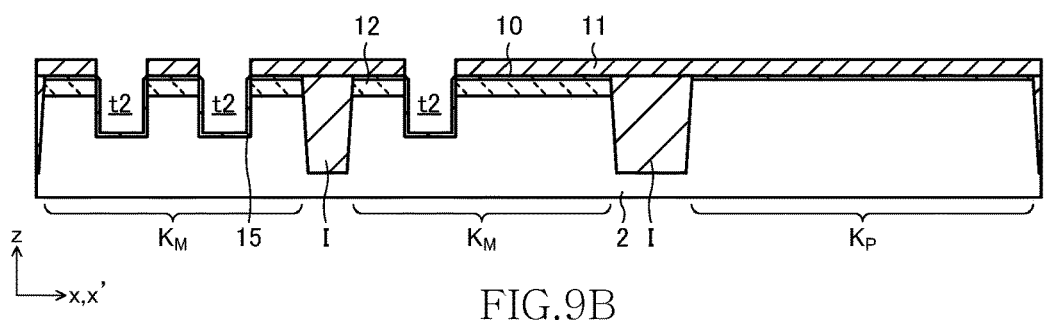
FIG.9B
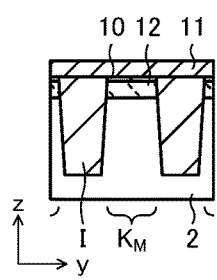 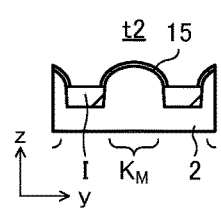 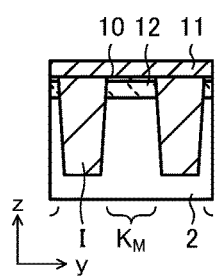 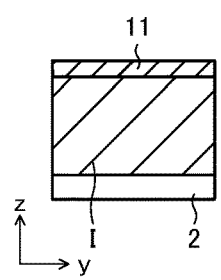
FIG.9C　　FIG.9D　　FIG.9E　　FIG.9F

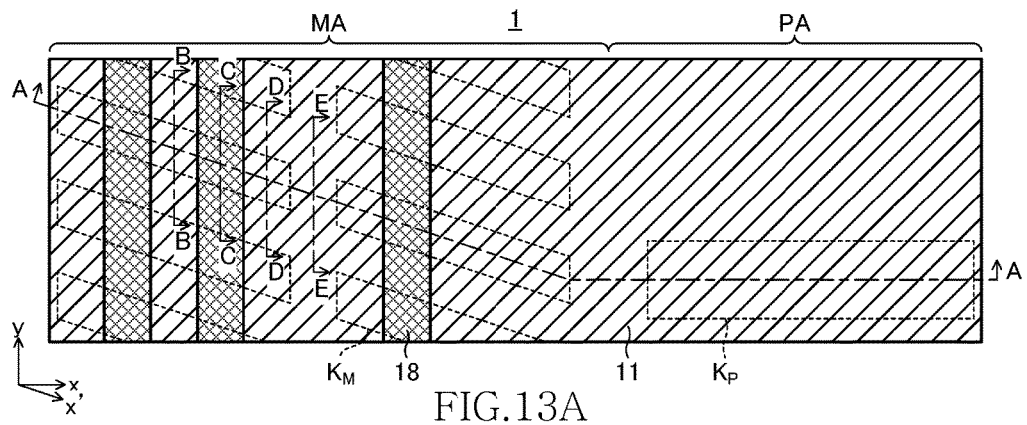
FIG.13A
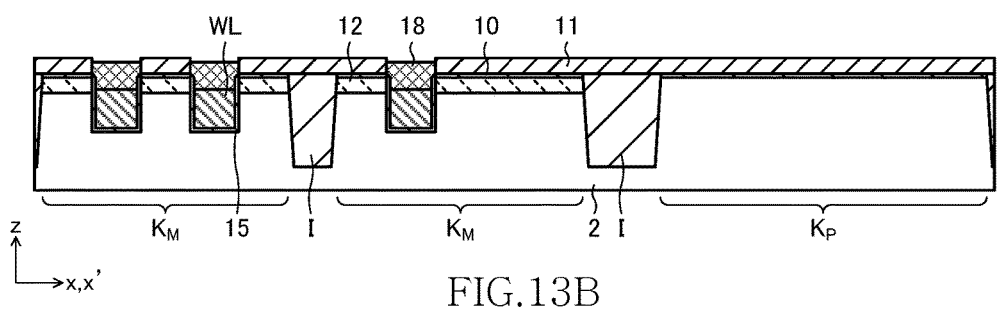
FIG.13B
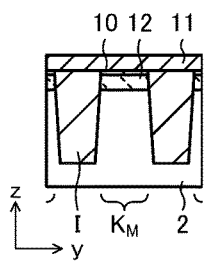 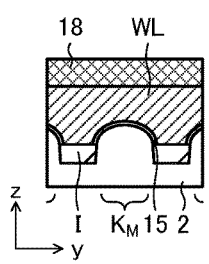 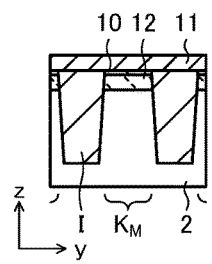 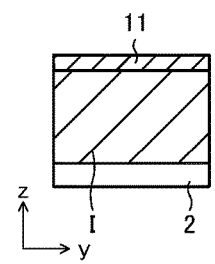
FIG.13C    FIG.13D    FIG.13E    FIG.13F

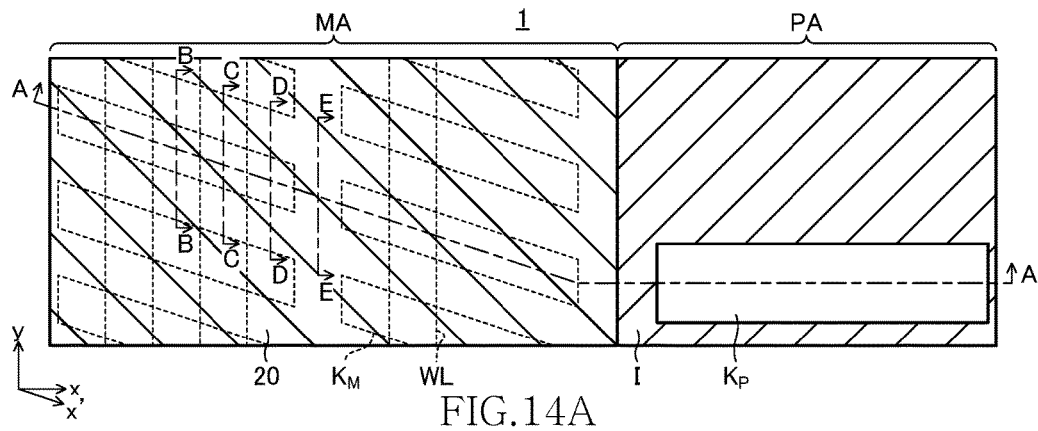
FIG.14A
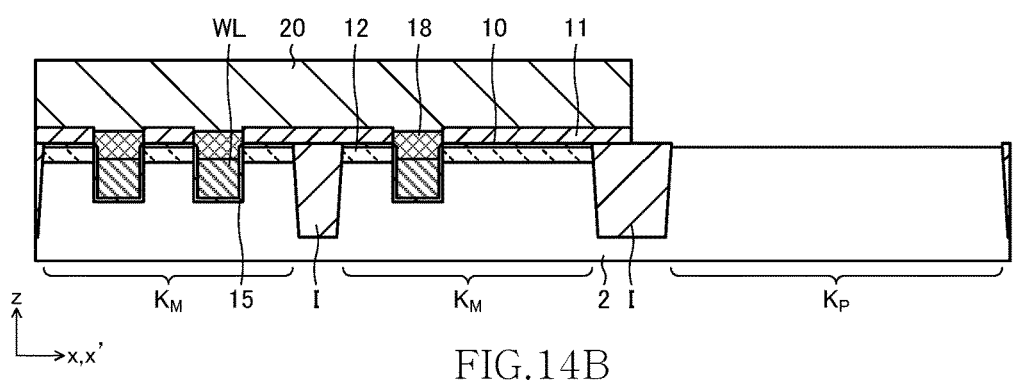
FIG.14B
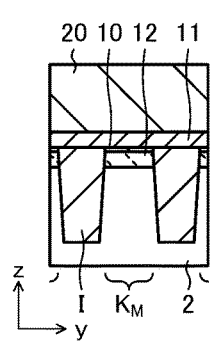 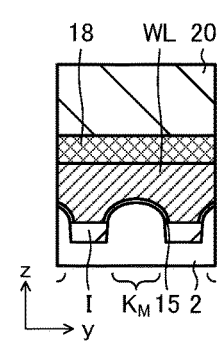 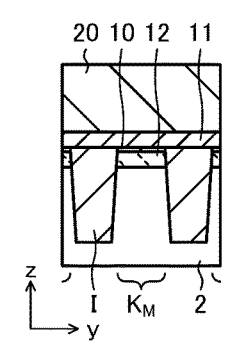 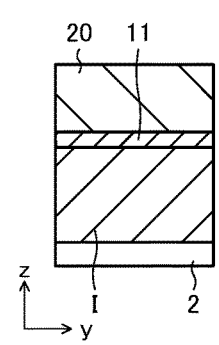
FIG.14C  FIG.14D  FIG.14E  FIG.14F

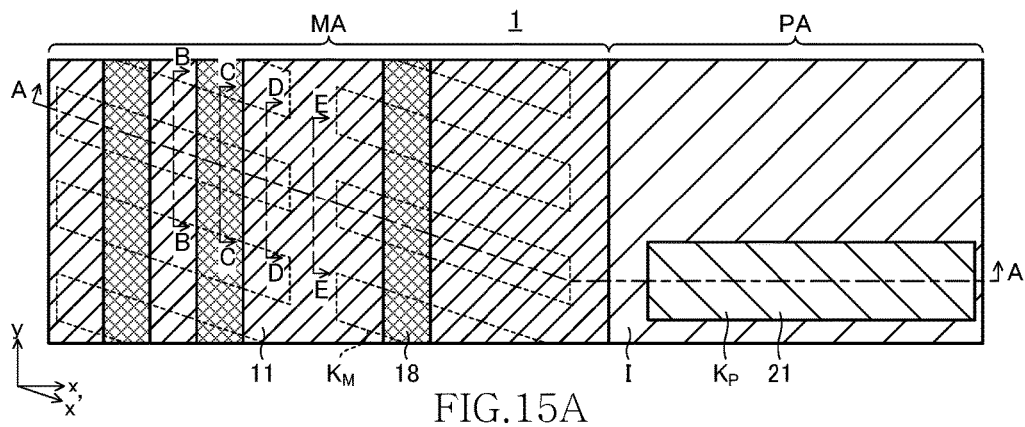
FIG.15A
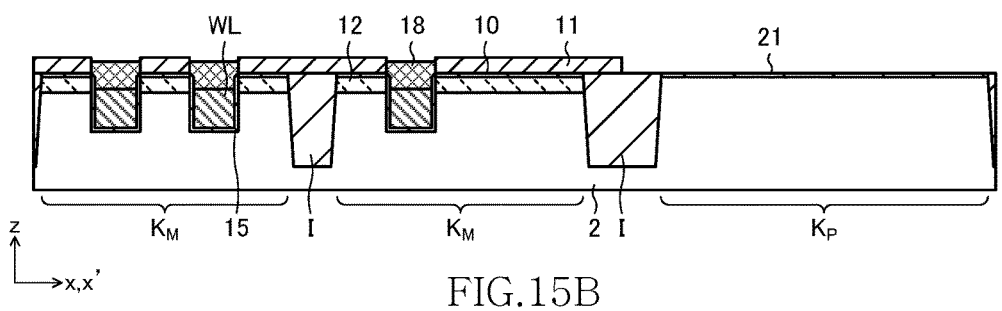
FIG.15B
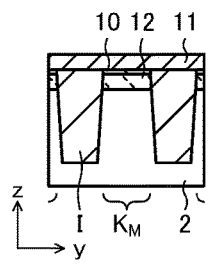 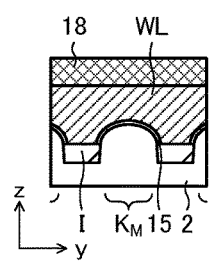 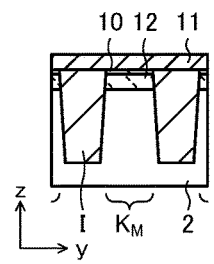 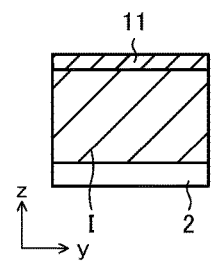
FIG.15C  FIG.15D  FIG.15E  FIG.15F

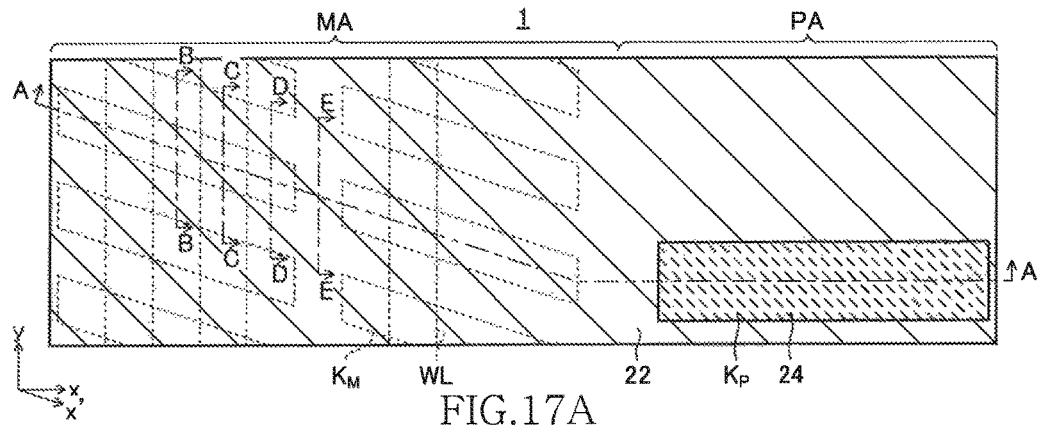
FIG.17A
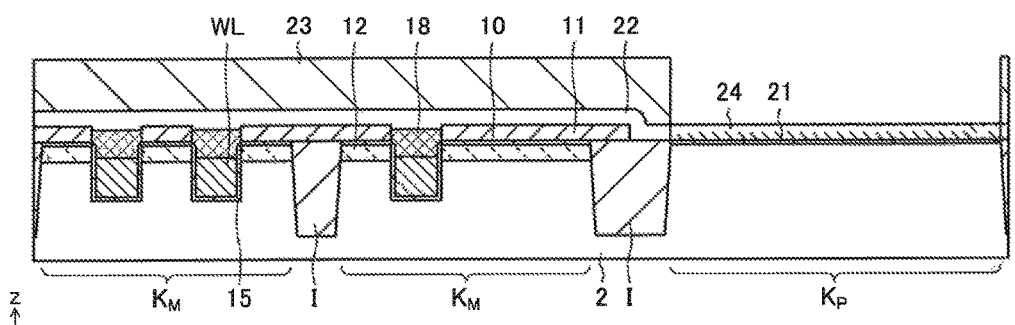
FIG.17B
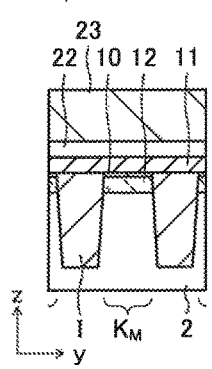 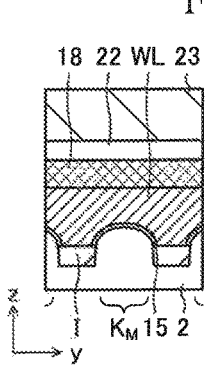 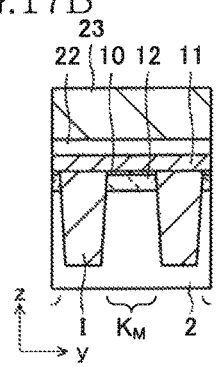 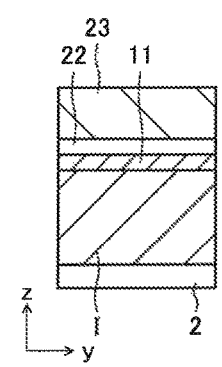
FIG.17C  FIG.17D  FIG.17E  FIG.17F

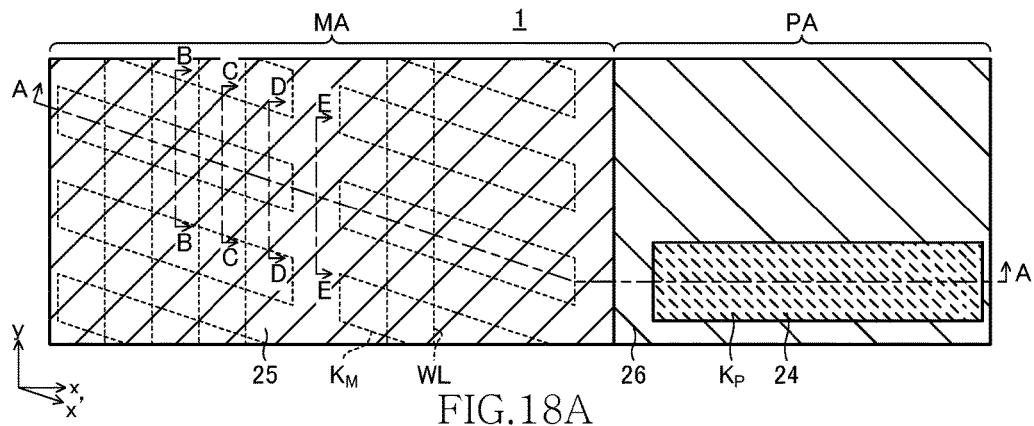
FIG.18A
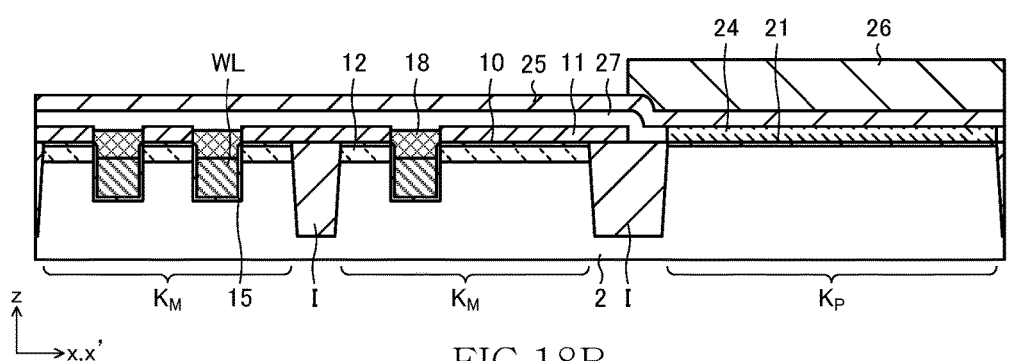
FIG.18B
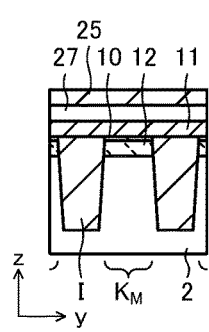 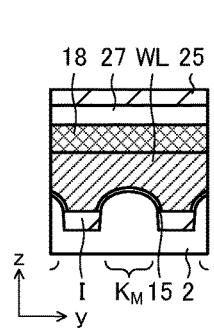 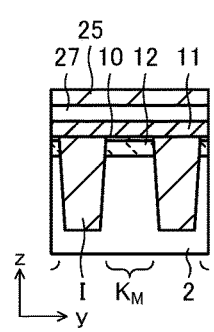 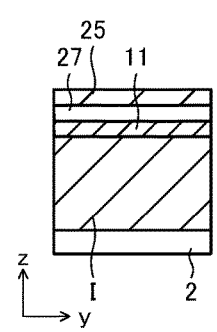
FIG.18C　　FIG.18D　　FIG.18E　　FIG.18F

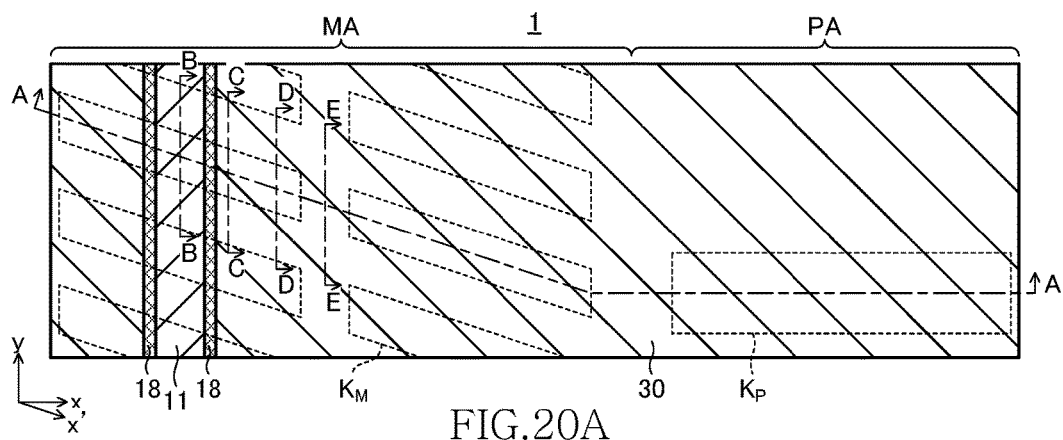
FIG.20A
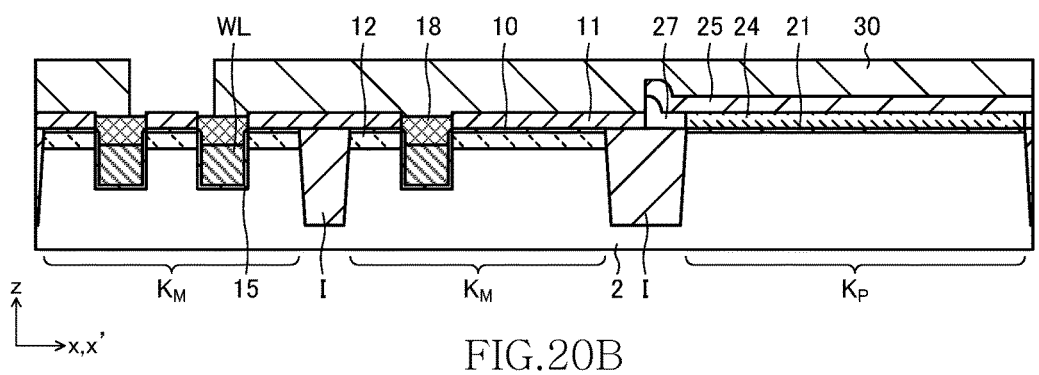
FIG.20B
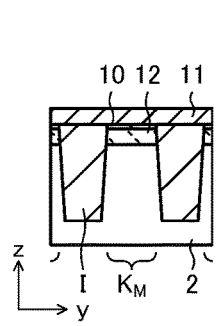 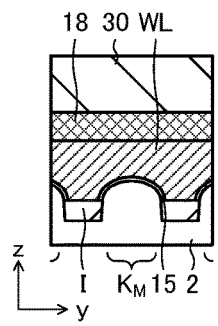 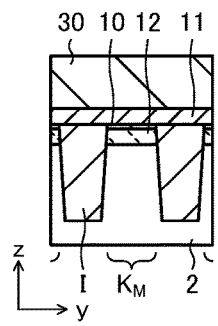 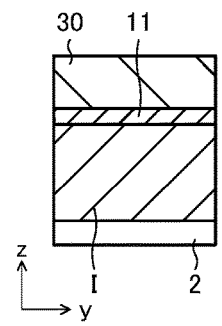
FIG.20C    FIG.20D    FIG.20E    FIG.20F

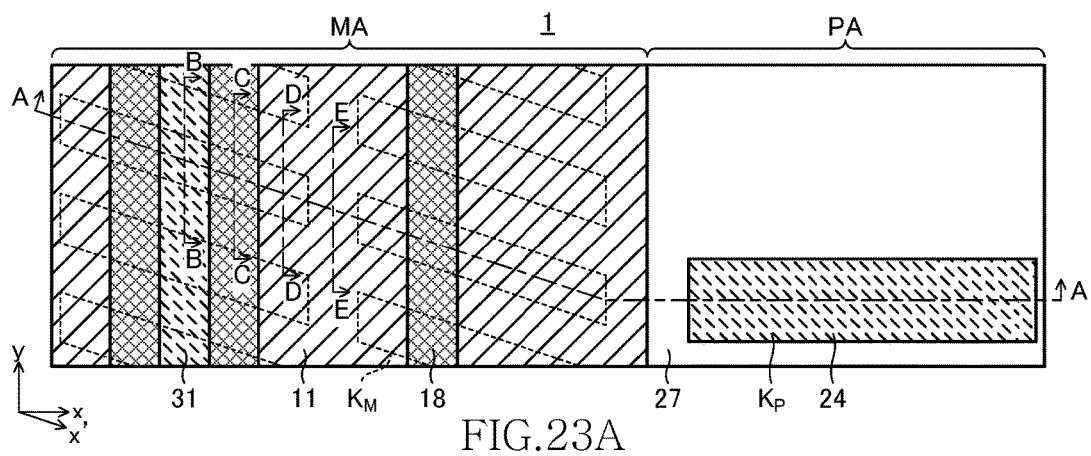
FIG.23A
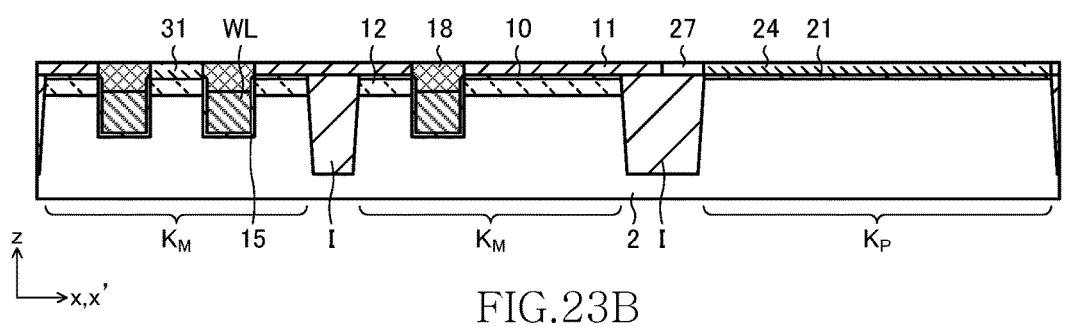
FIG.23B
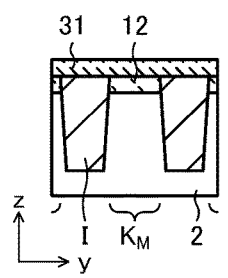 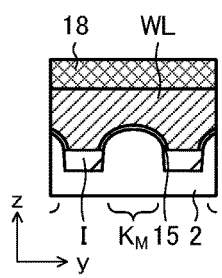 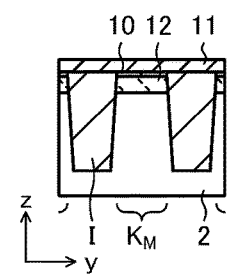 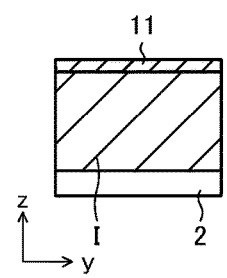
FIG.23C  FIG.23D  FIG.23E  FIG.23F

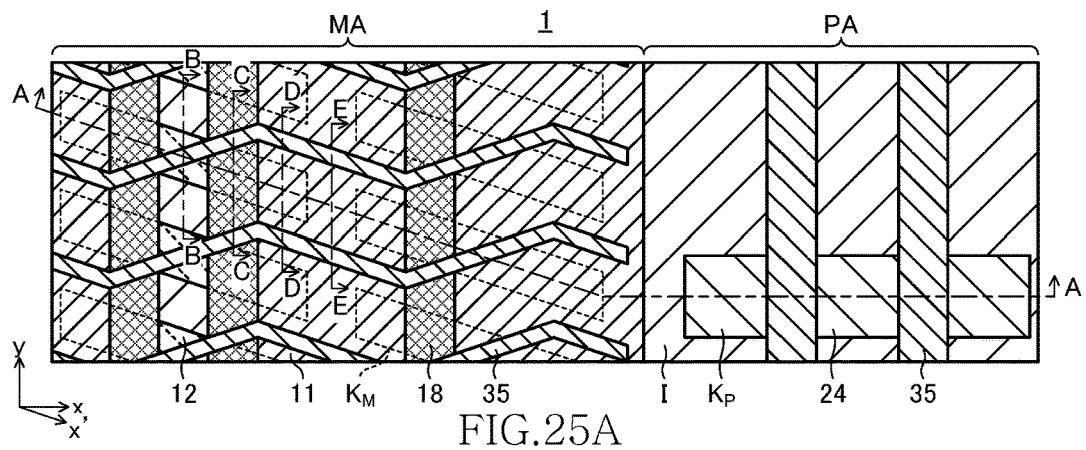
FIG.25A
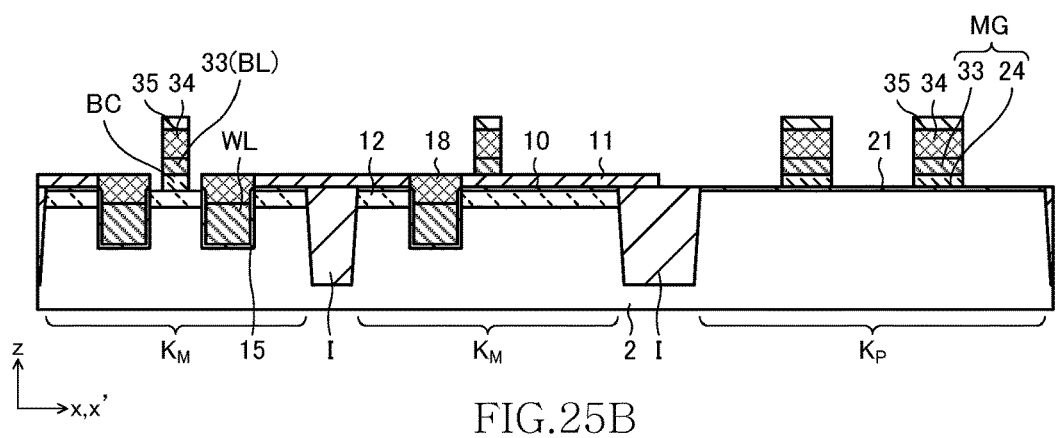
FIG.25B
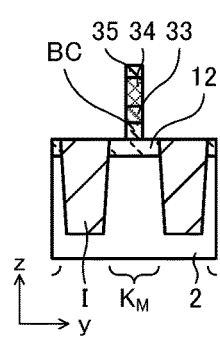 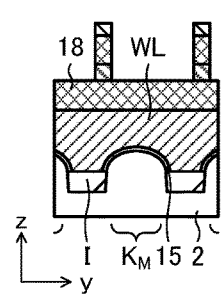 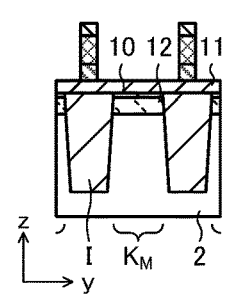 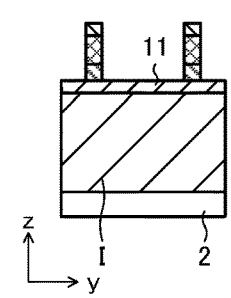
FIG.25C  FIG.25D  FIG.25E  FIG.25F

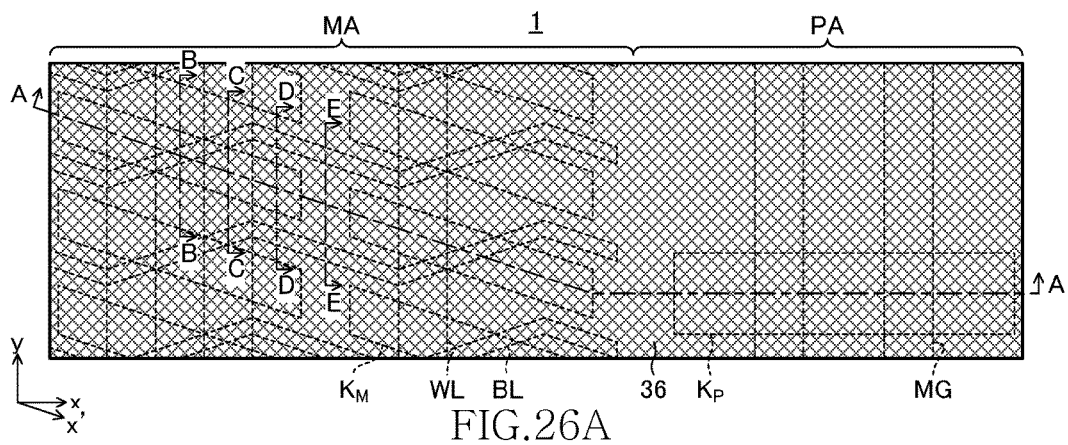
FIG.26A
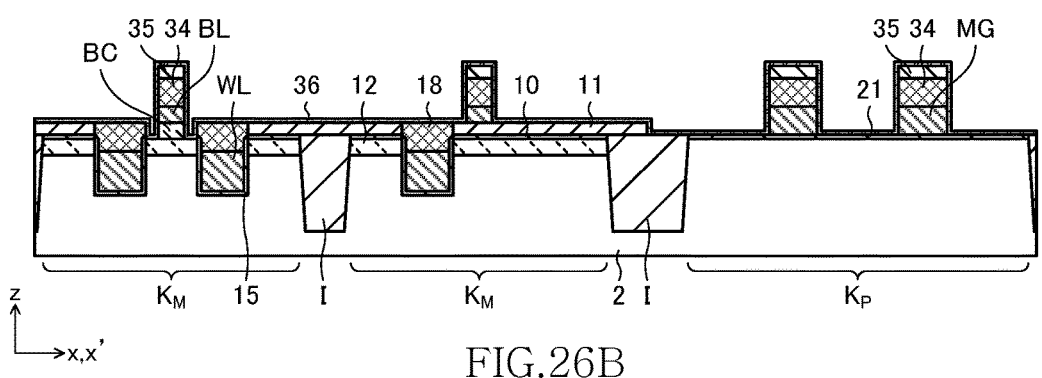
FIG.26B
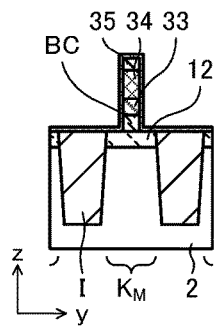 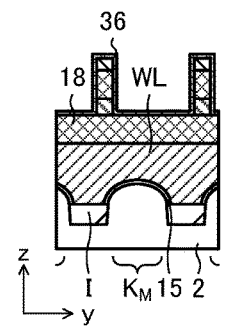 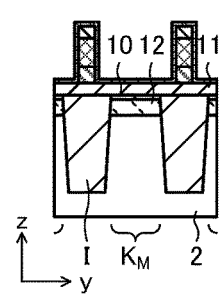 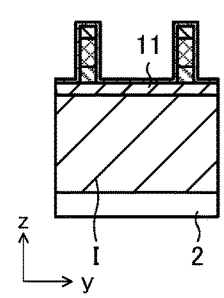
FIG.26C  FIG.26D  FIG.26E  FIG.26F

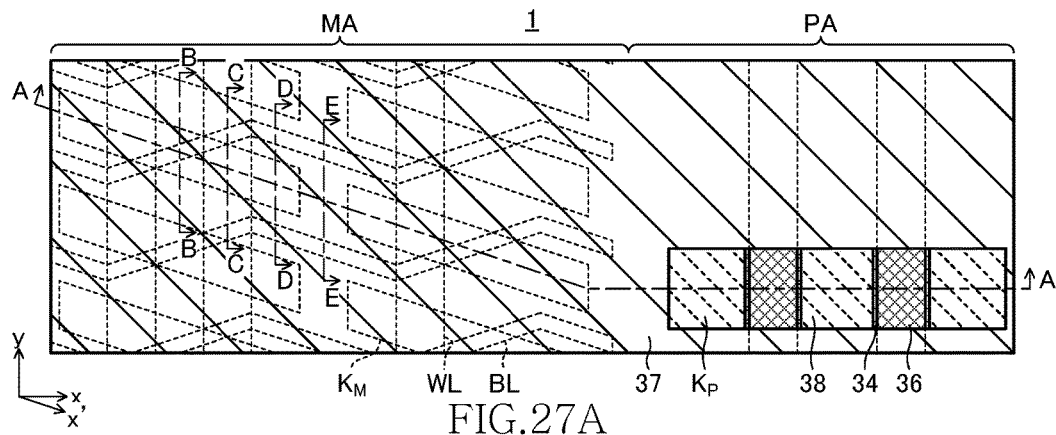
FIG.27A
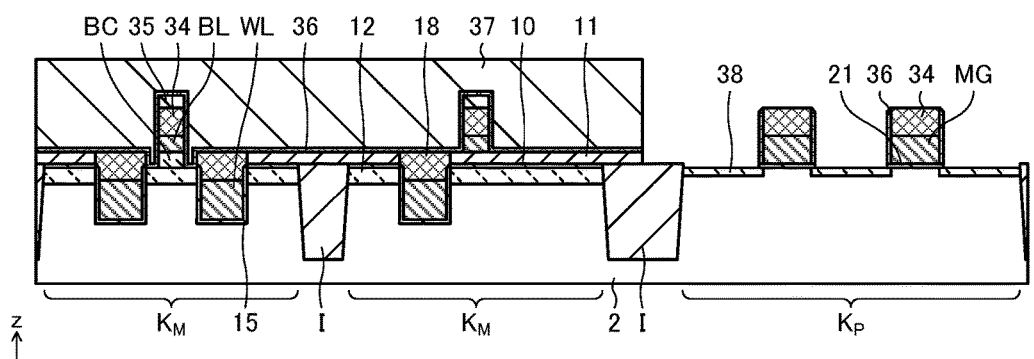
FIG.27B
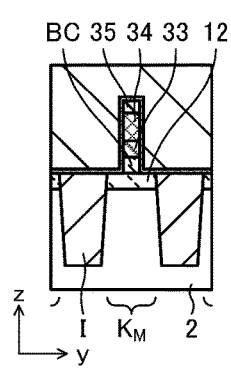 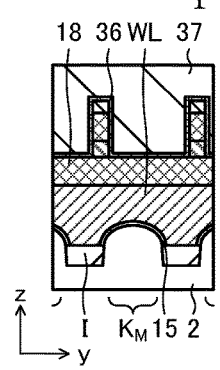 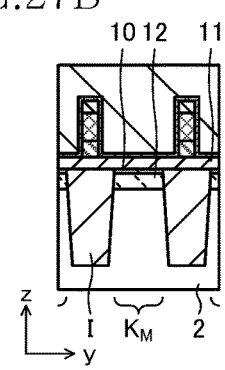 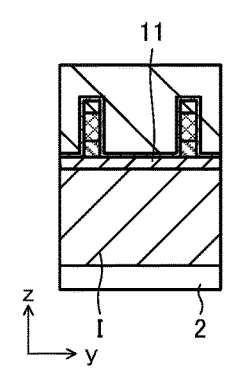
FIG.27C    FIG.27D    FIG.27E    FIG.27F

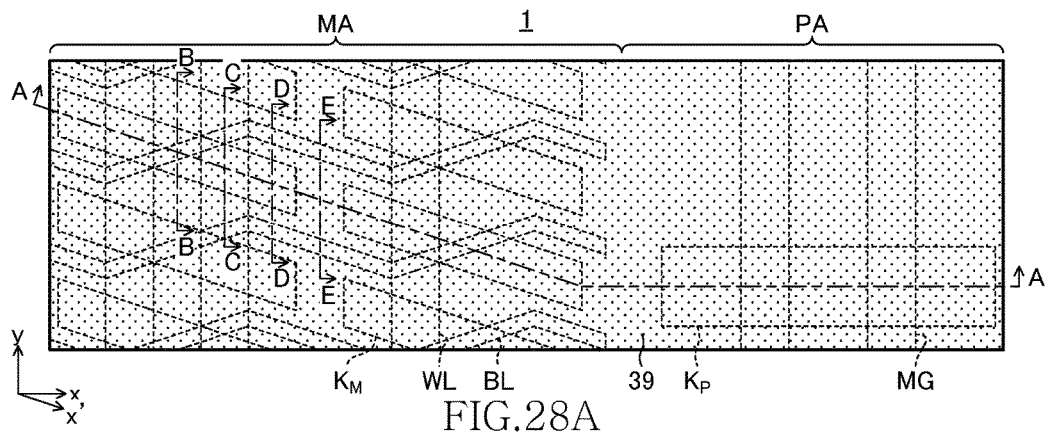
FIG.28A
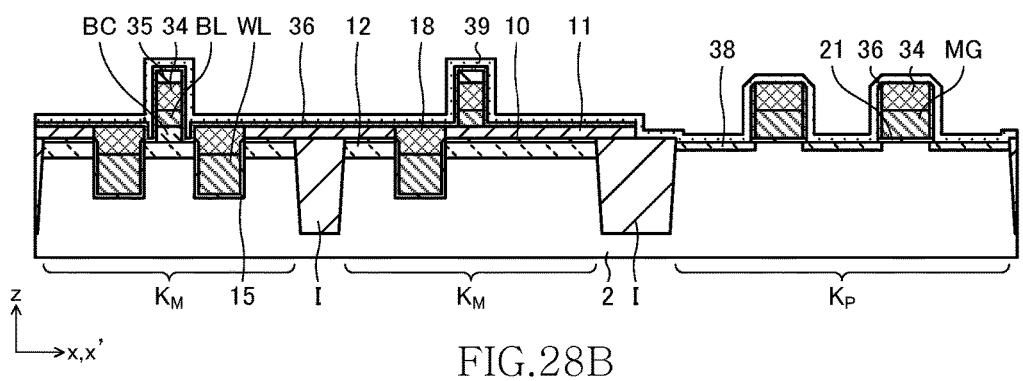
FIG.28B
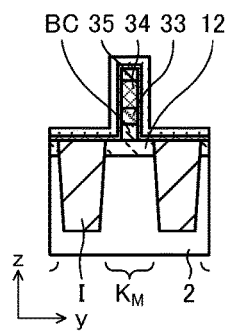 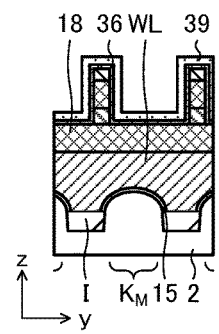 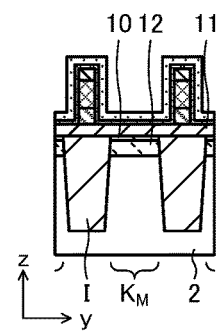 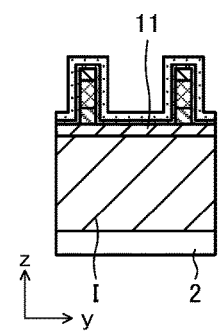
FIG.28C    FIG.28D    FIG.28E    FIG.28F

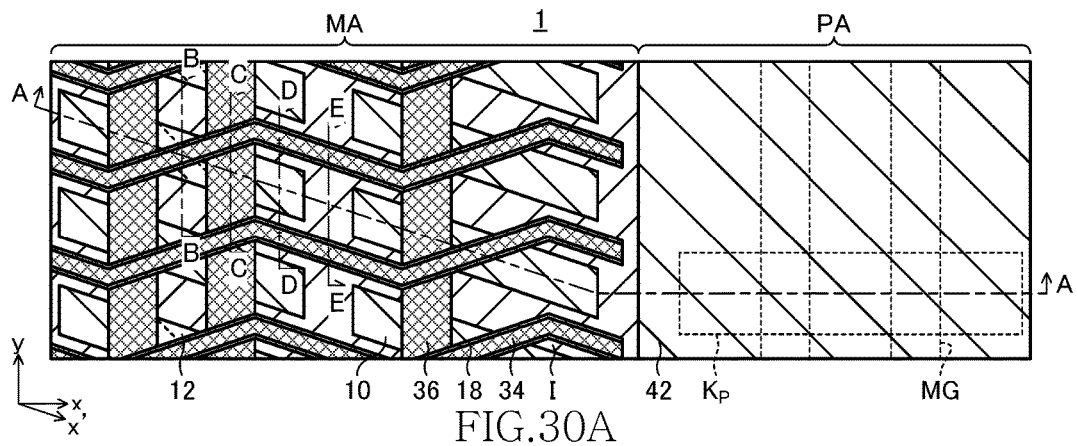
FIG.30A
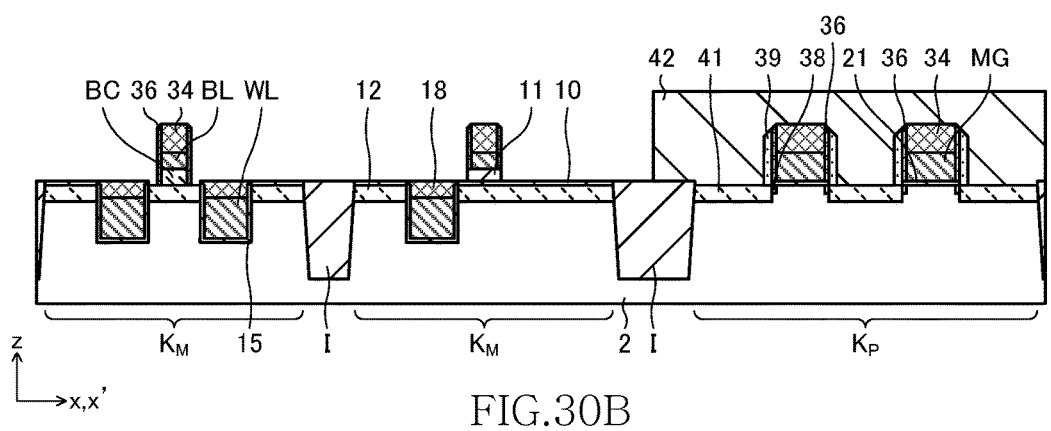
FIG.30B
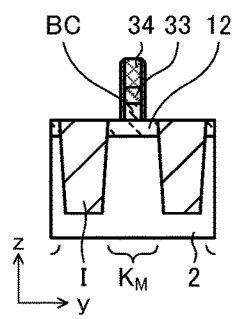 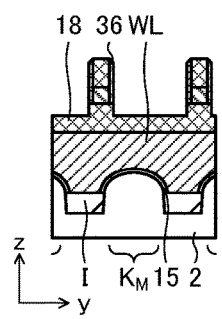 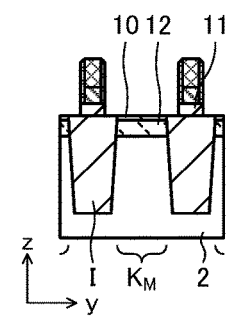 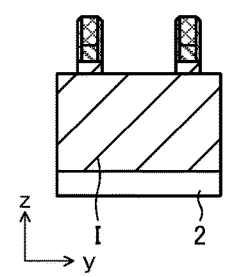
FIG.30C  FIG.30D  FIG.30E  FIG.30F

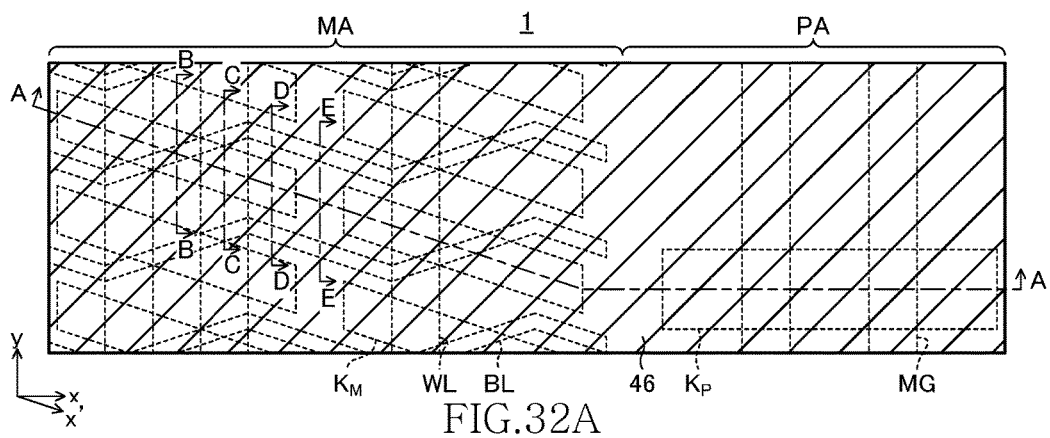
FIG.32A
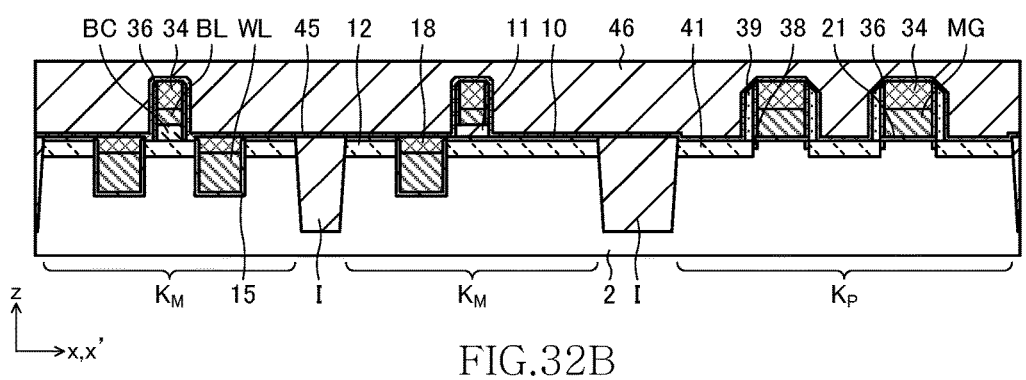
FIG.32B
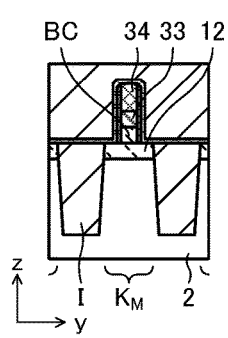 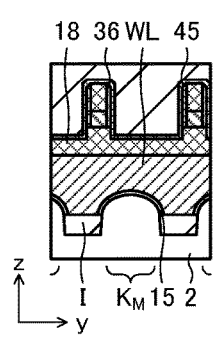 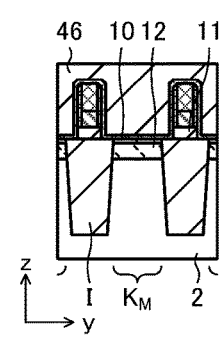 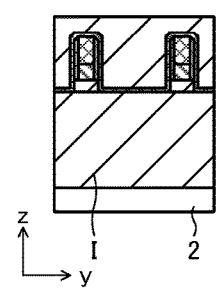
FIG.32C     FIG.32D     FIG.32E     FIG.32F

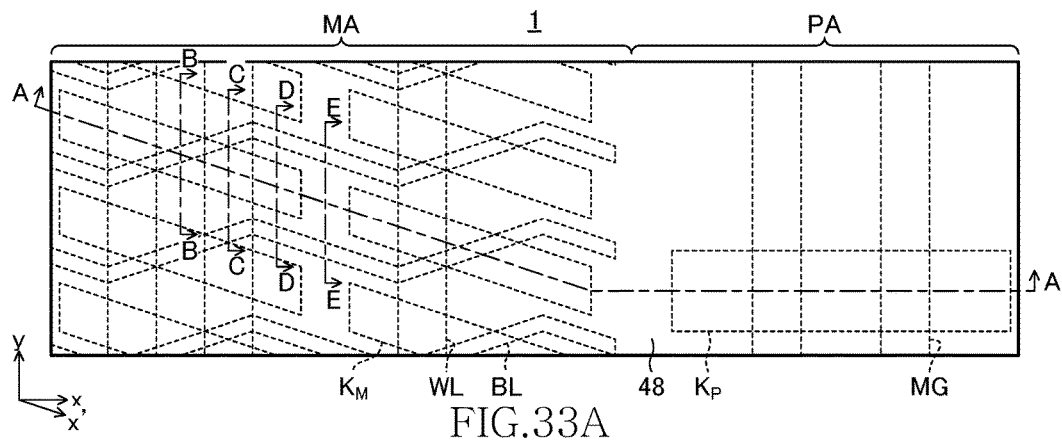
FIG.33A
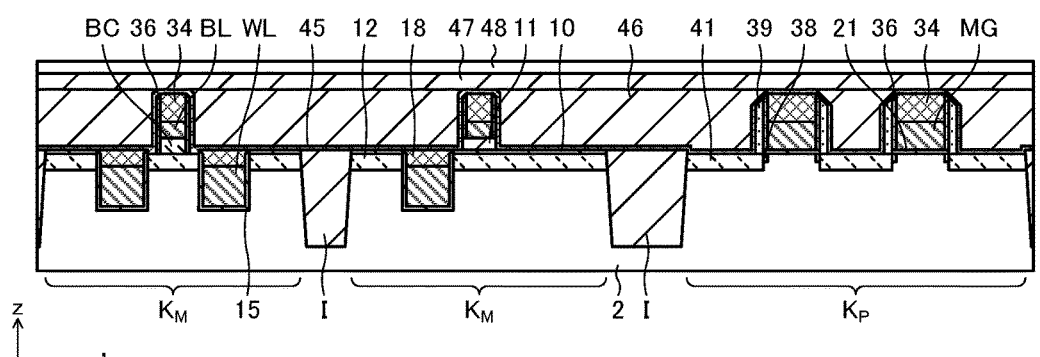
FIG.33B
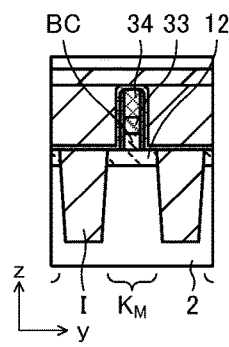 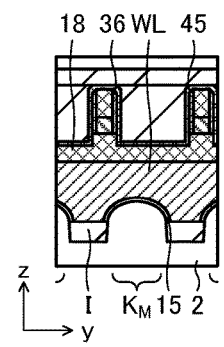 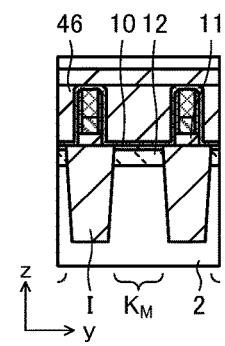 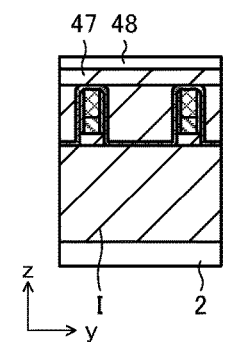
FIG.33C   FIG.33D   FIG.33E   FIG.33F

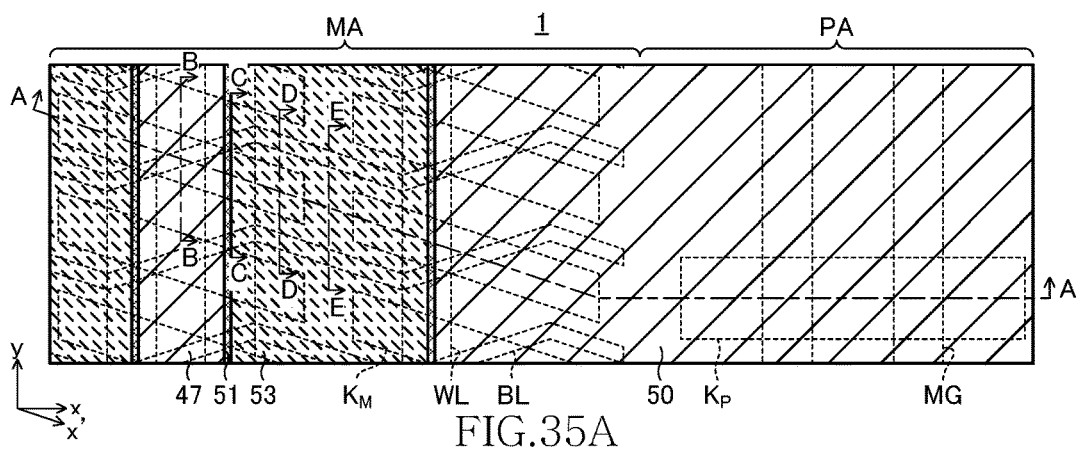
FIG.35A
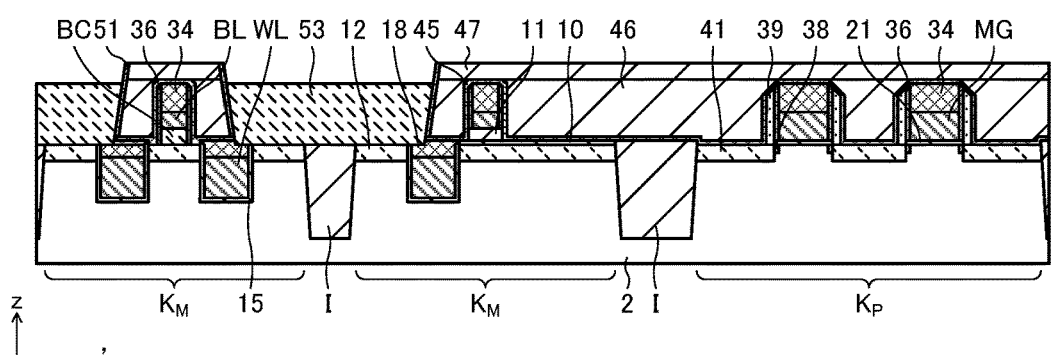
FIG.35B
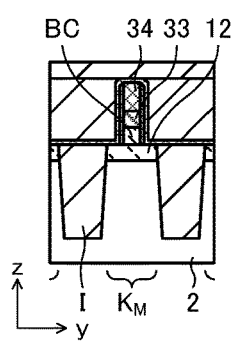 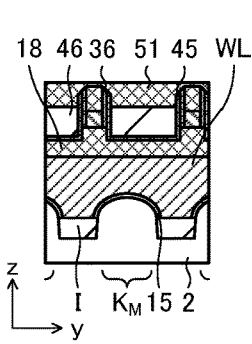 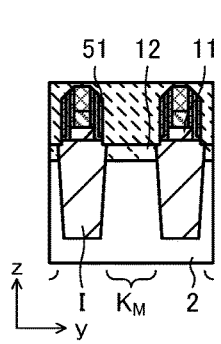 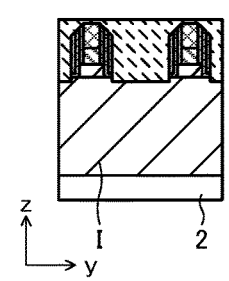
FIG.35C    FIG.35D    FIG.35E    FIG.35F

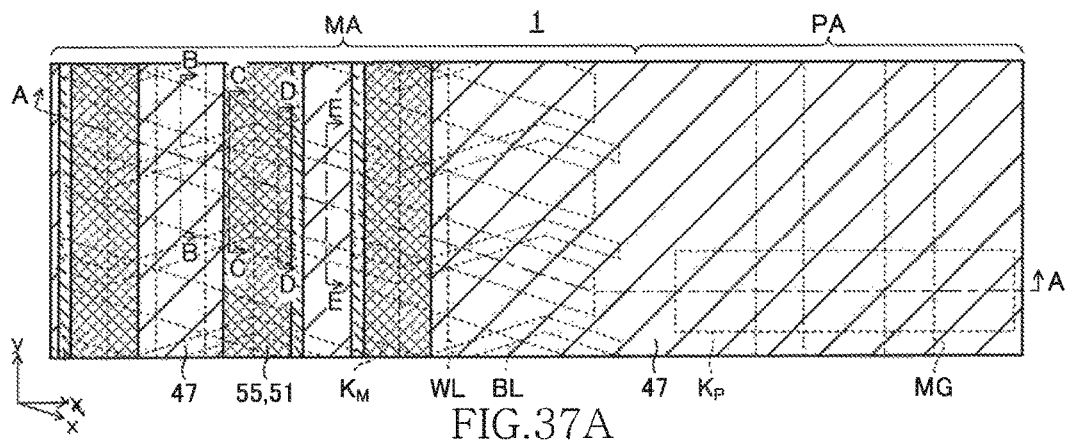
FIG.37A
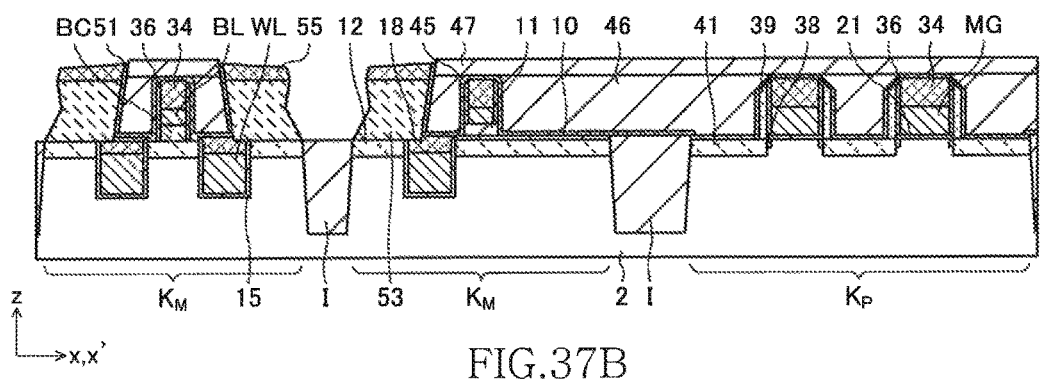
FIG.37B
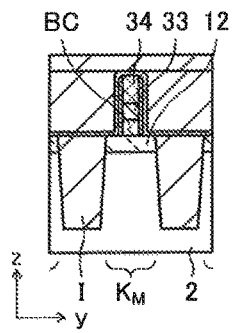 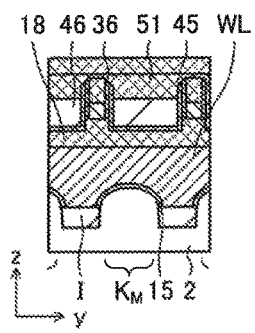 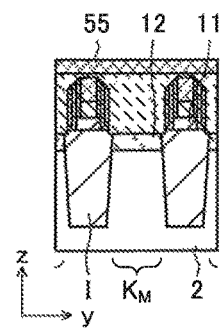 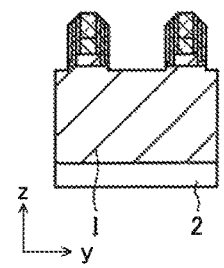
FIG.37C  FIG.37D  FIG.37E  FIG.37F

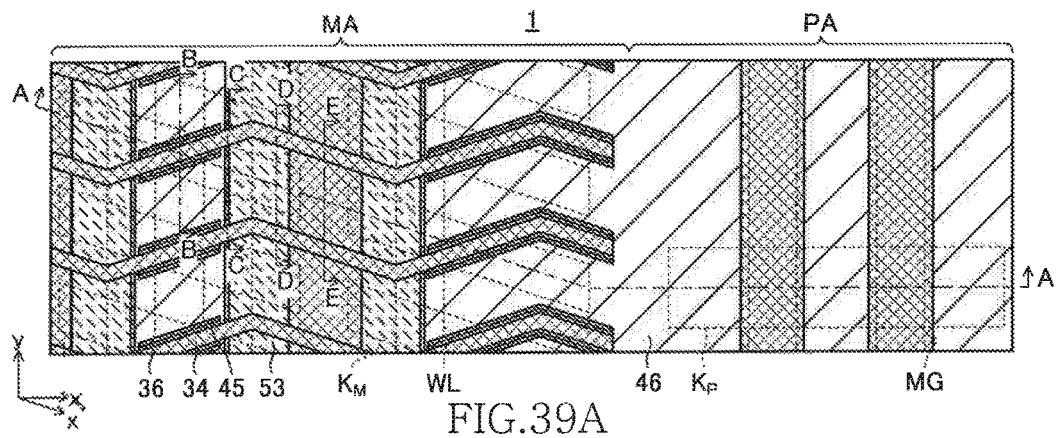
FIG.39A
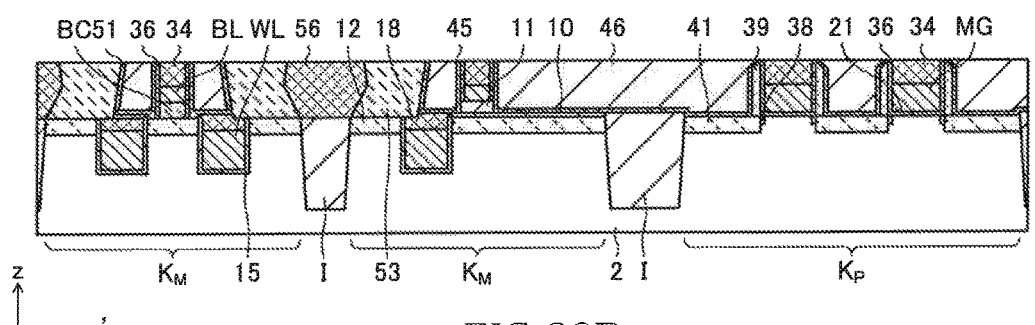
FIG.39B
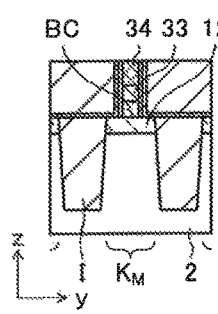 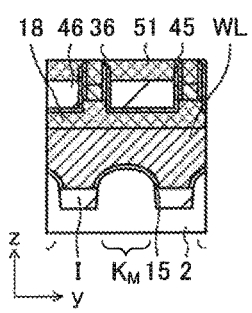 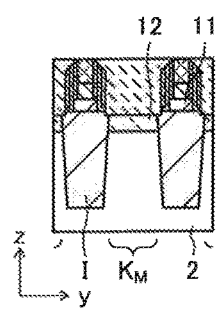 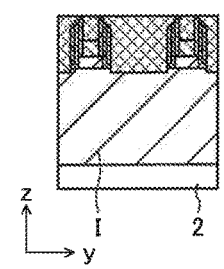
FIG.39C  FIG.39D  FIG.39E  FIG.39F

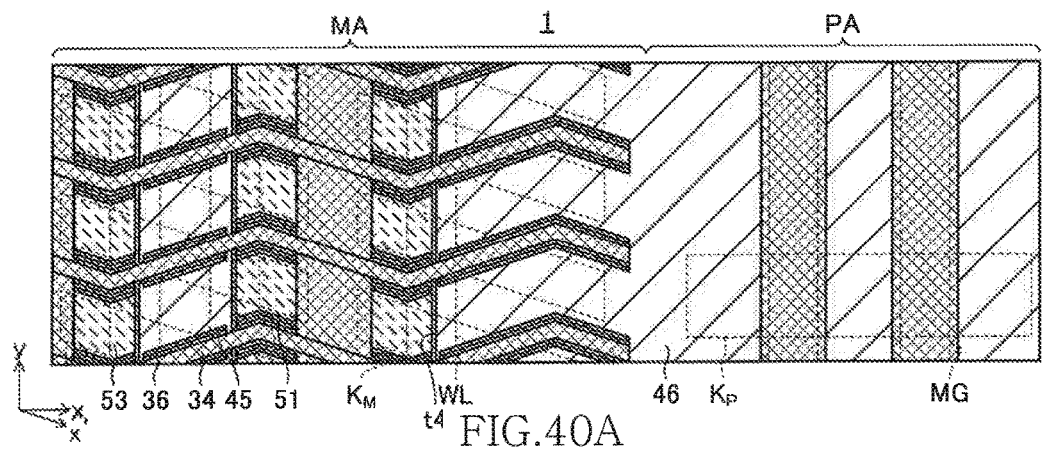
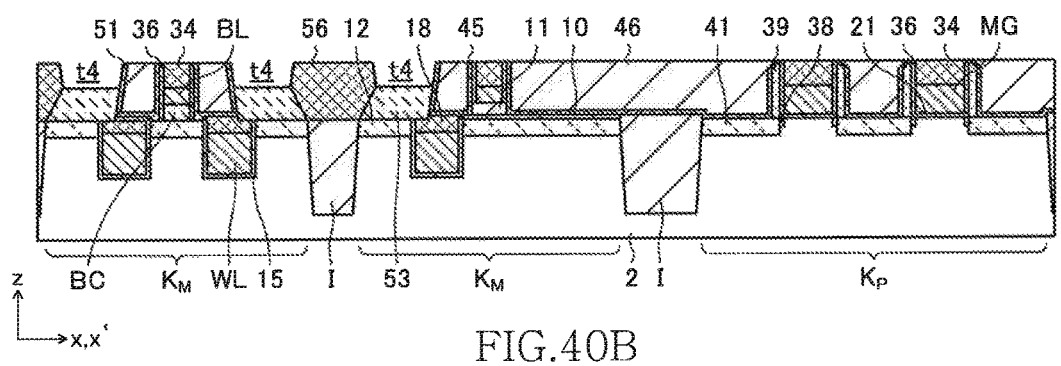
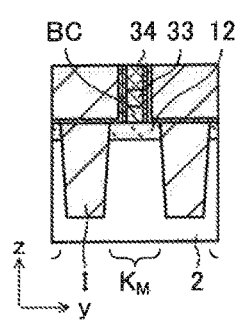 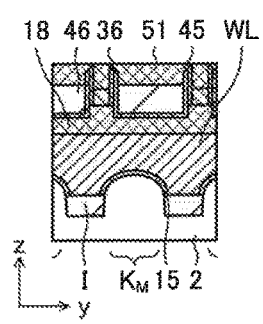 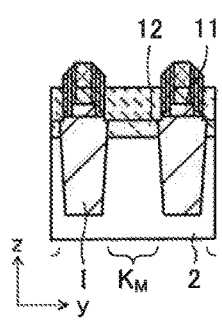 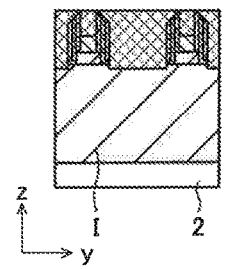
FIG.40C  FIG.40D  FIG.40E  FIG.40F

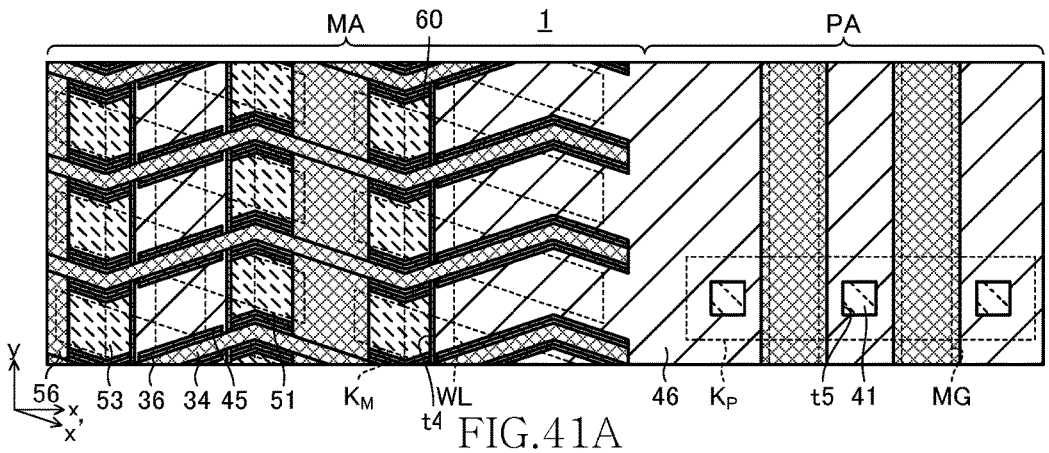
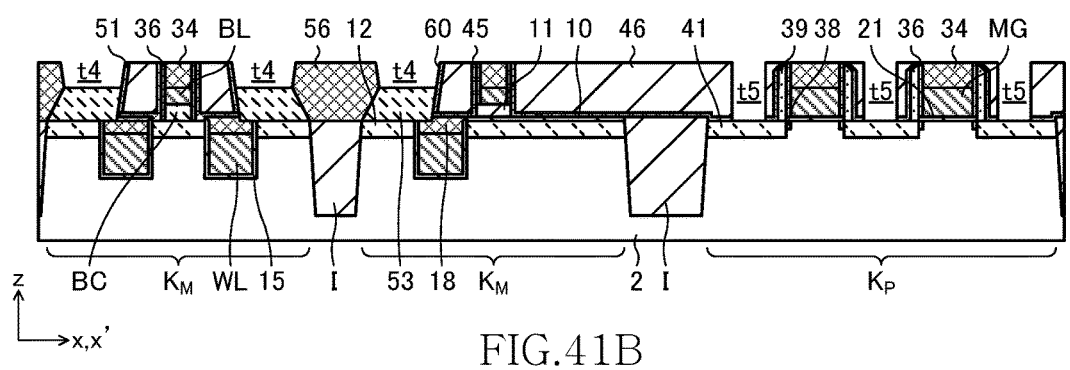
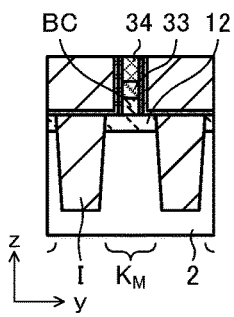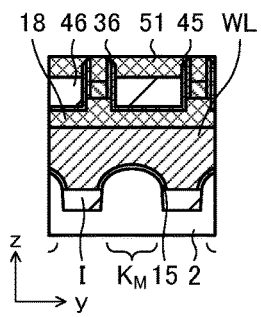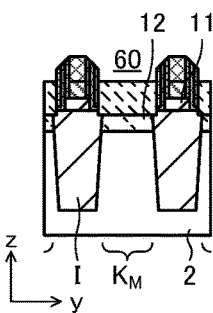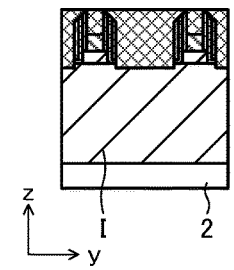
FIG.41A
FIG.41B
FIG.41C  FIG.41D  FIG.41E  FIG.41F

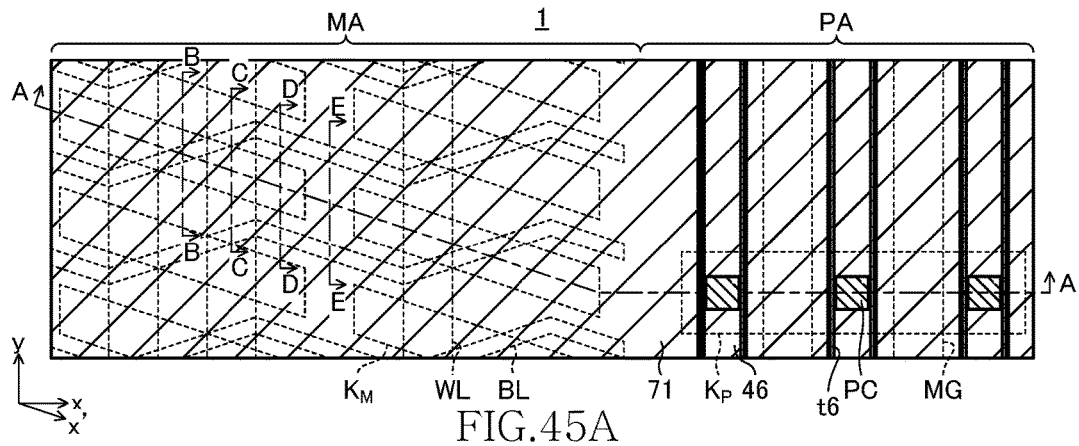
FIG.45A
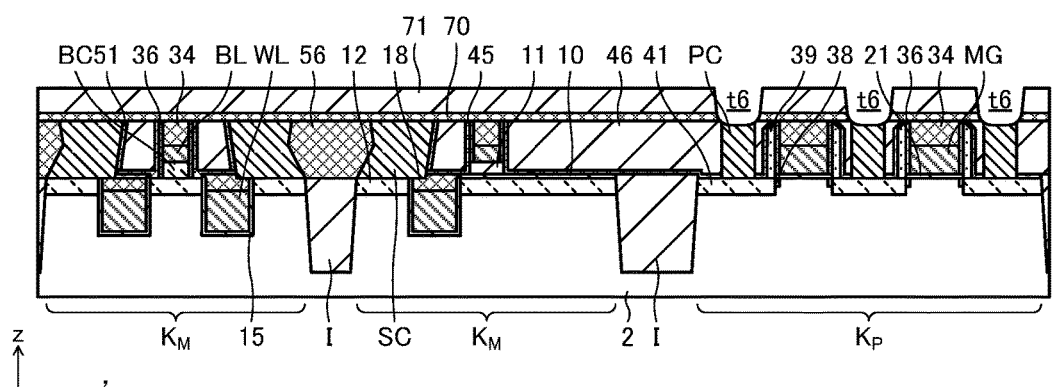
FIG.45B
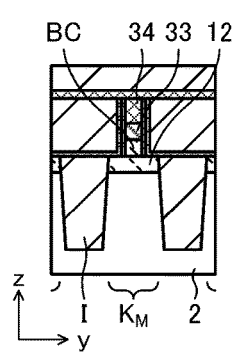 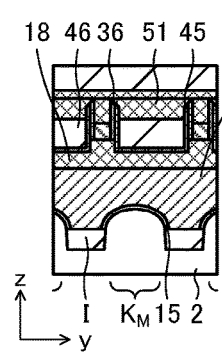 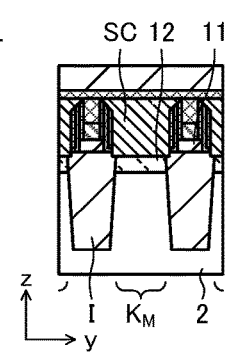 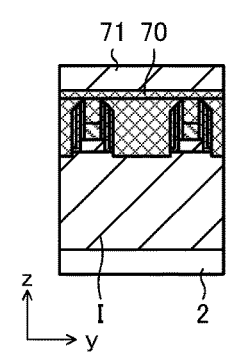
FIG.45C  FIG.45D  FIG.45E  FIG.45F

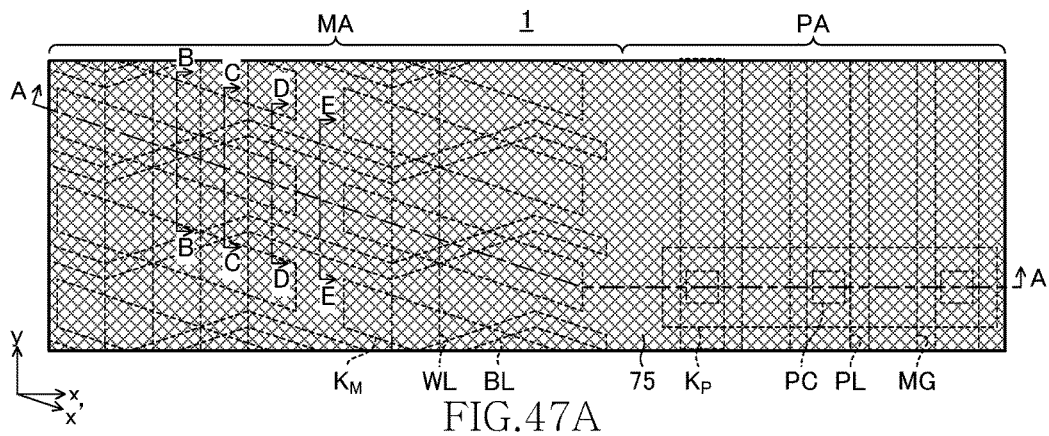
FIG.47A
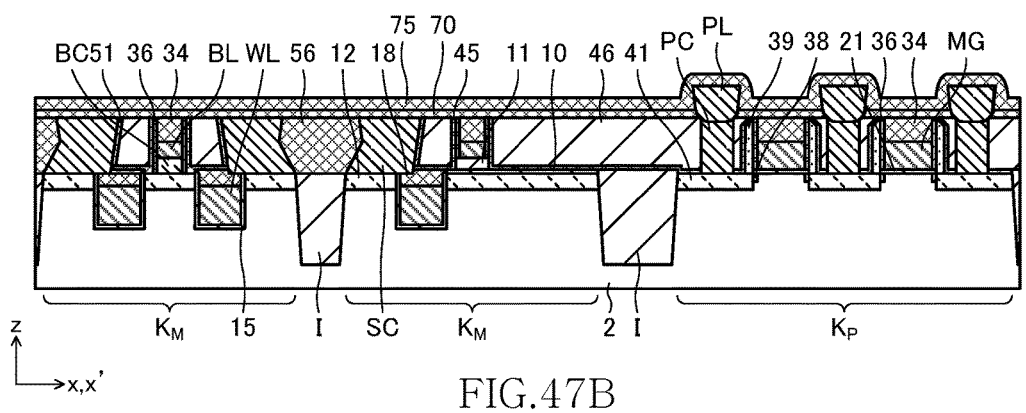
FIG.47B
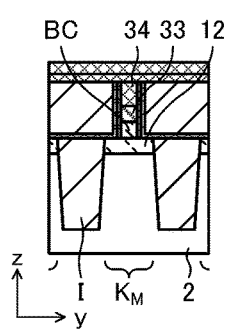 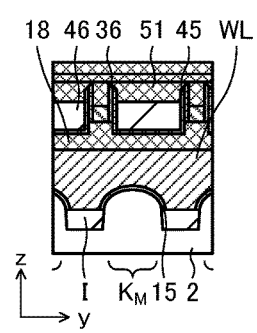 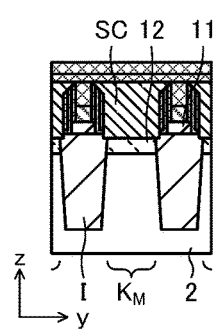 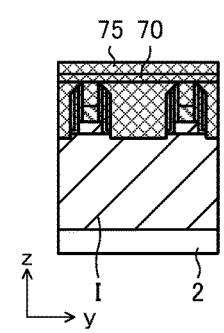
FIG.47C  FIG.47D  FIG.47E  FIG.47F

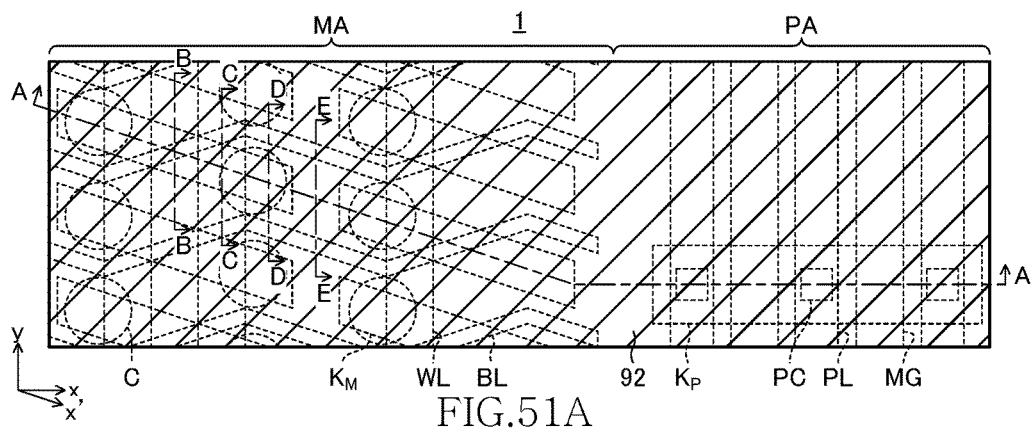
FIG.51A
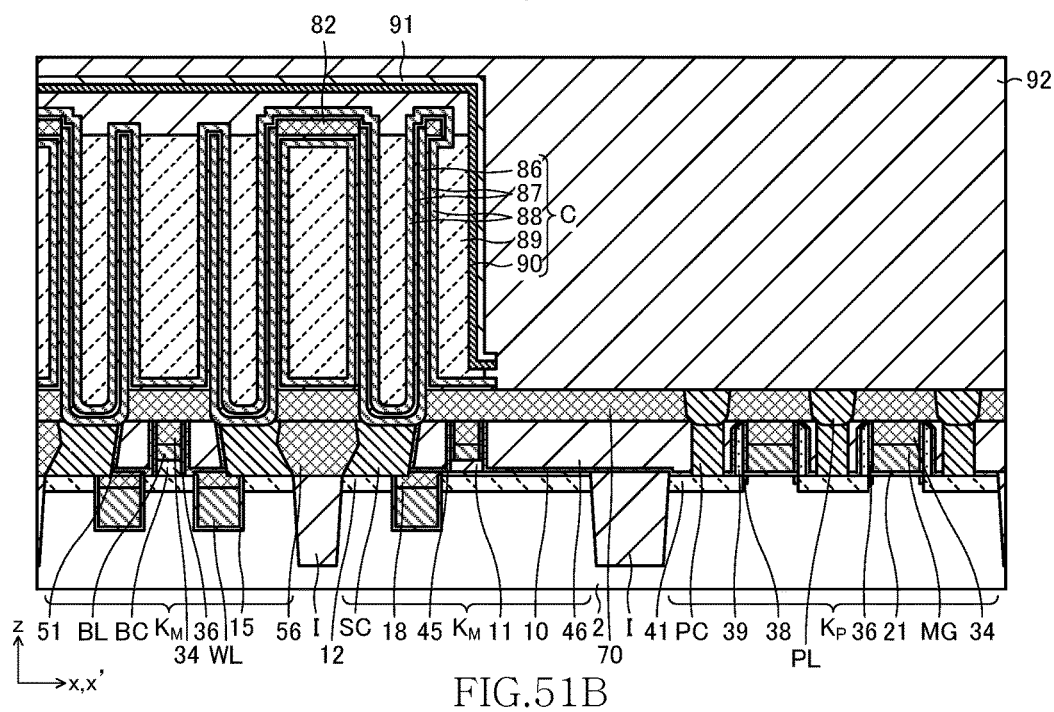
FIG.51B
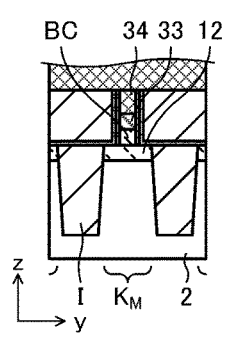 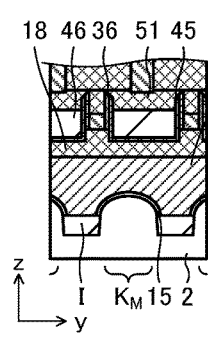 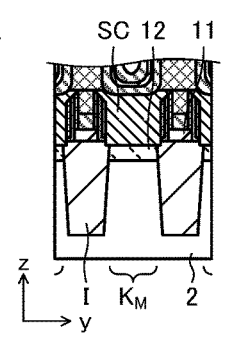 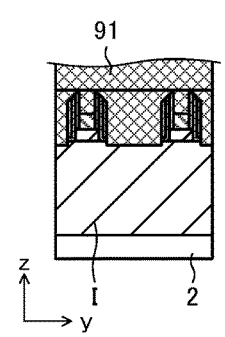
FIG.51C　　FIG.51D　　FIG.51E　　FIG.51F

SEMICONDUCTOR DEVICES INCLUDING INSULATIVE MATERIALS EXTENDING BETWEEN CONDUCTIVE STRUCTURES

RELATED PATENT DATA

This patent resulted from a divisional of U.S. patent application Ser. No. 15/045,490, filed Feb. 17, 2016, which is a continuation application of U.S. patent application Ser. No. 14/462,766, filed Aug. 19, 2014, entitled "Semiconductor Device And Semiconductor Memory Devices Having First, Second, And Third Insulating Layers", naming Takashi Sasaki as inventor, the disclosures of which are incorporated by reference.

BACKGROUND OF THE INVENTION

Field of the Invention

The present invention relates to a semiconductor device and more particularly relates to a semiconductor device in which the upper surfaces of storage-node contact plugs and the upper surfaces of peripheral contact plugs are located in the same plane.

Description of Prior Art

A semiconductor device such as a DRAM (Dynamic Random Access Memory) has a memory cell area and a peripheral circuit area formed on a principal surface of a semiconductor substrate. The memory cell area includes a plurality of memory cells each having a cell transistor and a storage node. The peripheral circuit area includes various peripheral circuits for performing operations such as read operation and write operation to the memory cells in the memory cell area.

Japanese Patent Application Laid-open No. 2012-99793 discloses a specific example of a structure of cell transistors included in memory cells and a structure of peripheral transistors formed in a peripheral circuit area.

In a semiconductor device described in Japanese Patent Application Laid-open No. 2012-99793, a first interlayer insulating film 33 is formed on a surface of a semiconductor substrate that embeds bit lines 30, capacitor contact plugs 34 (storage-node contact plugs), and source/drain contact plugs 34a (peripheral contact plugs). The capacitor contact plugs are used to connect source/drain electrodes of the cell transistors to lower electrodes 35 of cell capacitors. The source/drain contact plugs 34a are used to connect source/drain electrodes of the peripheral transistors to an upper layer wiring 35a. A cover insulating film 28 and a side-wall insulating film 31a cover the upper and side surfaces of the bit lines 30, respectively. The cover insulating film 28 and the side-wall insulating film 31a are also entirely embedded in the first interlayer insulating film 33. Although not described in detail in Japanese Patent Application Laid-open No. 2012-99793, a manufacturing procedure from formation of the bit lines 30 to formation of the lower electrodes 35 in the semiconductor device having the above structure may be as follows.

That is, a conductive film and an insulating film are first formed in this order and then these films are patterned to obtain the bit lines 30 and the cover insulating film 28. Another insulating film is then formed on the entire surface and is etched back to form the side-wall insulating film 31a. The first interlayer insulating film 33 is then formed in a thickness to cover the cover insulating film 28. The upper surface of the first interlayer insulating film 33 is flattened, and then through holes for embedding therein the capacitor contact plugs 34 and the source/drain contact plugs 34a are provided in the first interlayer insulating film 33. A conductive film is formed in a thickness to fill the through holes. Then the surface is flattened so as to expose the upper surface of the first interlayer insulating film 33 to form the capacitor contact plugs 34 and the source/drain contact plugs 34a.

A conductive film is then formed again and is patterned to form the wiring 35a having the lower surface that is in contact with the source/drain contact plugs 34a on the upper surface of the first interlayer insulating film 33. An insulating film that covers the wiring 35a is further formed on the entire surface. Through holes passing through the insulating film are formed, and then the inner surfaces of the through holes are covered with a conductive film to form the lower electrodes 35 having the lower surfaces that are in contact with the capacitor contact plugs 34.

However, the above manufacturing procedure has a problem that, at the time of formation of the wiring 35a, the capacitor contact plugs 34 may be damaged. Also the insulating film (the cover insulating film 28 and the first interlayer insulating film 33) covering the upper surfaces of the bit lines 30 is reduced in the thickness, which adversely reduces a short margin between the bit lines 30 and a silicon oxide film. This is because the capacitor contact plugs 34 and the insulating film that covers the upper surfaces of the bit lines 30 are subjected to an etching condition to form the wiring 35a. That is, because the thickness of the conductive film or the etching speed is not completely uniform in the surface, the etching is continued in a certain area even after the wiring 35a is completely removed when the conductive film is patterned to form the wiring 35a. On the surface from which the wiring 35a has been completely removed, the capacitor contact plugs 34 and the insulating film that covers the upper surfaces of the bit lines 30 are exposed and thus subjected to an etching condition. As a result, the problem as mentioned above occurs.

SUMMARY

In one embodiment, there is provided a semiconductor device that includes: a semiconductor substrate; a first insulating layer over a surface of the semiconductor substrate; first and second contact plugs each including side and upper surfaces, the respective side surfaces surrounded by the first insulating layer, the respective upper surfaces being substantially on the same plane with an upper surface of the first insulating layer; a second insulating layer over the first insulating layer; a first conductive layer including a bottom portion on the first contact plug and a side portion surrounded by the second insulating layer; a third insulating layer over the first conductive layer; and a second conductive layer on the second contact plug, a part of a side surface of the second conductive layer surrounded by both the second and third insulating layers.

In another embodiment, there is provided a semiconductor device that includes: a semiconductor substrate including a memory cell area and a peripheral circuit area; a peripheral transistor having source and drain regions in the peripheral circuit area; an access transistor in the memory cell area; a capacitor including a lower electrode in the memory cell area; a first insulating layer over the memory cell area and a peripheral circuit area; a first contact plug surrounded by the first insulating layer and contacted with one of the source and drain regions; a wiring layer on the first contact plug; a second contact plug surrounded by the first insulating layer and connecting the access transistor to the lower electrode; a second insulating layer over the first insulating layer and covering both a part of a side surface of the wiring and a part of a side surface of the lower electrode; and a third insulating layer over the second insulating layer and covering both an upper surface of the wiring and a part of the side surface of the lower electrode.

In still another embodiment, there is provided a semiconductor device that includes: a first insulating layer; first and second contact plugs including respective side surfaces each surrounded by the first insulating layer; a second insulating layer over the first insulating layer; a first conductive layer on the first contact plug and having a side surface surrounded by the second insulating layer; a third insulating layer over the second insulating layer and the first conductive layer; and a second conductive layer on the second contact plug, a part of the second conductive layer surrounded by both the second and third insulating layers.

According to the present invention, the first conductive layer connected to the first contact plugs can be formed in a state where the second insulating layer that covers the second contact plugs is formed. Therefore, damaging of the second contact plugs at the time of formation of the first conductive layer can be prevented.

BRIEF DESCRIPTION OF THE DRAWINGS

FIGS. 2A to 49A each are plan views indicative of one process of a method of manufacturing the semiconductor device shown in FIGS. 1A to 1F;

FIGS. 2B to 49B are respectively cross sectional views of the semiconductor device along lines A-A in FIGS. 2A to 49A;

FIGS. 2C to 49C are respectively cross sectional views of the semiconductor device along lines B-B in FIGS. 2A to 49A;

FIGS. 2D to 49D are respectively cross sectional views of the semiconductor device along lines C-C in FIG. 2A to 49A;

FIGS. 2E to 49E are respectively cross sectional views of the semiconductor device along lines D-D in FIGS. 2A to 49A;

FIGS. 2F to 49F are respectively cross sectional views of the semiconductor device along lines E-E in FIGS. 2A to 49A;

FIG. 51A is a plan view showing a semiconductor device according to a second modified embodiment of the present invention; and FIGS. 51B to 51F are respectively cross sectional views of the semiconductor device along lines A-A to E-E in FIG. 51A.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1A:
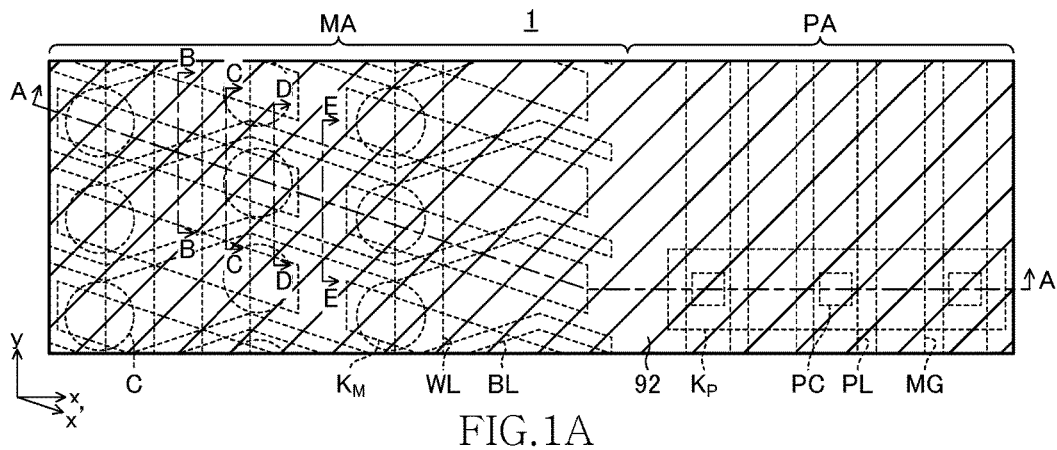
FIG. 1A is a plan view showing a semiconductor device according to an embodiment of the present invention.
Figure 1B:
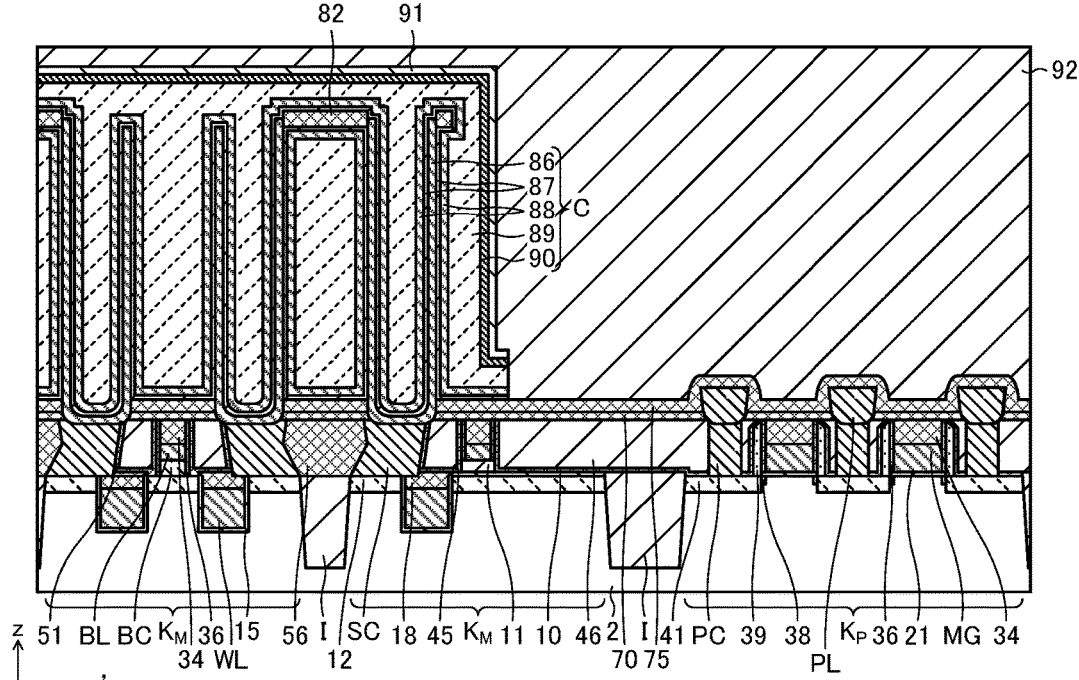
FIGS. 1B to 1F are respectively cross sectional views of the semiconductor device along lines A-A to E-E in FIG. 1A.
Figures 1C, 1D, 1E, 1F:
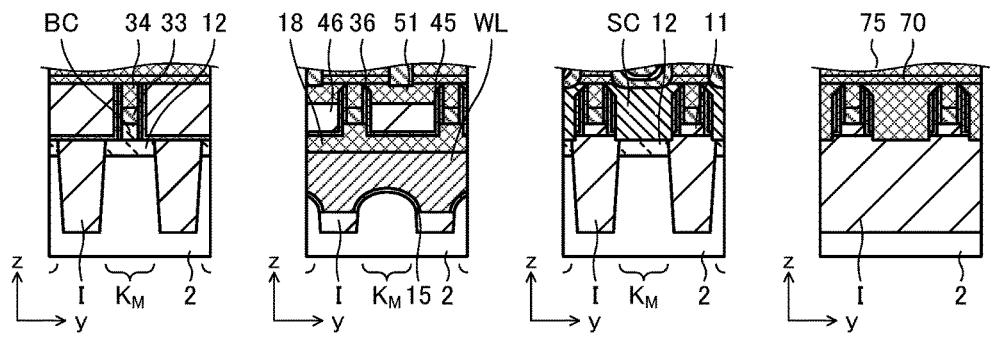
Figure 2A:
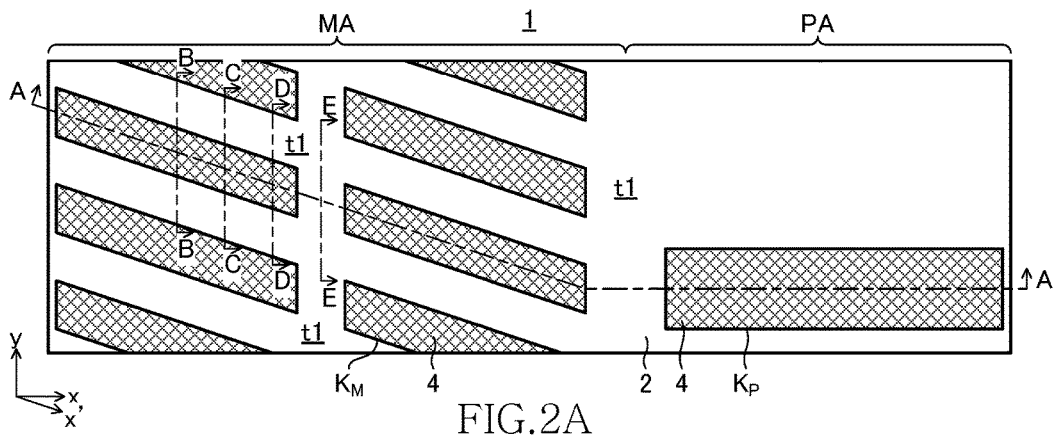
Figure 2B:
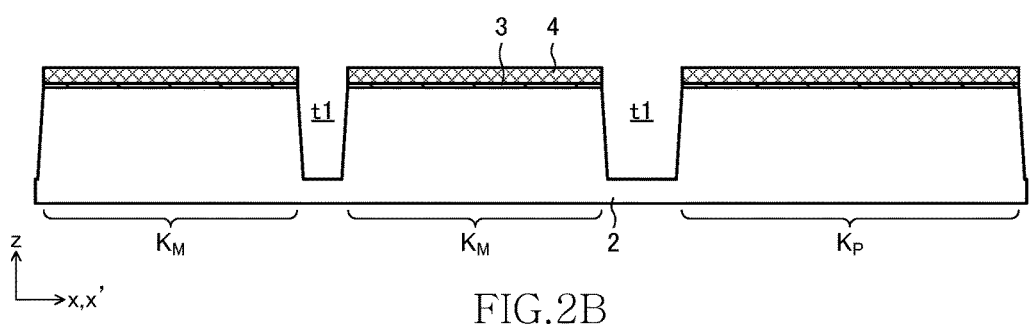
Figure 2C:
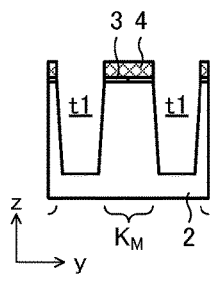
Figure 2D:
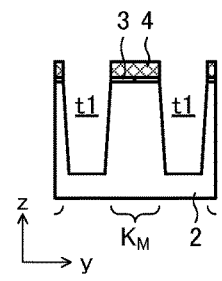
Figure 2E:
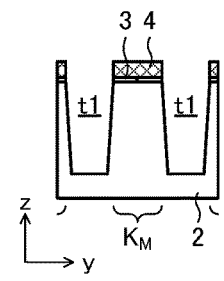
Figure 2F:
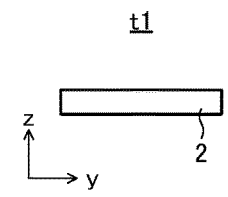
Figure 3A:
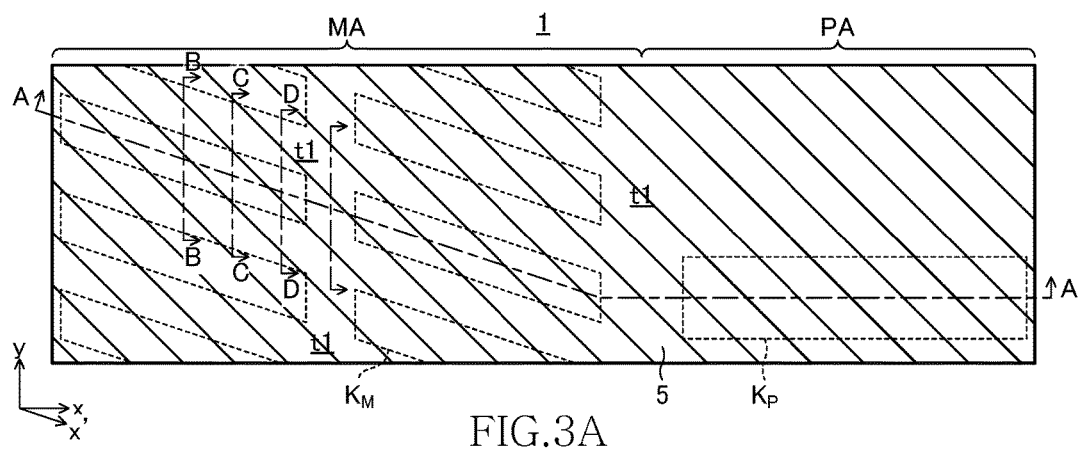
Figure 3B:
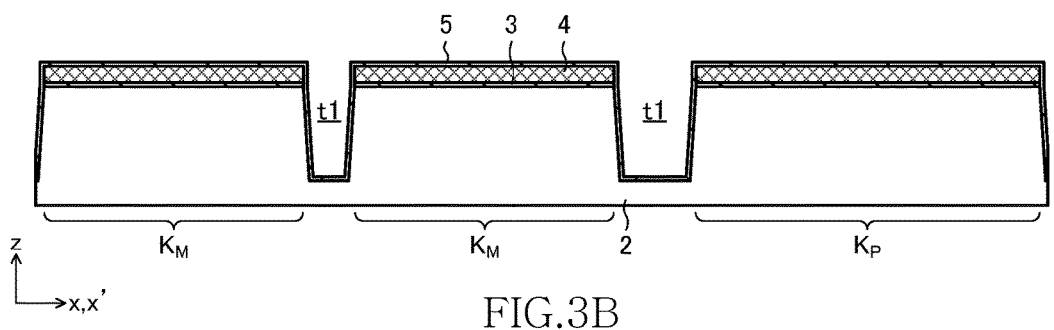
Figure 3C:
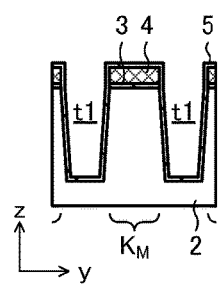
Figure 3D:
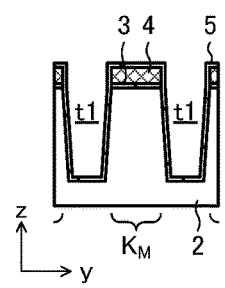
Figure 3E:
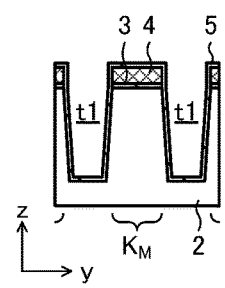
Figure 3F:
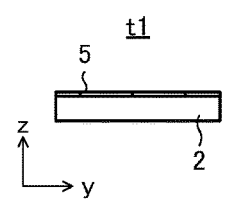
Figure 4A:
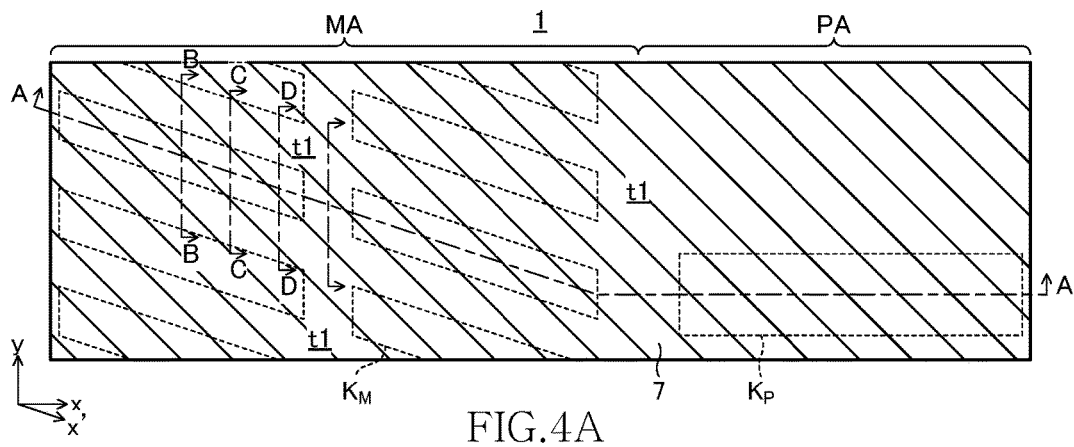
Figure 4B:
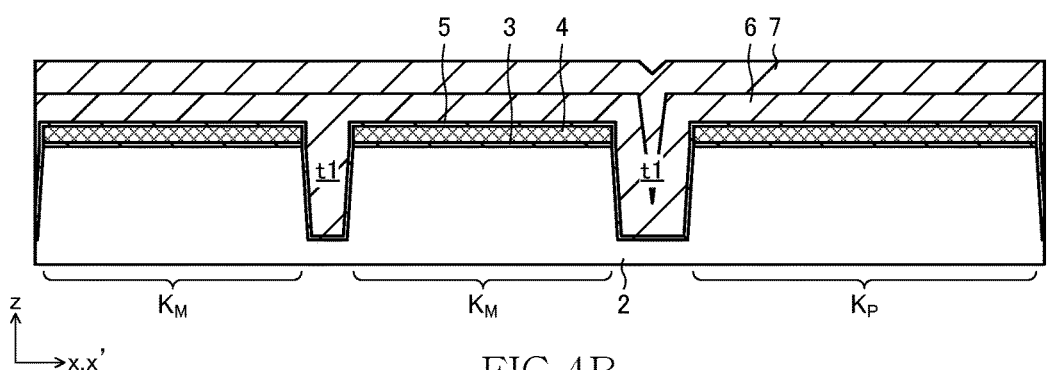
Figure 4C:
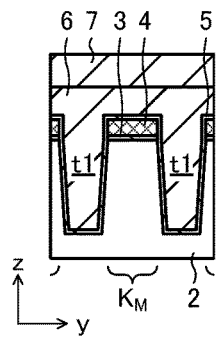
Figure 4D:
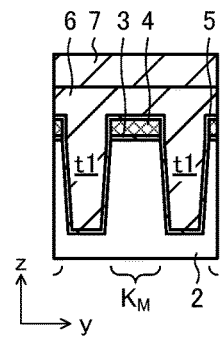
Figure 4E:
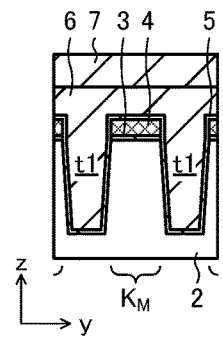
Figure 4F:
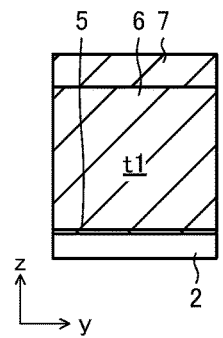
Figure 5A:
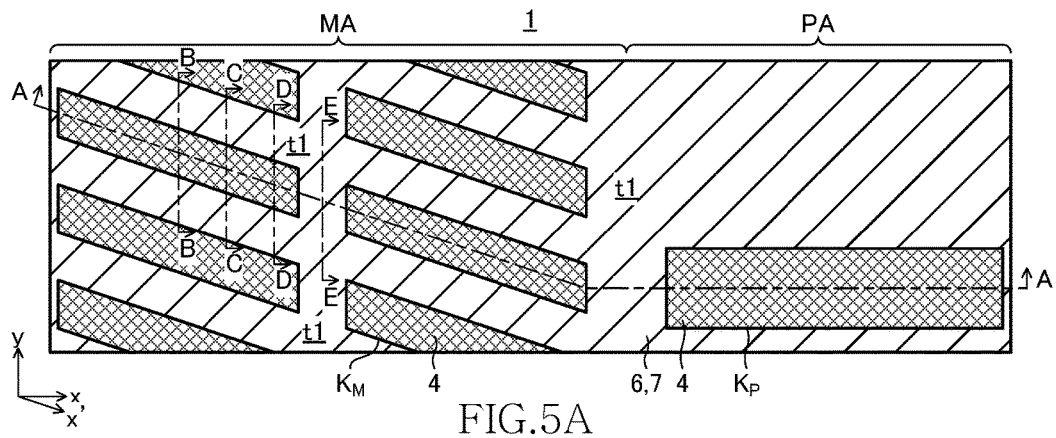
Figure 5B:
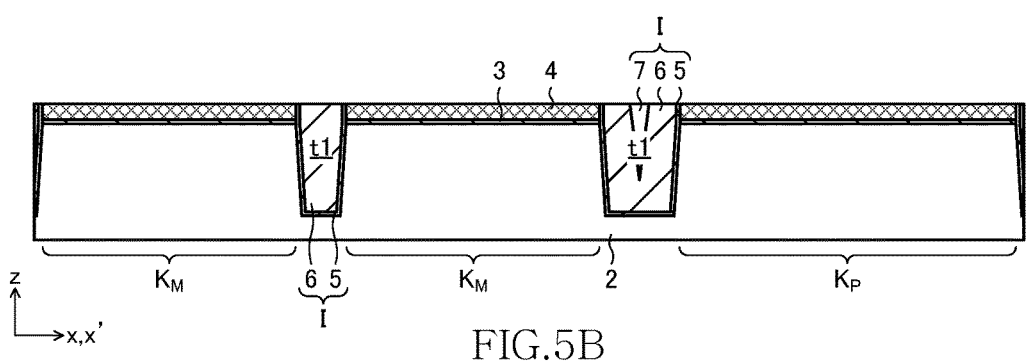
Figure 5C:
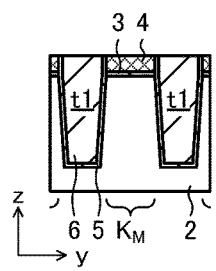
Figure 5D:
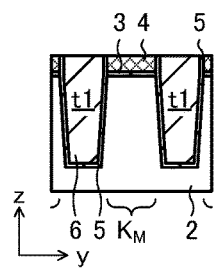
Figure 5E:
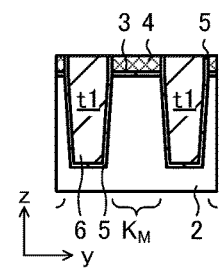
Figure 5F:
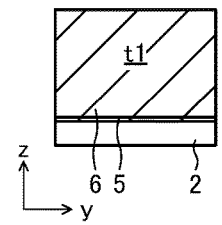
Figure 6A:
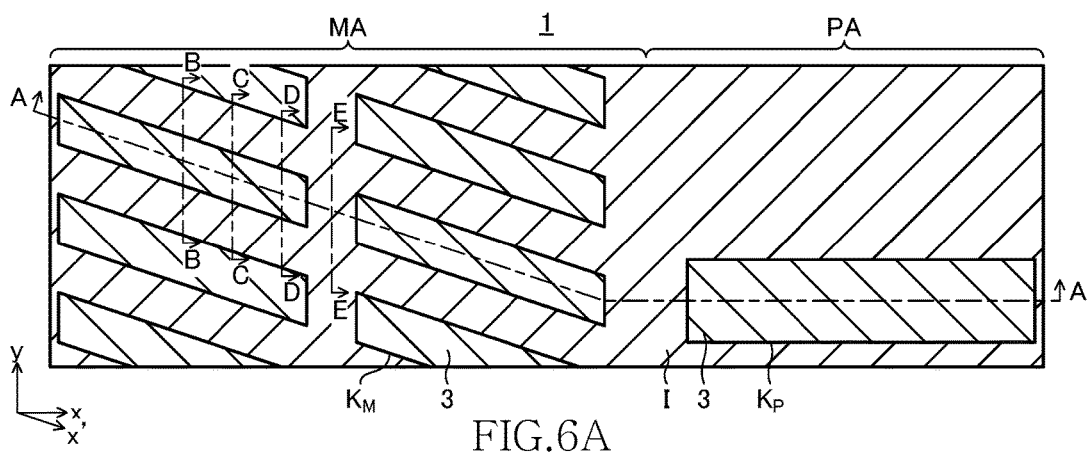
Figure 6B:
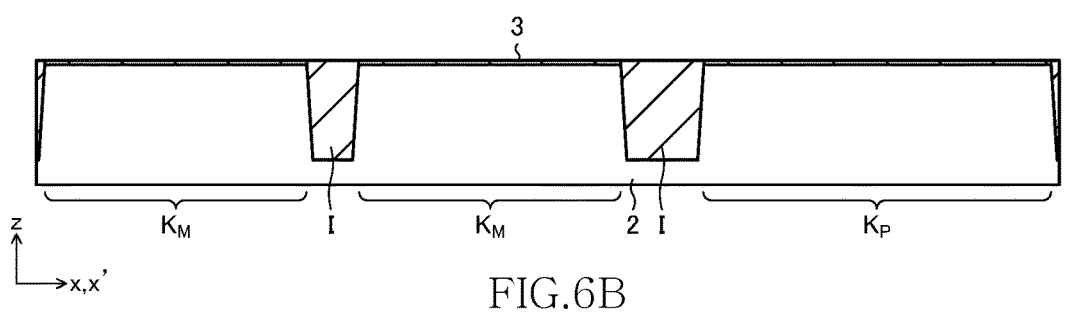
Figure 6C:
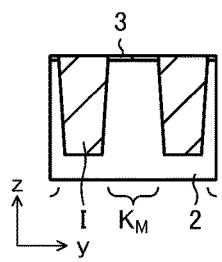
Figure 6D:
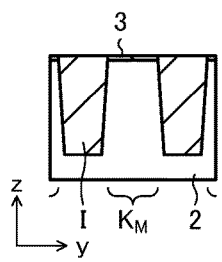
Figure 6E:
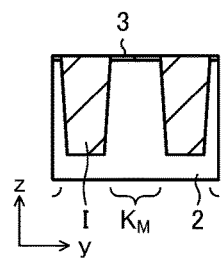
Figure 6F:
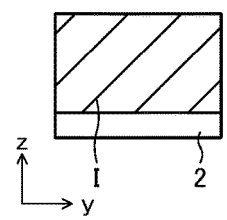

A semiconductor device 1 according to the embodiment of the present invention is, for example, a DRAM that is formed on a semiconductor substrate 2 as shown in FIG. 1B. As shown in FIG. 1A, a principal surface of the semiconductor substrate is sectioned into a memory cell area MA and a peripheral circuit area PA. FIG. 1A shows a part of the memory cell area MA and a part of the peripheral circuit area PA of an actual semiconductor device. A structure of transistors in the peripheral circuit area PA is illustrated for the purpose of explanations of the present embodiment and does not necessarily correspond to a structure of actual transistors.

Element isolation regions I made of insulating films are formed by an STI (Shallow Trench Isolation) method and embedded in the principal surface of the semiconductor substrate 2. A plurality of active regions $K_M$ and a plurality of active regions $K_P$ defined by the element isolation regions I are formed in the memory cell area MA and the peripheral circuit area PA, respectively.

Each of the active regions $K_M$ is a parallelogram that has one of two pairs of opposite sides extending in a y direction and the other pair extending in an x' direction that inclines with respect to an x direction and the y direction. The active regions $K_M$ are repeatedly arranged in the x direction and the y direction to form a matrix. Two memory cells are formed in each of the active regions $K_M$. However, only one memory cell is formed in each of the active regions $K_M$ located at ends of the memory cell area MA. When the width of the pair of opposite sides extending in the x' direction is close to a resolution limit of an exposure apparatus, the vertices of the parallelogram are possibly rounded, which causes the positions of the vertices to be obscure, or straight line portions of the opposite sides extending in the x' direction are possibly undetermined.

A plurality of word lines WL and a plurality of bit lines BL are formed in the memory cell area MA.

Each of the word lines WL is made of a conductive material embedded in a gate trench that is provided in the principal surface of the semiconductor substrate 2. A gate insulating film 15 is formed between the word lines WL and the inner surface of the gate trench. Each of the word lines WL is embedded only in a lower portion of the gate trench. A silicon nitride film 18 (cap insulating film) covering the upper surfaces of the word lines WL is embedded in an upper portion of the gate trench. The silicon nitride film 18 functions to ensure insulation between storage-node contact plugs SC (explained later) and the word lines WL and between the bit lines BL and the word lines WL. The word lines WL are provided to linearly extend in the y direction and are arranged in such a manner that two word lines WL pass through one active region $K_M$. However, as shown in FIGS. 1A and 1B, only one word line WL passes through each of active regions $K_M$ located at the ends of the memory cell area MA.

The bit lines BL are constituted by conductor patterns formed above the principal surface of the semiconductor substrate 2. The bit lines BL are provided to extend generally in the x direction while bending to pass through central portions of the active regions $K_M$ arranged in the x direction, respectively. The upper surface of each of the bit lines BL is covered with a hard mask film 34 (cover insulating film) and the upper surface of the hard mask film 34 is exposed on the upper surface of an interlayer insulating film 46 (explained later). The hard mask film 34 functions to insulate cell capacitors C from the bit lines BL. The side surfaces of the bit lines BL are covered with silicon nitride films 36 and liner films 45 which are constituted of insulating films. The silicon nitride film 36 and the liner film 45 function to insulate the storage-node contact plugs SC (explained later) from the bit lines BL.

A structure within the active regions $K_M$ is explained. P-wells (not shown) are formed in the semiconductor substrate 2 in vicinity to the surface thereof in the active regions $K_M$. N-impurity diffusion layers 12 are formed in the P-wells in vicinity to the surface of the semiconductor substrate 2. The P-wells and the N-impurity diffusion layers 12 are all formed by implanting impurity ions into the semiconductor substrate 2. As shown in FIG. 1B, the impurity diffusion layer 12 in each of the active regions $K_M$ is divided into three parts by the corresponding two word lines WL. One of these parts (third diffusion layer) located between the two word lines WL works as a source/drain region common to two cell transistors (access transistors) constituting the corresponding two memory cells, and is connected to the corresponding bit line BL via a bit-line contact plug BC. Each of the remaining two parts (second diffusion layers) is works as the other source/drain region of each of the two cell transistors and is connected to a corresponding lower electrode 86 (second conductive layer) of the cell capacitor C (capacitive element, an information accumulation element) via the corresponding storage-node contact plug SC (second contact plug).

The interlayer insulating film 46 (first insulating layer, first interlayer insulating layer) is formed on the principle surface of the semiconductor substrate 2 and the bit lines BL are formed to be buried in the interlayer insulating film 46. The position of the upper surface of the interlayer insulating film 46 is adjusted to be the same as that of the upper surface of the hard mask film 34 that coverts the upper surfaces of the bit lines BL. The storage-node contact plugs SC are formed to pass through the interlayer insulating film 46. Each of the lower surfaces of the storage-node contact plugs SC is in contact with the corresponding impurity diffusion layer 12. Each of the upper surfaces of the storage-node contact plugs SC is in contact with the corresponding lower electrode 86 of the corresponding cell capacitor C, respectively. Each of the storage-node contact plugs SC is composed of a lower-layer contact plug and an upper-layer contact plug, which is explained later in detail with the explanations of a manufacturing step. Insulation between adjacent ones of the storage-node contact plugs SC across the element isolation regions I is ensured by a silicon nitride film 56 formed in the same layer as the interlayer insulating film 46.

A silicon nitride film 70 (second insulating layer, second interlayer insulating layer) is formed on the upper surface of the interlayer insulating film 46, and a silicon nitride film 75 (third insulating layer, third interlayer insulating layer) is formed on the upper surface of the silicon nitride film 70. These films 70 and 75 are provided to prevent the storage-node contact plugs SC and the hard mask film 34 from being damaged at the time of formation of conductive lines PL (explained later) formed in the peripheral circuit area PA. Details thereof are explained later with the explanations of the manufacturing step. A silicon oxide film 92 is further formed on the upper surface of the silicon nitride film 75.

Each of the cell capacitors C is composed of the lower electrode 86, a capacitor insulating film 87 (fourth insulating layer) and upper electrodes 88, 89, and 90 (third conductive layer).

The lower electrodes 86 are conductors of a bottomed cylinder shape provided in each of the cell capacitors C. Although details thereof are explained later, the lower electrodes 86 are formed by providing cylinder holes passing through an insulting film (a silicon oxide film 81 and an interlayer insulating film 80 shown in FIG. 48 explained later), which is temporarily formed at the time of manufacturing, and the silicon nitride films 70 and 75 and then covering the inner surfaces of the cylinder holes. Parts of the side surfaces of each of the lower electrodes 86 located at the height of the silicon nitride films 70 and 75 are surrounded or covered by the silicon nitride films 70 and 75.

Each of the lower electrodes 86 is arranged at positions substantially overlapping with the corresponding storage-node contact plug SC in a planar view as shown in FIG. 1A. The lower surface of each of the lower electrodes 86 is in contact with the corresponding storage-node contact plug SC as shown in FIG. 1B. A lower end of each of the lower electrodes 86 is arranged so as to sink into the corresponding storage-node contact plug SC.

A silicon nitride film 82 (support film) is formed to connect adjacent two lower electrode 86s to each other as shown in FIG. 1B. The silicon nitride film 82 is provided so that the lower electrodes 86 having high aspect ratio can support each other, thereby preventing collapse of the lower electrodes 86 during formation of the cell capacitors C after the silicon oxide film 81 and the interlayer insulating film 80 explained later are removed.

The capacitor insulating film 87 is a thin insulating film that covers the whole of the surface of each of the lower electrodes 86 corresponding to the inside of the bottomed cylinder and the remaining part located above the silicon nitride film 75. The upper electrode 88 is a conductor formed to face the corresponding lower electrodes 86 via the capacitor insulating film 87. That is, each of the cell capacitors C has a configuration in which the lower electrode 86 and the upper electrode 88 face each other with an intervention of the capacitor insulating film 87. The upper electrode 89 is a conductor formed to fill hollow areas of the upper electrode 88, and the upper electrode 90 is a conductor covering surface of the upper electrode 89. A surface of the upper electrode 90 is covered with a silicon oxide film 91 as shown in FIG. 1B. The silicon oxide film 92 described above is formed in a thickness to cover the upper surface of the silicon oxide film 91 after formation of the silicon oxide film 91 is completed.

A plurality of conductive lines PL (first conductive layer, wiring layer) and a plurality of metal gates MG are then formed in the peripheral circuit area PA.

Each of the conductive lines PL is constituted of a conductor pattern that is formed on the upper surface of the interlayer insulating film 46. Although the conductive lines PL are illustrated as conductor patterns extending in the y direction in FIGS. 1A to 1F, actual conductive lines PL may have more complicated patterns. The conductive lines PL are formed to pass through the silicon nitride film 70 and the upper surfaces of the conductive lines PL are covered with the silicon nitride film 75.

Each of the metal gates MG is constituted of a conductor pattern that is formed on the principle surface of the semiconductor substrate 2 with an intervention of a gate insulating film 21. Although the metal gates MG are also illustrated as conductor patterns extending in the y direction in FIGS. 1A to 1F, actual metal gates MG may have more complicated patterns. The upper surface of each of the metal gates MG is covered with the hard mask film 34, similarly to the bit lines BL. The hard mask films 34 function to insulate the conductive lines PL from the metal gates MG, respectively. The side surfaces of each of the metal gates MG are covered with the silicon nitride films 36, silicate glass films 39, and the liner films 45. These films 36, 39 and 45 covering the side surfaces of the metal gates MG function to insulate peripheral contact plugs PC, which are explained later, from the metal gates MG, respectively.

A structure within the active regions $K_P$ will be explained next. While the active regions $K_P$ include regions in which N-channel MOS transistors are to be formed and regions in which P-channel MOS transistors are to be formed, only one of the active regions $K_P$ in which the N-channel MOS transistors are to be formed is illustrated in FIGS. 1A to 1F and each figure described below. Although explanations will be given below with attention focused on the one active region $K_P$ in which the N-channel MOS transistors are to be formed, each of the active regions $K_P$ in which the P-channel MOS transistors are to be formed has an identical structure except that the conductive type of a well and impurity diffusion layers is changed.

P-wells (not shown) are formed in the semiconductor substrate 2 in vicinity to the surface thereof in the active region $K_P$ in which the N-channel MOS transistors are to be formed. N-impurity diffusion layers 41 (first diffusion layers) are formed in the P-wells in vicinity to the surface of the semiconductor substrate 2. The impurity diffusion layers 41 are formed by implanting N-impurities of a high concentration into the surface areas after forming N-type low-concentration impurity diffusion layers 38 in the same surface areas.

Attention is focused on the active region $K_P$ shown in FIGS. 1A to 1F. Two metal gates MG extending in the y direction are formed on the active region $K_P$. The impurity diffusion layers 41 are arranged on an area located between the two metal gates MG in a planar view and two areas located on both sides of the two metal gates MG in a planar view, that is, arranged on three areas in total. The impurity diffusion layers 41 are connected to the conductive lines PL via the peripheral contact plugs PC (first contact plugs), respectively. Although FIGS. 1A to 1F illustrate the impurity diffusion layers 41 connected to different conductive lines PL, respectively, the impurity diffusion layers 41 may practically be connected to the same conductive line PL in some cases. With this structure, peripheral transistors each having the metal gate MG as a gate electrode and the impurity diffusion layers 41 as source/drain regions on the both sides of the metal gate MG are formed in the active region $K_P$.

A manufacturing method of the semiconductor device 1 having the above structure will be next explained with reference to FIGS. 2A to 49F.

As shown in FIGS. 2A to 2F, a pad oxide film 3 and a silicon nitride film 4 are first formed on the entire surface of the semiconductor substrate 2. Parts of the pad oxide film 3 and the silicon nitride film 4 formed on an area to be the element isolation regions I is then removed by etching to form element isolation trenches t1. The pad oxide film 3 may be formed by thermally oxidizing the surface of the semiconductor substrate 2. Meanwhile, the silicon nitride film 4 may be formed by an LPCVD (Low Pressure Chemical Vapor Deposition) method or a plasma CVD (plasma Chemical Vapor Deposition) method. A stacked film including a silicon nitride film, an amorphous carbon film, a silicon nitride film, and a silicon oxide film successively stacked from a side nearer to the pad oxide film 3 can be used instead of the silicon nitride film 4. In this case, it is preferable to form the silicon nitride film as the first layer by the LPCVD method and to form the silicon nitride film as the third layer and the silicon oxide film as the fourth layer by the plasma CVD method.

A radical oxide film 5 is then formed on the entire surface including the inner surfaces of the element isolation trenches t1 as shown in FIGS. 3A to 3F. The radical oxide film 5 may be formed by an ISSG (In-Situ Steam Generation) method or an LPRO (Low Pressure Radical Oxidation) method.

Silicon oxide films 6 and 7 are then successively formed on the entire surface as shown in FIGS. 4A to 4F. It is suitable to form the silicon oxide film 6 by an F-CVD (Flowable Chemical Vapor Deposition) method and to form the silicon oxide film 7 by an HDP-CVD (High-Density Plasma Chemical Vapor Deposition) method. Annealing is once performed after formation of the silicon oxide film 6. The silicon oxide film formed by the F-CVD method has such a thickness that the element isolation trenches t1 relatively narrow in the memory cell area MA are filled with the silicon oxide film 6 while the element isolation trenches t1 relatively wide in the peripheral circuit area PA are not filled with the silicon oxide film 6. The silicon oxide film 7 functions to fill portions of the element isolation trenches t1 in the peripheral circuit area PA that are not completely filled with the silicon oxide film 6.

After the silicon oxide film 7 is formed, CMP (Chemical Mechanical Polishing) is then performed by using the silicon nitride film 4 as a stopper, whereby the upper surfaces of the silicon oxide film 6 and the silicon oxide film 7 become at the same level as the upper surface of the silicon nitride film 4 as shown in FIGS. 5A to 5F. With the foregoing steps, formation of the element isolation regions I composed of the radical oxide film 5, the silicon oxide film 6, and the silicon oxide film 7 is completed.

The silicon nitride film 4 is then removed by wet etching to expose the pad oxide film 3 as shown in FIGS. 6A to 6F. In FIGS. 6A to 6F and the following figures, the radical oxide film 5, the silicon oxide film 6, and the silicon oxide film 7 are illustrated collectively as the element isolation regions I. In this step, the upper surfaces of the element isolation regions I are also etched and consequently the upper surfaces of the element isolation regions I and the upper surface of the pad oxide film 3 become at substantially the same level.

Figure 7A:
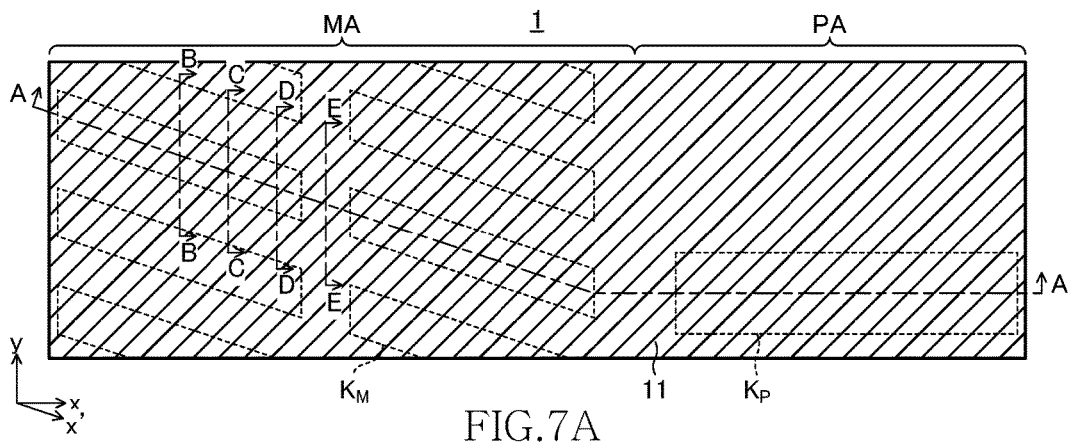
Figure 7B:
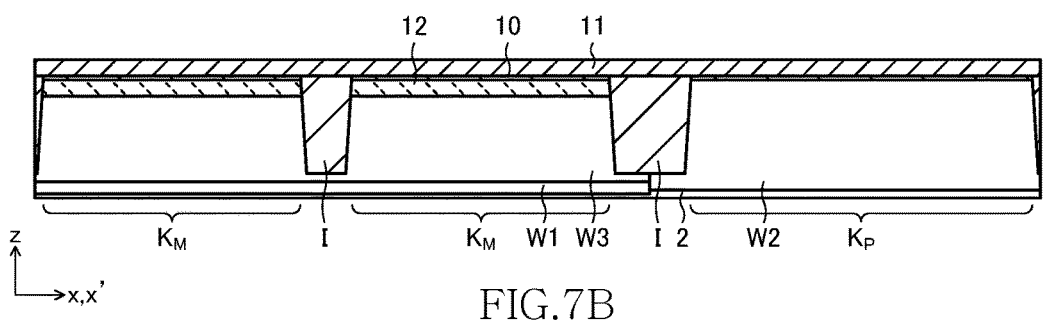
Figure 7C:
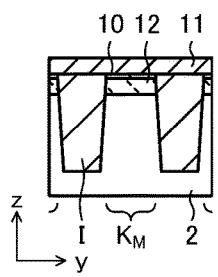
Figure 7D:
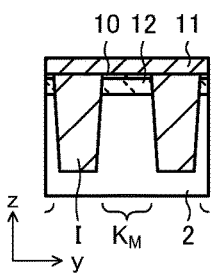
Figure 7E:
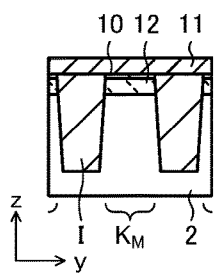
Figure 7F:
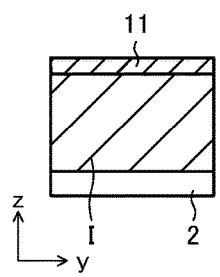

At this stage, wells W1 to W3 are formed in the semiconductor substrate 2 as shown in FIG. 7B. The wells W1 to W3 are not shown in figures other than FIG. 7B. Manufacturing method of the wells W1 to W3 will specifically be explained. First, phosphorus is implanted at a high energy with covering the peripheral circuit area PA with a resist (not shown) to form an N-type well W1 (N-well) having a depth which is deeper than that of the element isolation regions I. Because the peripheral circuit area PA is covered with the resist, the well W1 is formed only in the memory cell area MA.

An area in the peripheral circuit area PA other than the active regions $K_P$ in which the N-channel MOS transistors are to be formed and the memory cell area MA are then covered with a resist (not shown) and boron is implanted in this state at a high energy. Accordingly, a P-type well W2

(P-well) is formed in the active regions $K_P$ in which the N-channel MOS transistors are to be formed. Phosphorus is then further implanted at a low energy into the well W2 to adjust a threshold voltage of the N-channel MOS transistors to a desired value. Although not shown, an area in the peripheral circuit area PA other than the active regions $K_P$ in which the P-channel MOS transistors are to be formed and the memory cell area MA are then covered with a resist (not shown) and phosphorus is implanted in this state at a high energy. Accordingly, an N-type well (N-well (not shown)) is formed in the active regions $K_P$ in which the P-channel MOS transistors are to be formed. Boron is then further implanted at a low energy into the N-well to adjust a threshold voltage of the P-channel MOS transistors to a desired value.

The peripheral circuit area PA is then covered with a resist (not shown) again and boron is implanted in this state at a high energy to form a P-type well W3 (P-well) having a depth which is shallower than that of the well W1. Also the well W3 is formed only in the memory cell area MA. Phosphorus is further implanted after forming the well W3 to form the N-impurity diffusion layer 12 in the surface of the semiconductor substrate 2.

After the pad oxide film 3 is then removed by wet etching, a thermal oxide film 10 having a thickness of several nanometers is formed on the entire surface of the semiconductor substrate 2 by thermal oxidation as shown in FIGS. 7A to 7F. The thermal oxide film 10 can be formed with the pad oxide film 3 kept in the peripheral circuit area PA. After the thermal oxide film 10 is formed, a silicate glass film 11 is formed on the entire surface as shown in FIGS. 7A to 7F. Specifically, the silicate glass film 11 may be a non-doped silicate glass film grown by the LPCVD method using a mixed gas containing tetraethoxysilane (TEOS).

Figure 8A:
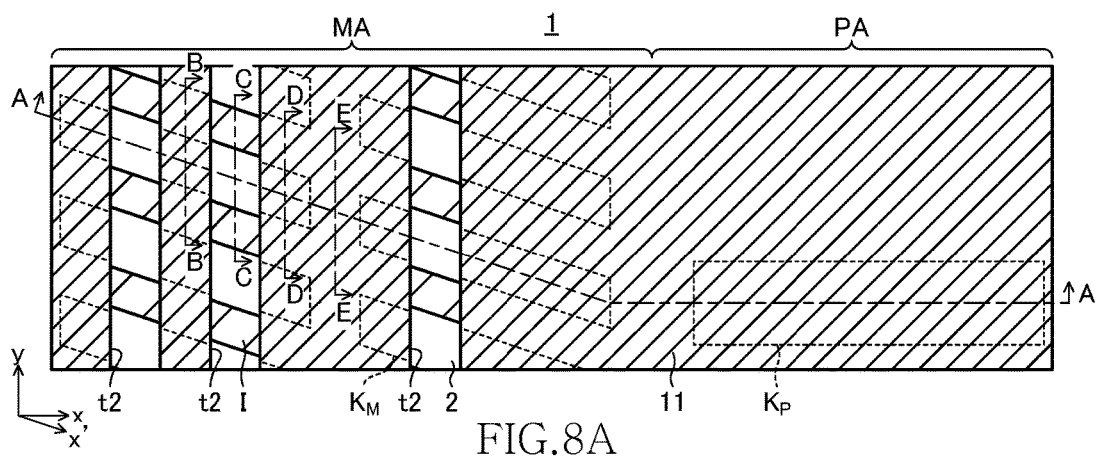
Figure 8B:
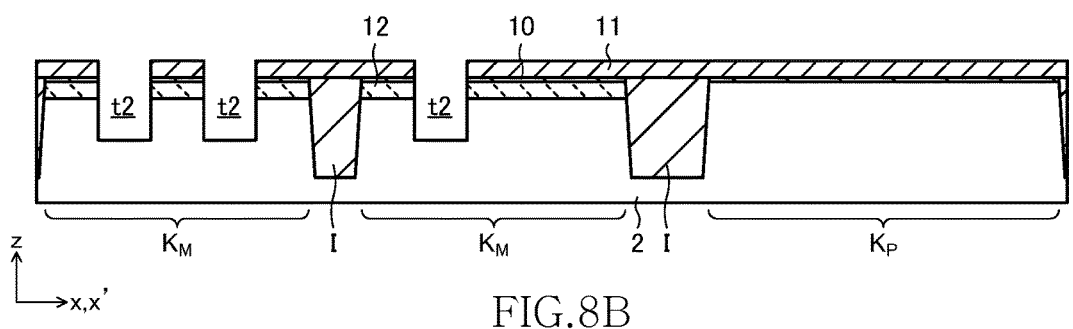
Figure 8C:
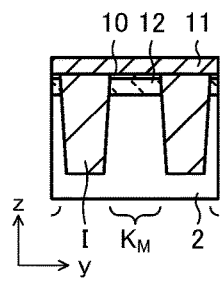
Figure 8D:
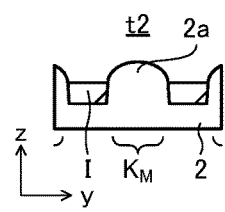
Figure 8E:
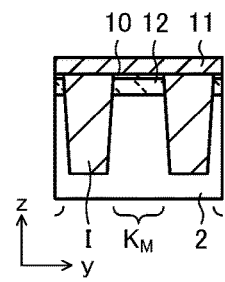
Figure 8F:
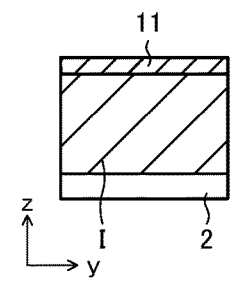
Figure 10A:
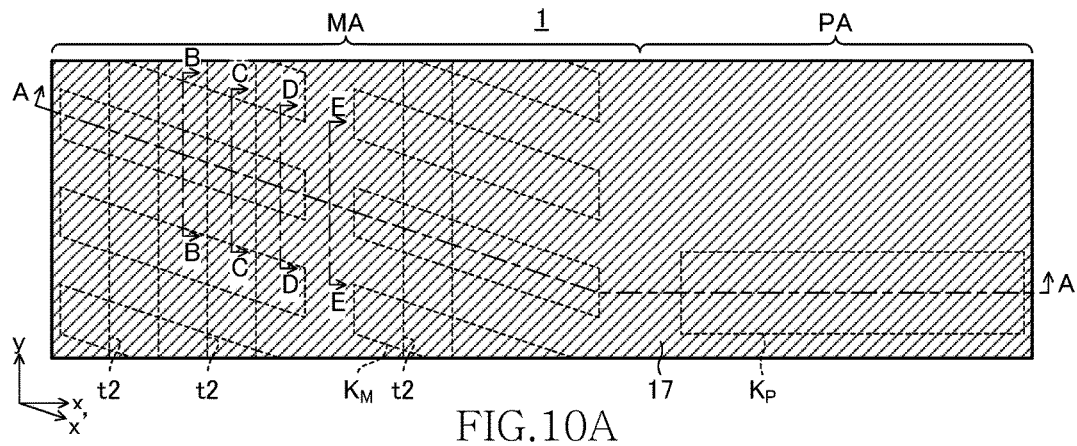
Figure 10B:
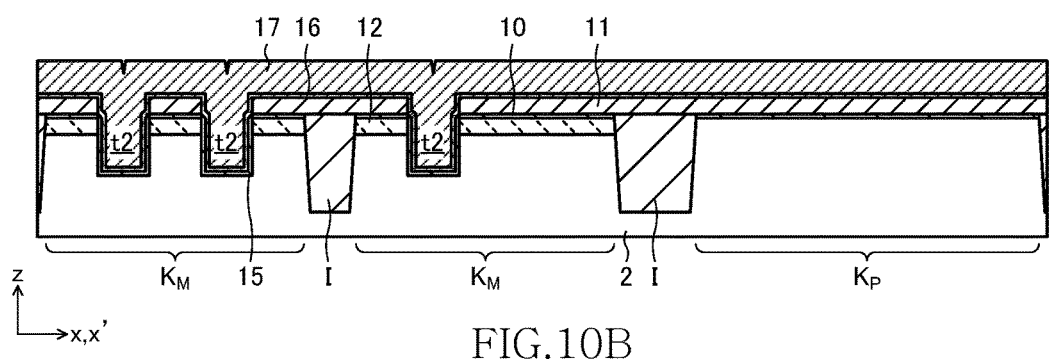
Figure 10C:
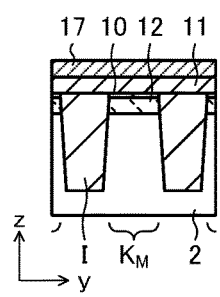
Figure 10D:
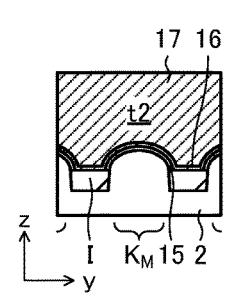
Figure 10E:
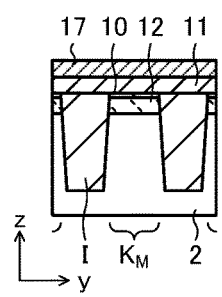
Figure 10F:
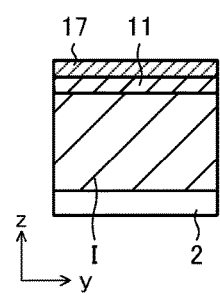
Figure 11A:
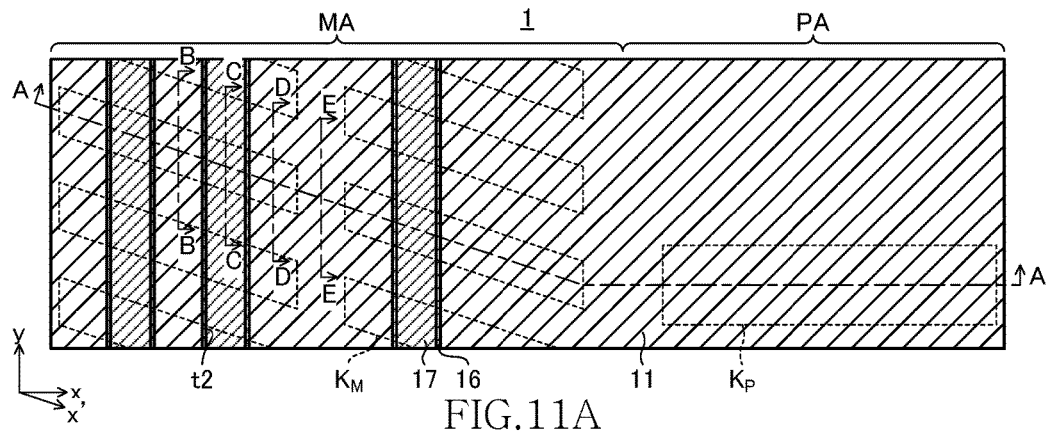
Figure 11B:
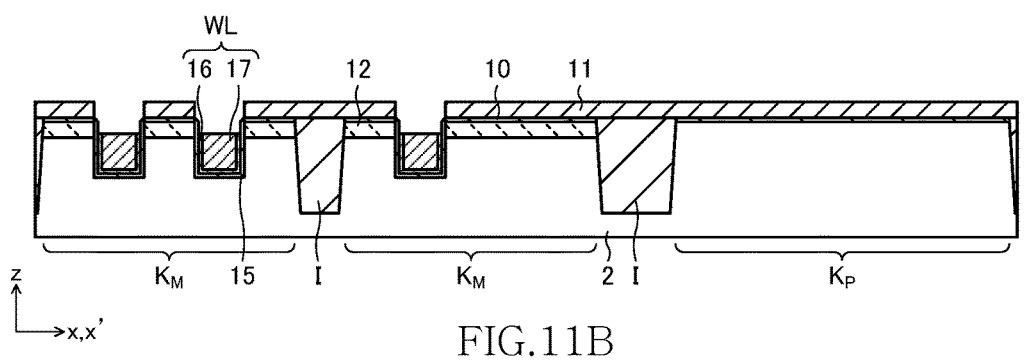
Figure 11C:
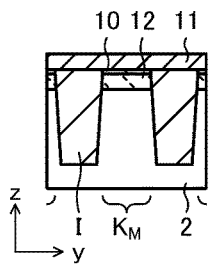
Figure 11D:
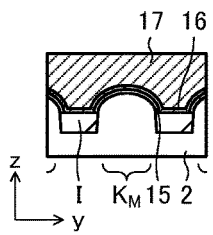
Figure 11E:
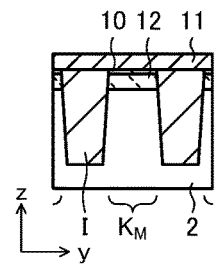
Figure 11F:
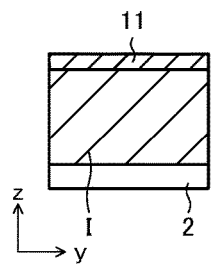
Figure 12A:
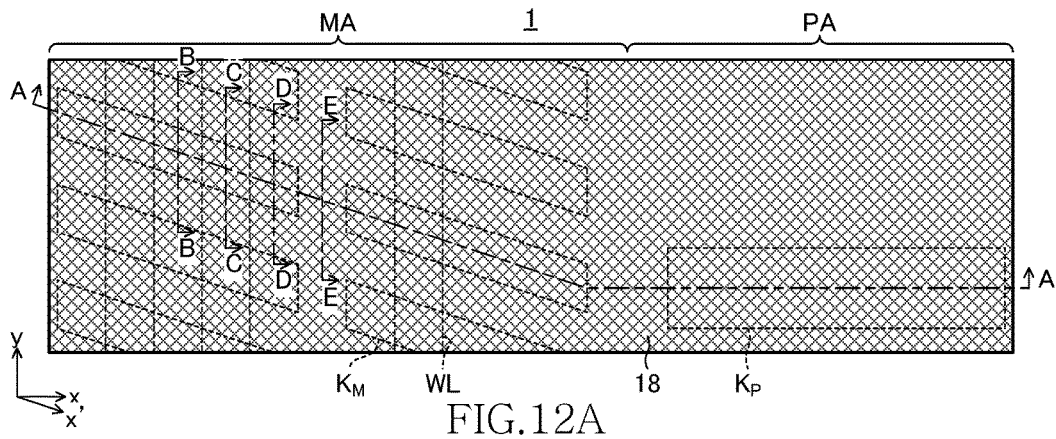
Figure 12B:
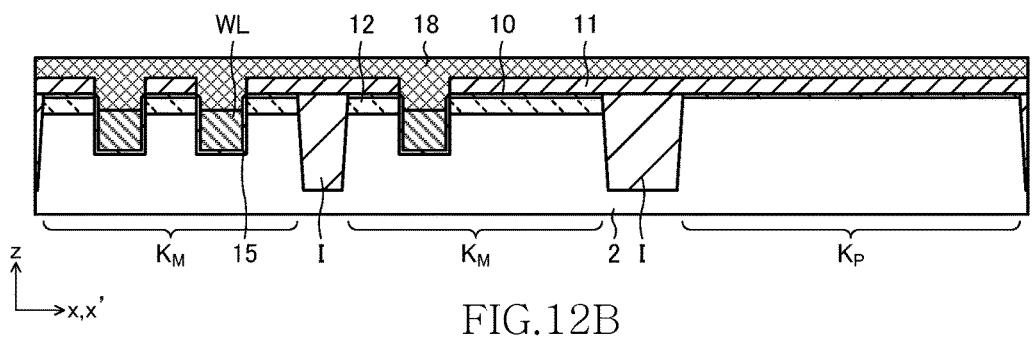
Figure 12C:
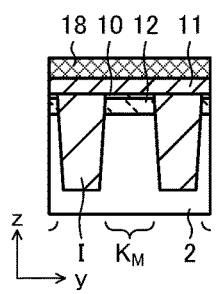
Figure 12D:
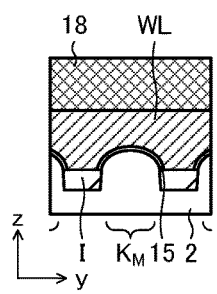
Figure 12E:
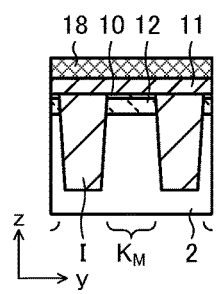
Figure 12F:
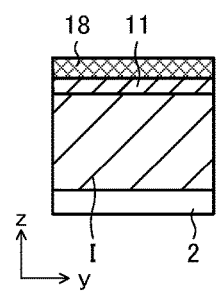
Figure 16A:
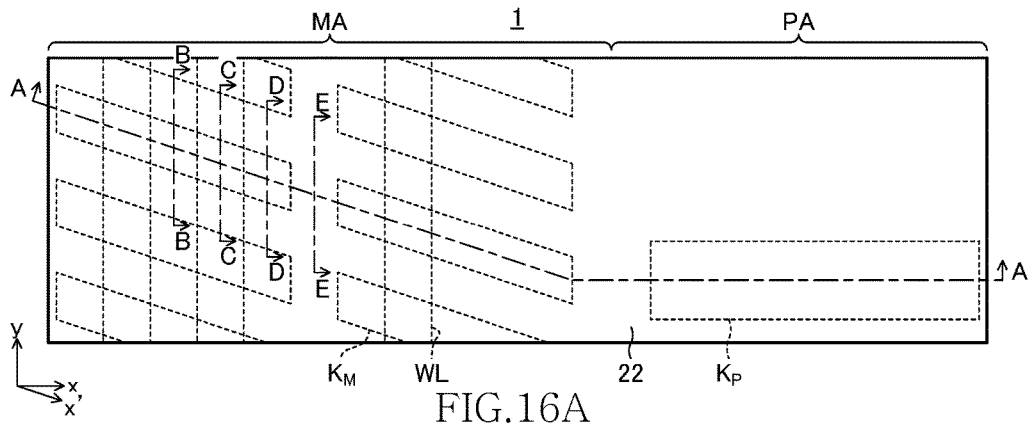
Figure 16B:
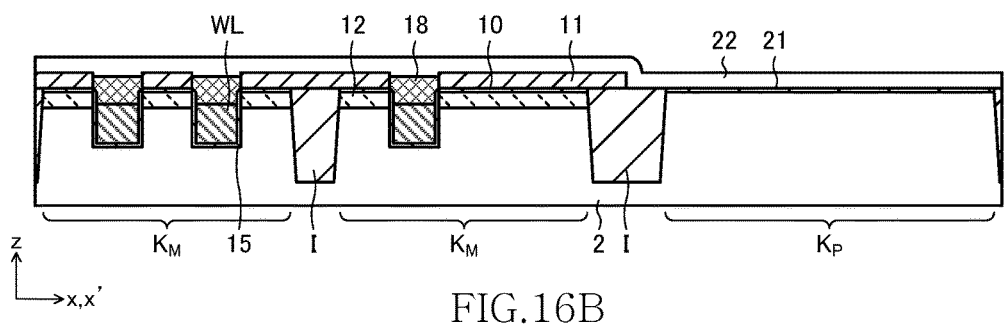
Figure 16C:
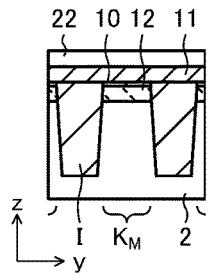
Figure 16D:
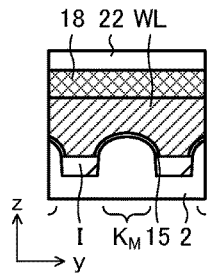
Figure 16E:
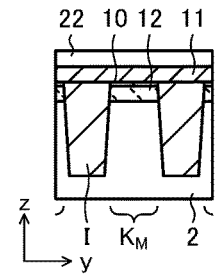
Figure 16F:
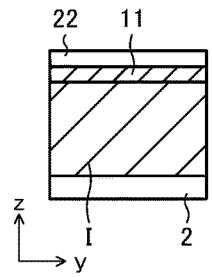
Figure 19A:
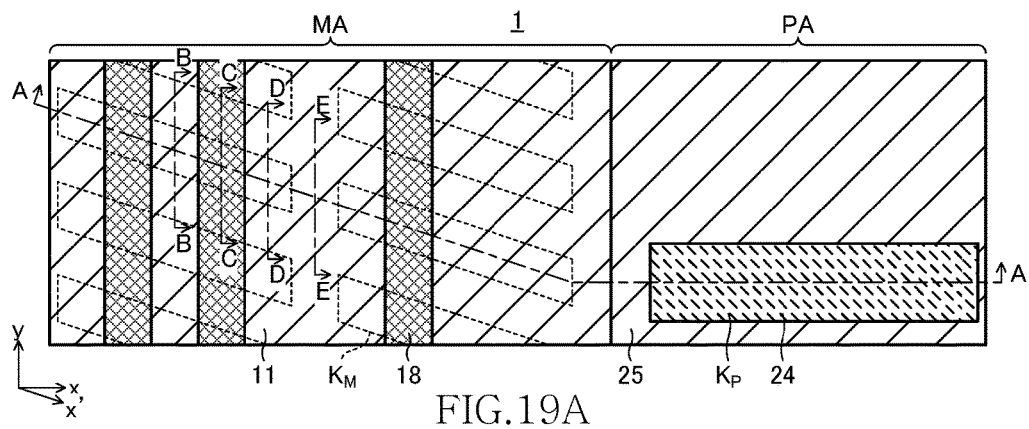
Figure 19B:
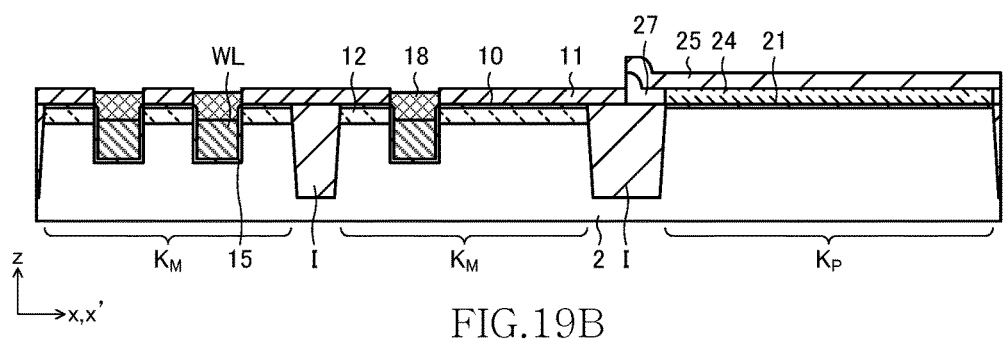
Figure 19C:
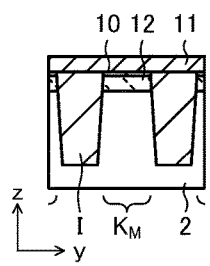
Figure 19D:
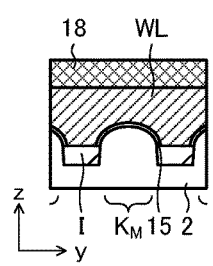
Figure 19E:
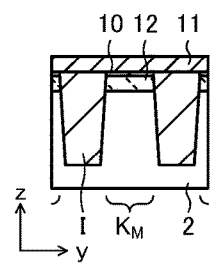
Figure 19F:
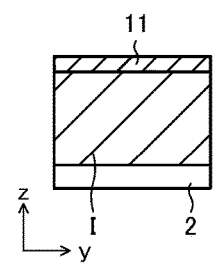
Figure 21A:
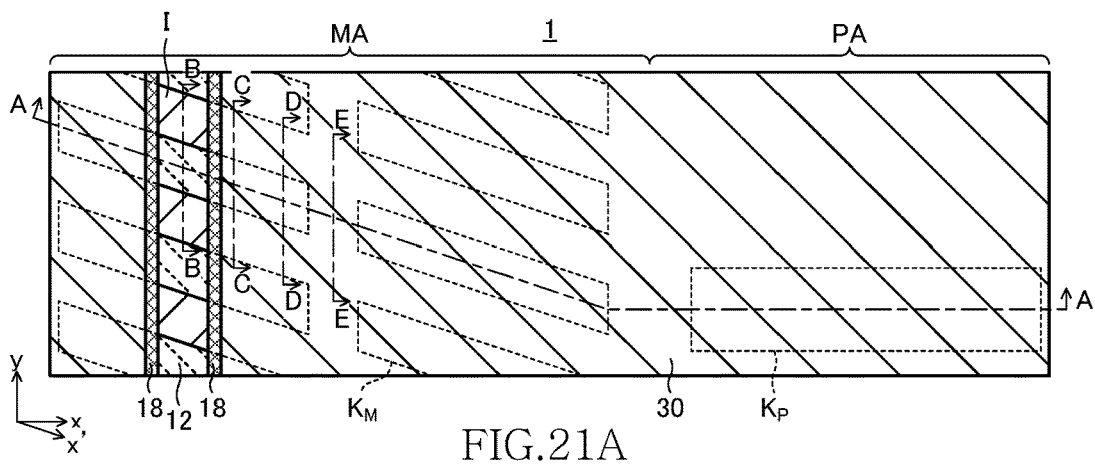
Figure 21B:
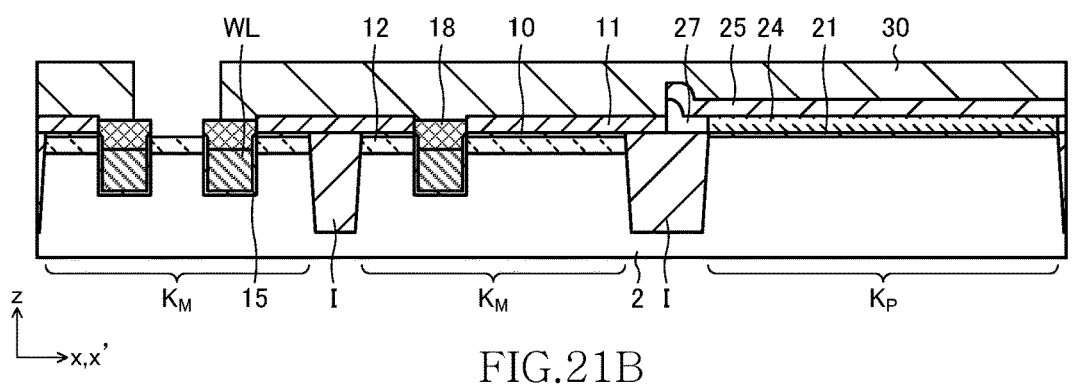
Figure 21C:
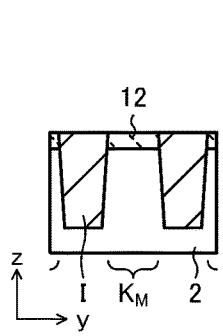
Figure 21D:
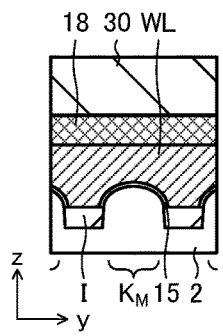
Figure 21E:
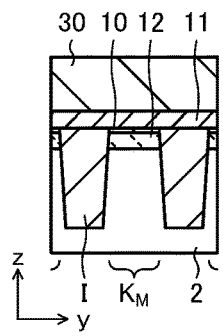
Figure 21F:
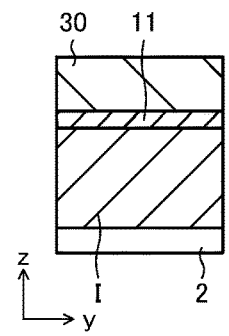
Figure 22A:
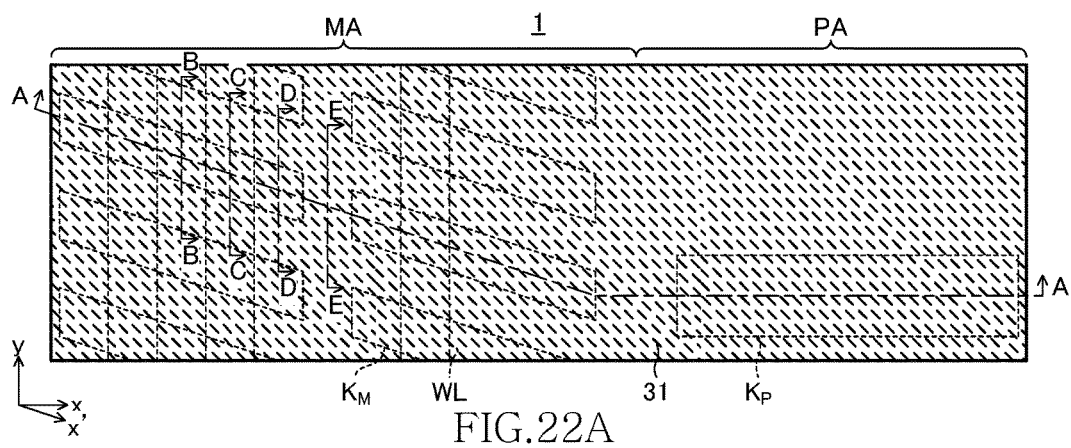
Figure 22B:
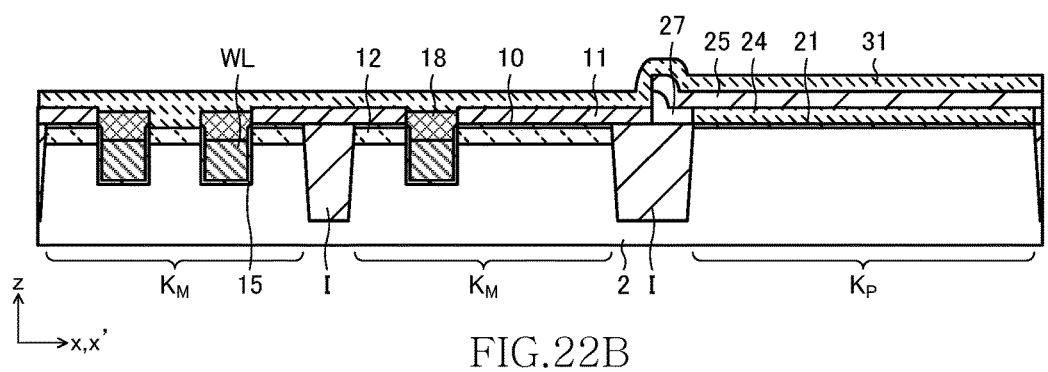
Figure 22C:
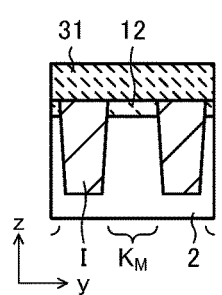
Figure 22D:
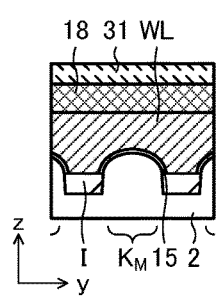
Figure 22E:
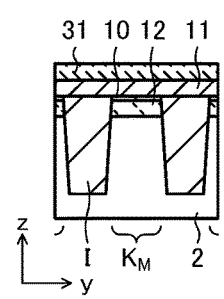
Figure 22F:
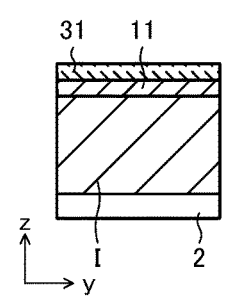
Figure 24A:
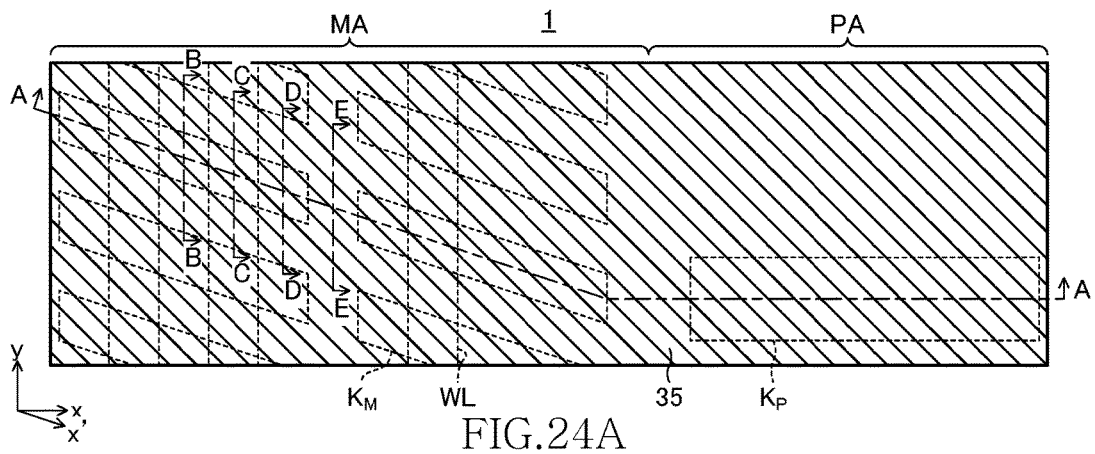
Figure 24B:
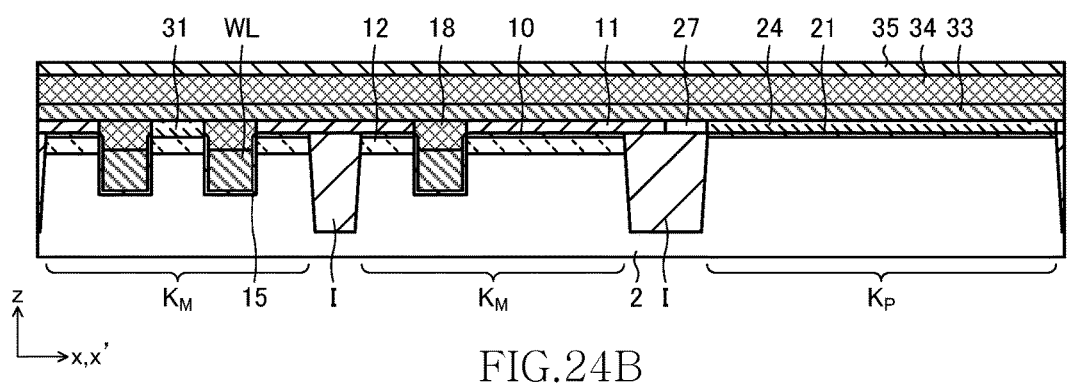
Figure 24C:
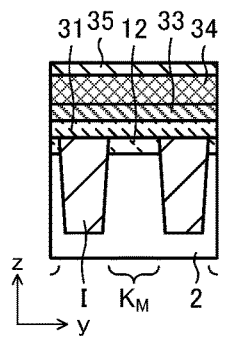
Figure 24D:
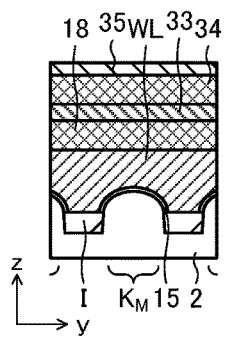
Figure 24E:
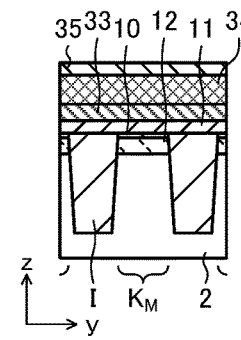
Figure 24F:
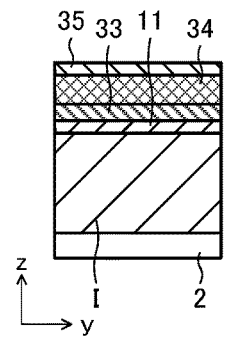
Figure 29A:
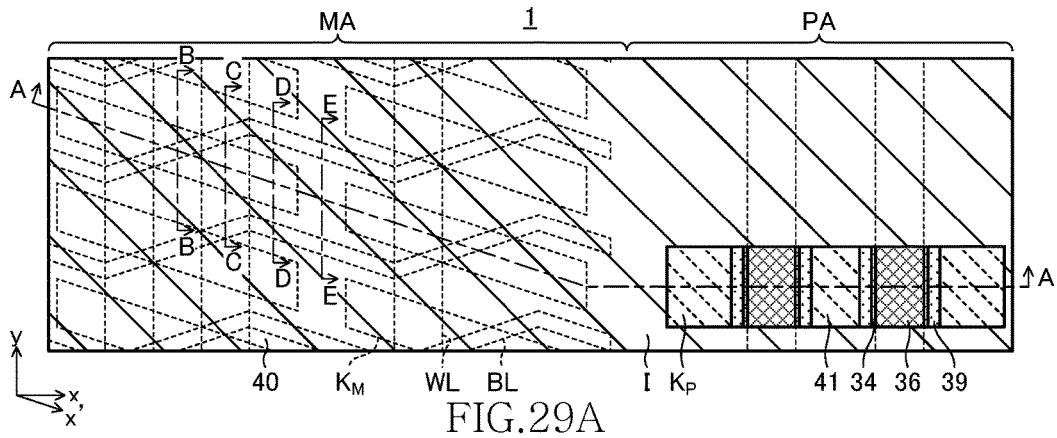
Figure 29B:
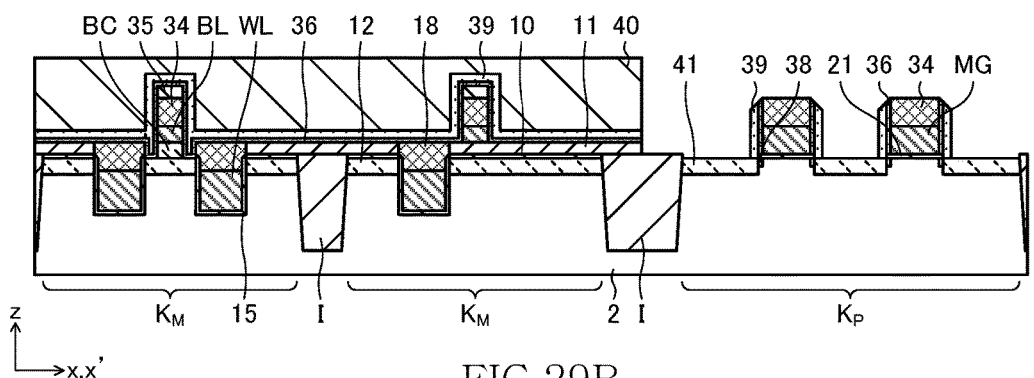
Figure 29C:
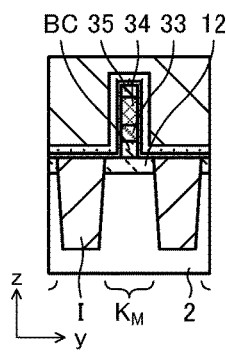
Figure 29D:
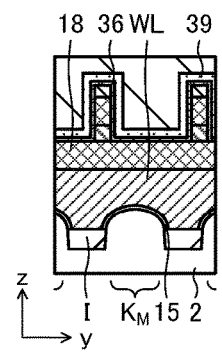
Figure 29E:
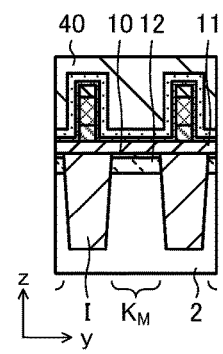
Figure 29F:
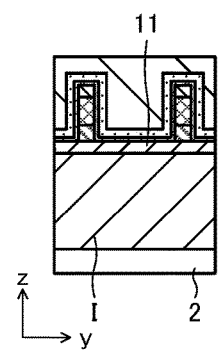
Figure 31A:
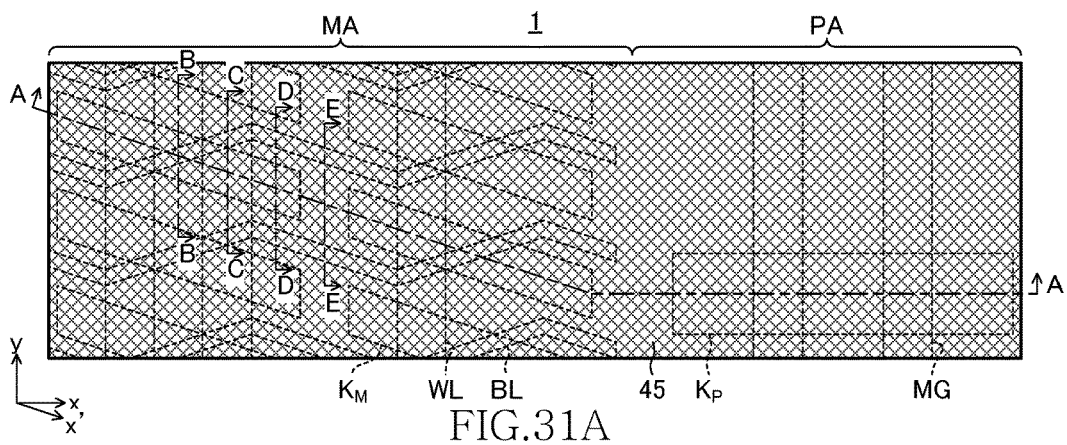
Figure 31B:
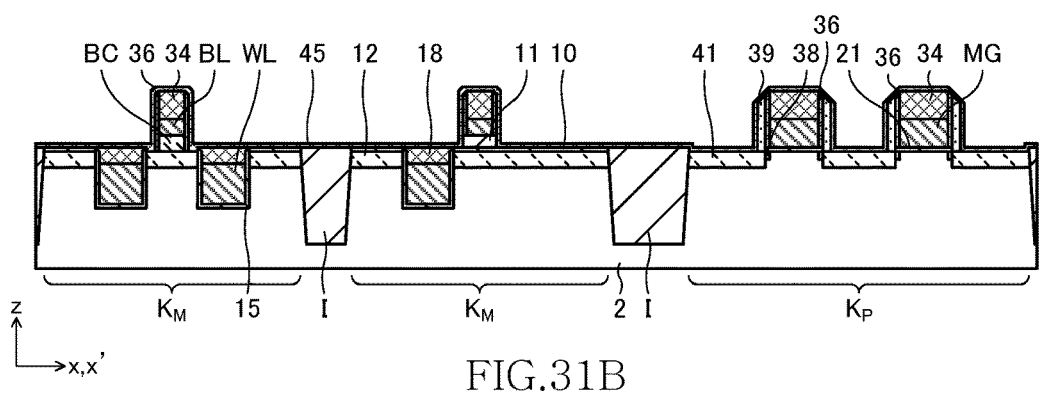
Figure 31C:
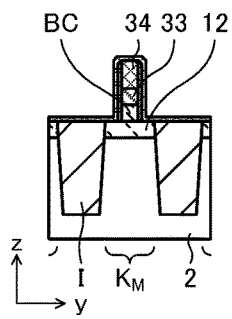
Figure 31D:
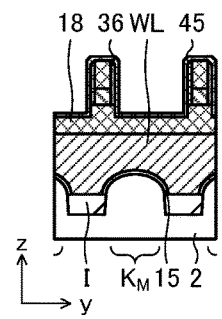
Figure 31E:
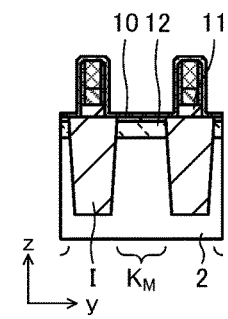
Figure 31F:
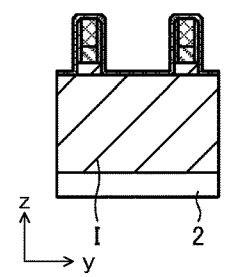

The word lines WL shown in FIGS. 1A to 1F are then formed. Specifically, word trenches t2 are first formed as shown in FIGS. 8A to 8F. The word trenches t2 may be formed by first patterning the silicate glass film 11 according to planar shapes of the word trenches t2 using resist patterns (not shown) and then etching the thermal oxide film 10, the element isolation regions I, and the semiconductor substrate 2 using the patterned silicate glass film 11 as a mask. The word trenches t2 thus formed are relatively deep in the element isolation regions I as shown in FIG. 8D and relatively shallow in the active regions $K_M$. A structure in which the active region $K_M$ of a fin-shaped protrudes from the bottom of the word trench t2 is obtained and the protruded portion is referred to as saddle fin 2a.

Thermal oxidation is then performed to form the gate insulating film 15 on the inner surfaces of the word trenches t2 in which the semiconductor substrate 2 is exposed in the active regions $K_M$ as shown in FIGS. 9A to 9F. A titanium nitride film 16 and a tungsten film 17 are then successively formed on the entire surface as shown in FIGS. 10A to 10F. The titanium nitride film 16 has such a thickness to thinly cover a surface of the gate insulating film 15. Meanwhile, the tungsten film 17 has such a thickness to completely fill the entire word trenches t2. After the tungsten film 17 is formed, the titanium nitride film 16 and the tungsten film 17 are then etched back as shown in FIGS. 11A to 11F. The etchback is performed such that the upper surfaces of the titanium nitride film 16 and the tungsten film 17 are positioned several nanometers above a lower end of the impurity diffusion layer 12. The titanium nitride film 16 and the tungsten film 17 remaining inside the word trenches t2 after the etchback constitute the word lines WL.

The silicon nitride film 18 is then formed to fill upper portions of the word trenches t2 as shown in FIGS. 12A to 12F. In FIGS. 12A to 12F and the following figures, the titanium nitride film 16 and the tungsten film 17 are illustrated collectively as the word lines WL. The silicon nitride film may be a stacked film including a silicon nitride film formed by the LPCVD method and a silicon nitride film formed by an ALD (Atomic Layer Deposition) method. After the silicon nitride film 18 is formed, the silicon nitride film 18 is etched back such that the silicate glass film 11 is exposed to cause the silicon nitride film 18 to remain only inside of the word trenches t2 as shown in FIGS. 13A to 13F.

Only the memory cell area MA is then covered with a resist 20 as shown in FIGS. 14A to 14F. The silicate glass film 11 and the thermal oxide film 10 formed on the peripheral circuit area PA are removed by wet etching with covering the memory cell area MA with a resist 20. Accordingly, the surface of the semiconductor substrate 2 is exposed in the active region $K_P$.

After the resist 20 is then removed, thermal oxidation is performed to form the gate insulating film 21 on the surfaces of the active region $K_P$ as shown in FIGS. 15A to 15F. Next, a non-doped amorphous silicon film 22 is formed on the entire surface as shown in FIGS. 16A to 16F. The thickness of the amorphous silicon film 22 is adjusted to cause the upper surface of the amorphous silicon film 22 located in the peripheral circuit area PA being substantially the same plane as the upper surface of the silicate glass film 11 remaining in the memory cell area MA.

As shown in FIGS. 17A to 17F, a part of the amorphous silicon film 22 formed on the active regions $K_P$ is converted into a polysilicon film 24 doped with N-impurities where the N-channel MOS transistors are to be formed. Furthermore, a part of the amorphous silicon film 22 formed on the active regions $K_P$ is converted into a polysilicon film doped with P-impurities where the P-channel MOS transistors are to be formed (not shown). More specifically, as shown in FIGS. 17A to 17F, the area other than the active regions $K_P$ in which the N-channel MOS transistors are to be formed on the peripheral circuit area PA and the memory cell area MA are first covered with a resist 23 and phosphorus is implanted in this state at a low energy into an exposed part of the amorphous silicon film 22. Although not shown, the area other than the active regions $K_P$ in which the P-channel MOS transistors are to be formed on the peripheral circuit area PA and the memory cell area MA are then covered with a resist and boron is implanted in this state at a low energy into an exposed part of the amorphous silicon film 22. After the resist is removed, heat treatment by a RTP (Rapid Thermal Process) method is then performed to activate the implanted phosphorus and boron and to polycrystallize the amorphous silicon film 22. Accordingly, the amorphous silicon film 22 in the active regions $K_P$ in which the N-channel MOS transistors are to be formed is converted into the polysilicon film 24 doped with the N-impurities. The amorphous silicon film 22 in the active regions $K_P$ in which the P-channel MOS transistors are to be formed is converted into the polysilicon film doped with the P-impurities. The amorphous silicon film 22 in the memory cell area MA and the like are converted into a polysilicon film 27.

A silicon oxide film 25 is then formed on the entire surface by using the plasma CVD method as shown in FIGS. 18A to 18F. The silicon oxide film 25 and the polysilicon film 27 are then etched with covering the peripheral circuit area PA with a resist 26. Accordingly, the silicon oxide film 25 and the polysilicon film 27 formed on the memory cell area MA is removed as shown in FIGS. 19A to 19F. The resist 26 is then removed after removing the parts of the silicon oxide film 25 and the polysilicon film 27.

The bit-line contact plugs BC, the bit lines BL, and the metal gates MG shown in FIGS. 1A to 1F are then formed. Specifically, as shown in FIGS. 20A to 20F, a bit-line contact mask 30 having an opening exposing a part of the silicate glass film 11 is first formed. The opening is located at a position overlapping in a planar view with the impurity diffusion layer 12 to which the bit-line contact plug BC is to be connected. A hole-pattern shrink process called RELACS (Resolution Enhancement Lithography Assisted by Chemical Shrink) may be used to form the bit-line contact mask 30. The silicate glass film 11 and the thermal oxide film 10 are then successively and selectively removed by dry etching using the bit-line contact mask 30 as a mask, thereby the surface of the semiconductor substrate 2 that is the surface of the impurity diffusion layer 12 is exposed in the opening as shown in FIGS. 21A to 21F. The concentration of impurities of the impurity diffusion layer 12 can be increased by performing ion implantations of the impurities again into the exposed surface of the impurity diffusion layer 12.

After the bit-line contact mask 30 is then removed, a polysilicon film 31 doped with impurities is formed on the entire surface by the CVD method as shown in FIGS. 22A to 22F. The polysilicon film 31 is then etched back until a surface of the silicate glass film 11 appears, and then the silicon oxide film 25 formed in the peripheral circuit area PA is removed by etching. This step causes the polysilicon film 31 to remain only in an area between two word lines WL passing through one of the active regions $K_M$. Further this step exposes the surfaces of the polysilicon film 24 (and the polysilicon film formed in the active region $K_P$ in which the P-channel MOS transistors are to be formed and doped with the P-impurities) and the silicate glass film 11, as shown in FIGS. 23A to 23F. The amount of etching and selectivity thereof in this step are preferably adjusted to cause the exposed surfaces to form the same plane.

As shown in FIGS. 24A to 24F, a conductive material 33, the hard mask film 34, an amorphous carbon film (not shown), a silicon oxynitride film (not shown), and a silicon oxide film 35 are then successively formed on the entire surface. The conductive material 33 may include a tungsten silicide film, a tungsten nitride film, and a tungsten film successively stacked. The hard mask film 34 may include a silicon nitride film and a silicon oxide film successively stacked. As shown in FIGS. 25A and 25F, the bit lines BL and the metal gates MG are then formed by dry etching the silicon oxide film 35, the silicon oxynitride film, the amorphous carbon film, and the hard mask film 34, and the conductive material 33. This process is performed by transferring a desired pattern to the silicon oxide film 35, the silicon oxynitride film, the amorphous carbon film, and the hard mask film 34, and then etching the conductive material 33 by using the amorphous carbon film and the hard mask film 34 as a mask. This patterning allows the polysilicon film 31 located under the bit lines BL to be patterned into shapes of the bit-line contact plugs BC. In the peripheral circuit area PA, the polysilicon film 24 (and the polysilicon film formed in the active regions $K_P$ in which the P-channel MOS transistors are to be formed and doped with the P-impurities) is also patterned into the shapes of the metal gates MG. The metal gates MG is a stacked film including the polysilicon film and the conductive material 33 which have been patterned in this way.

As shown in FIGS. 26A to 26F, the silicon nitride film 36 serving as a thin offset spacer is then formed on the entire surface. In FIGS. 26A to 26F and the following figures, the polysilicon film 24 and the conductive material 33 are illustrated collectively as the metal gates MG. The area of the peripheral circuit area PA other than the active regions $K_P$ in which the N-channel MOS transistors are to be formed and the memory cell area MA are then covered with a resist 37 as shown in FIGS. 27A to 27F. N-impurities are implanted in this state to form the N-type low-concentration impurity diffusion layers 38 in the surface of the semiconductor substrate 2 in the active regions $K_P$ in which the N-channel MOS transistors are to be formed. The silicon nitride film 36 is etched back to form side wall films consisting of the silicon nitride film 36. Further, unnecessary parts of the gate insulating film 21 formed on the surfaces of the active regions $K_P$ are etched which are not covered by the metal gates MG and the side wall films. The resist 37 is removed after the above steps end. Although not shown, also in the active regions $K_P$ in which the P-channel MOS transistors are to be formed, formation of P-type low-concentration impurity diffusion layers and formation of the side wall films consisting of the silicon nitride film 36 and etching of the gate insulating film 21 are performed in identical steps.

The silicate glass film 39 is then formed on the entire surface as shown in FIGS. 28A to 28F. Specifically, the silicate glass film 39 is suitably a non-doped silicate glass film grown by the LPCVD method using the mixed gas containing tetraethoxysilane (TEOS), similarly to the silicate glass film 11. The area of the peripheral circuit area PA other than the active regions $K_P$ in which the N-channel MOS transistors are formed and the memory cell area MA are then covered with a resist 40 as shown in FIGS. 29A to 29F. N-impurities are then implanted in this state to form N-impurity diffusion layers 41 in the surface of the semiconductor substrate 2 corresponding to the active region $K_P$ in which the N-channel MOS transistors are formed. Etchback of the silicate glass film 39 is then performed to form side wall films consisting of the silicate glass film 39. The resist 40 is removed after the above steps end. Although not shown, also in the active regions $K_P$ in which the P-channel MOS transistors are formed, formation of a P-impurity diffusion layers and formation of the side wall films consisting of the silicate glass film 39 are performed in identical steps.

The peripheral circuit area PA is then covered with a resist 42 as shown in FIGS. 30A to 30F. Wet etching of the silicate glass film 39, etchback of the silicon nitride film 36, and etching of the silicate glass film 11 and the silicon nitride film 18 are successively performed in this state. Accordingly, the silicate glass film 39 is first removed completely in the memory cell area MA as shown in FIGS. 30A to 30F. The silicon nitride film 36 remains as side wall films that cover the side surfaces of the bit lines BL, the bit-line contact plugs BC, and the hard mask film 34. Portions other than the side wall films of the silicon nitride film 36 are removed. Only parts of the silicate glass film 11 which are not covered by the bit lines BL and the side wall films consisting of the silicon nitride film 36 remain, and other parts of the silicate glass film 11 are removed. In the memory cell area MA, the upper surfaces of the silicon nitride film 18, the thermal oxide film 10, and the element isolation regions I form the same plane after this step ends. The resist 42 is removed after the above steps end.

The liner film 45 (an SOD liner) consisting of a silicon nitride film is then formed on the entire surface as shown in FIGS. 31A to 31F. The interlayer insulating film 46 (first insulating layer) consisting of a spin-on insulating film (SOD) is then formed on the entire surface as shown in FIGS. 32A to 32F. The interlayer insulating film 46 may be formed by coating a coat film including a polysilazane on the entire surface and then modifying the coat film by heat treatment.

After the interlayer insulating film 46 is formed, the surface thereof is flattened by a method such as CMP (Chemical Mechanical Polishing) until the upper surface of the liner film 45 is exposed as shown in FIGS. 33A to 33F. A silicate glass film 47 is then formed on the entire surface by the LPCVD method using the mixed gas containing tetraethoxysilane (TEOS) and further a polysilicon film 48 is formed on the entire surface.

Figure 34A:
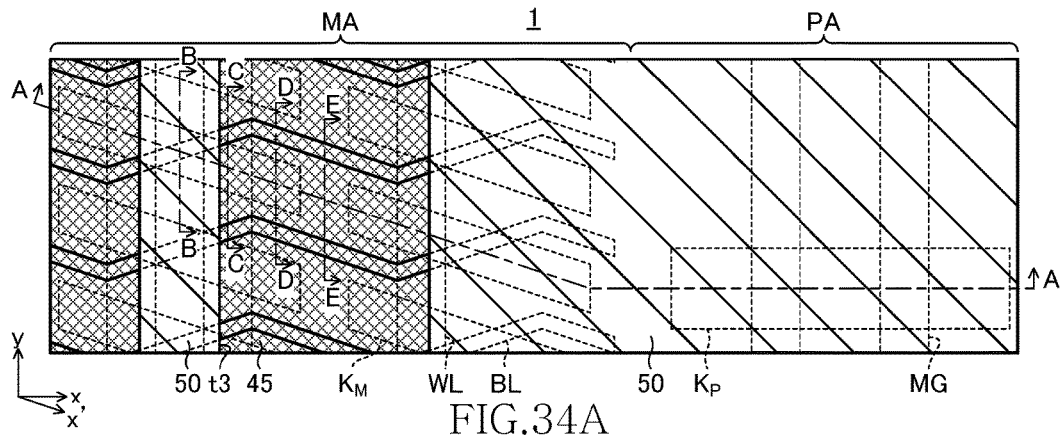
Figure 34B:
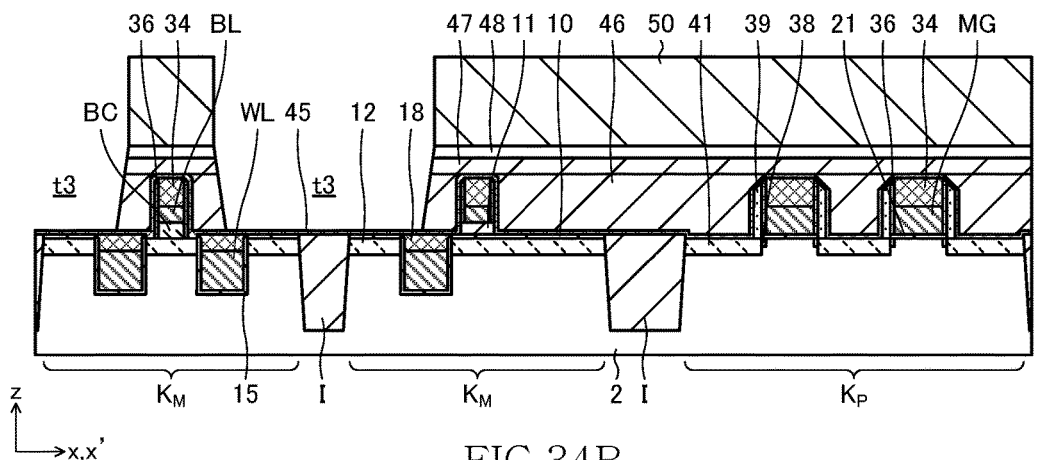
Figure 34C:
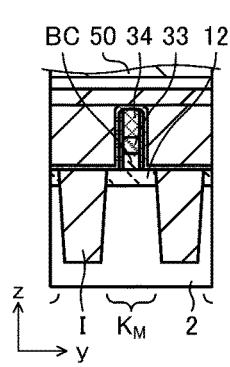
Figure 34D:
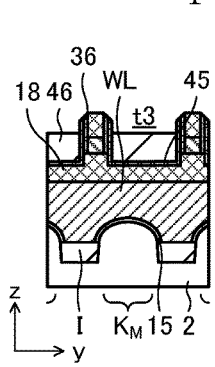
Figure 34E:
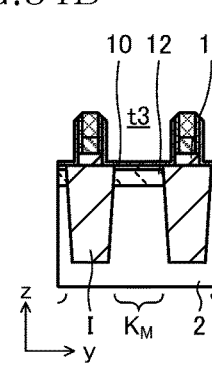
Figure 34F:
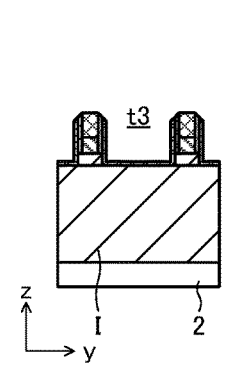
Figure 36A:
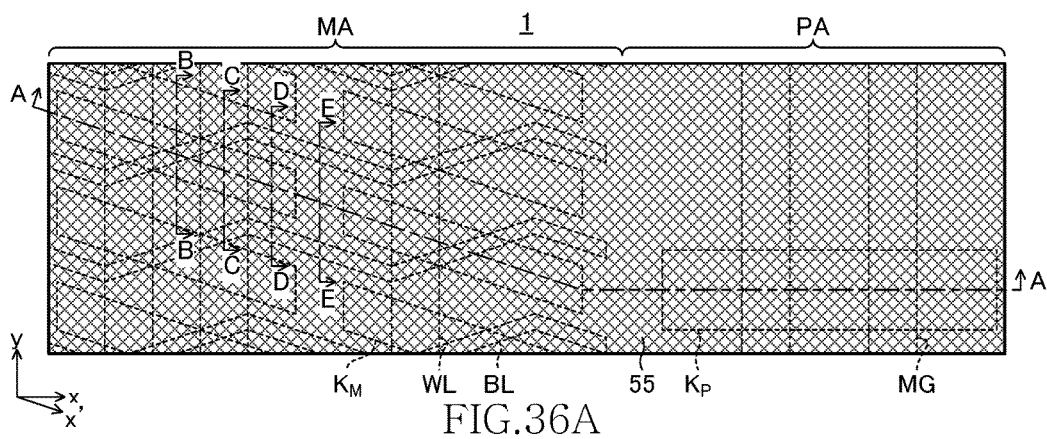
Figure 36B:
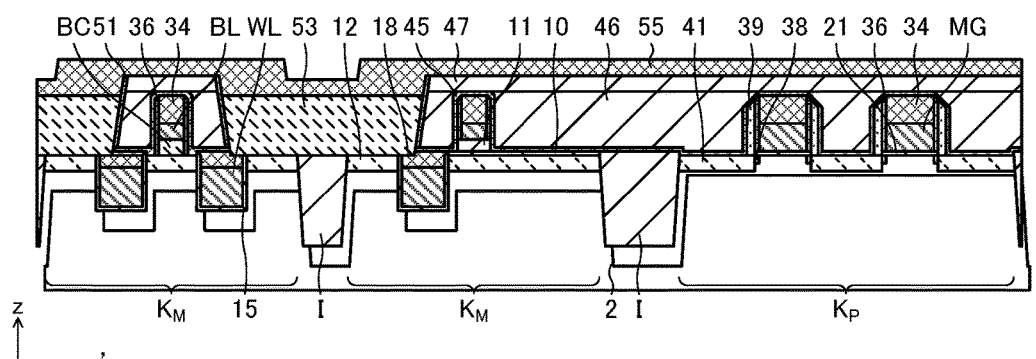
Figure 36C:
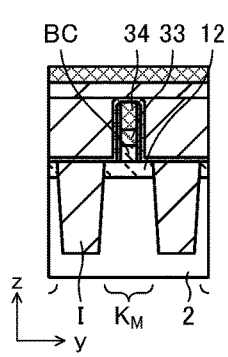
Figure 36D:
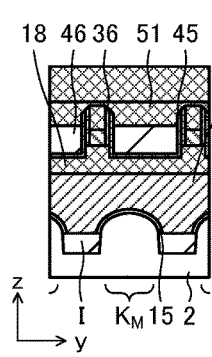
Figure 36E:
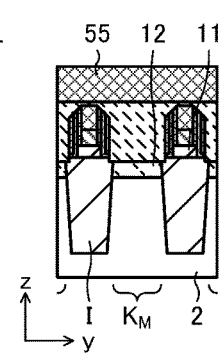
Figure 36F:
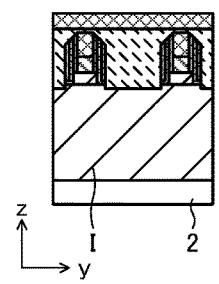
Figure 38A:
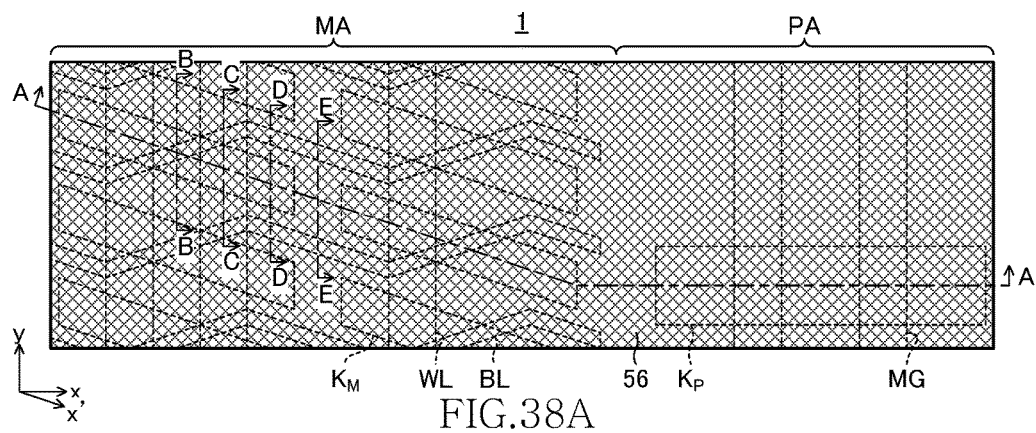
Figure 38B:
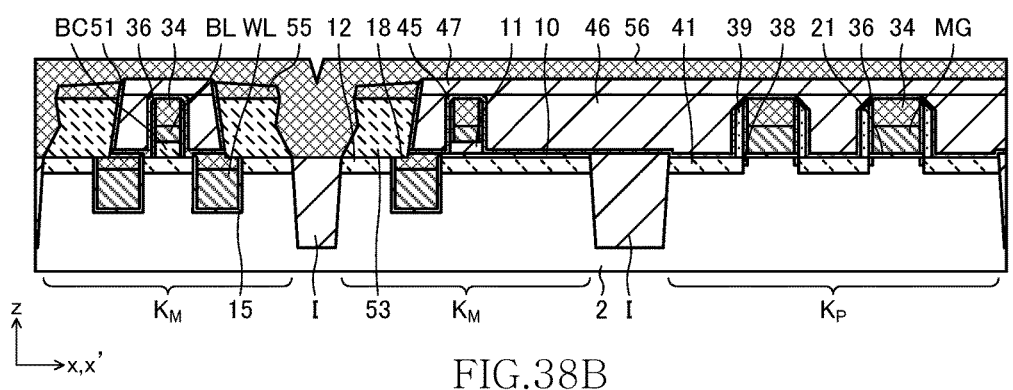
Figure 38C:
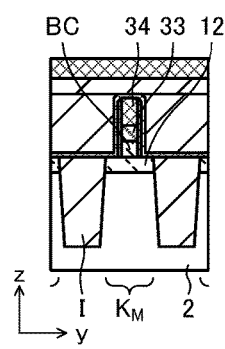
Figure 38D:
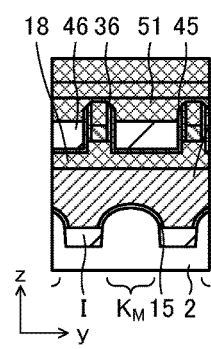
Figure 38E:
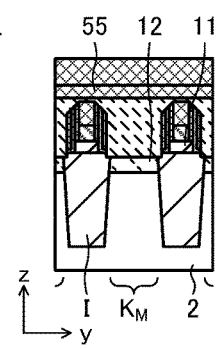
Figure 38F:
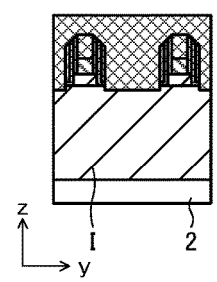
Figure 42A:
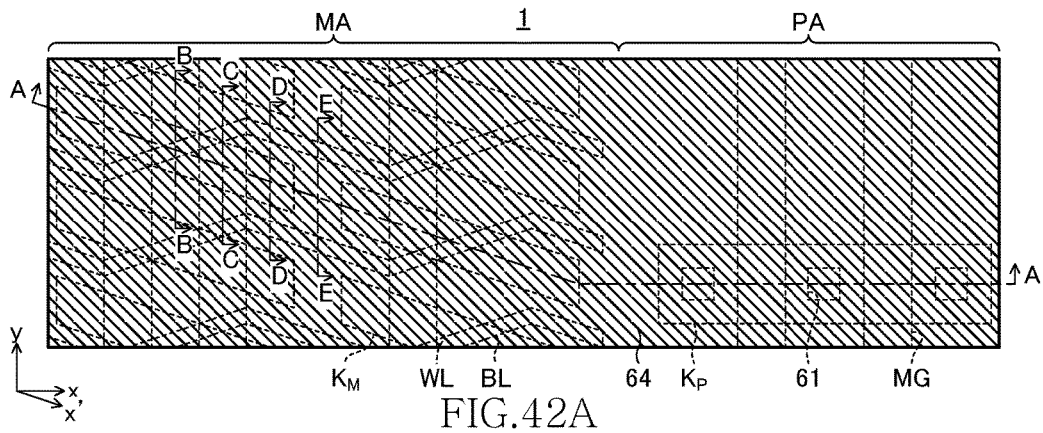
Figure 42B:
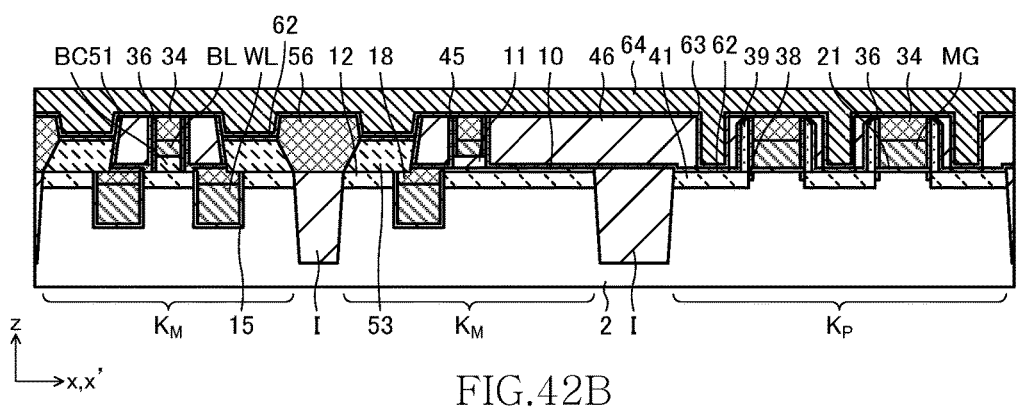
Figure 42C:
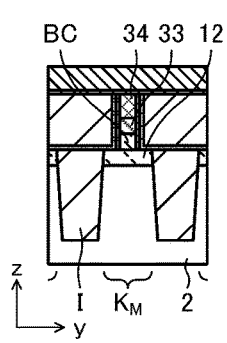
Figure 42D:
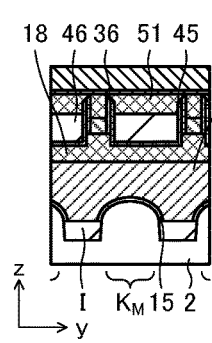
Figure 42E:
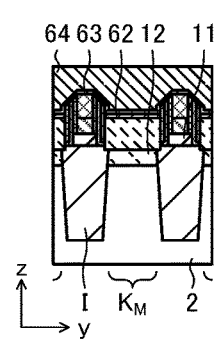
Figure 42F:
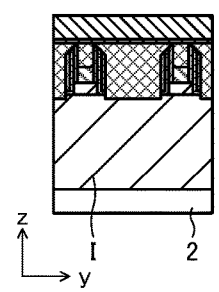
Figure 43A:
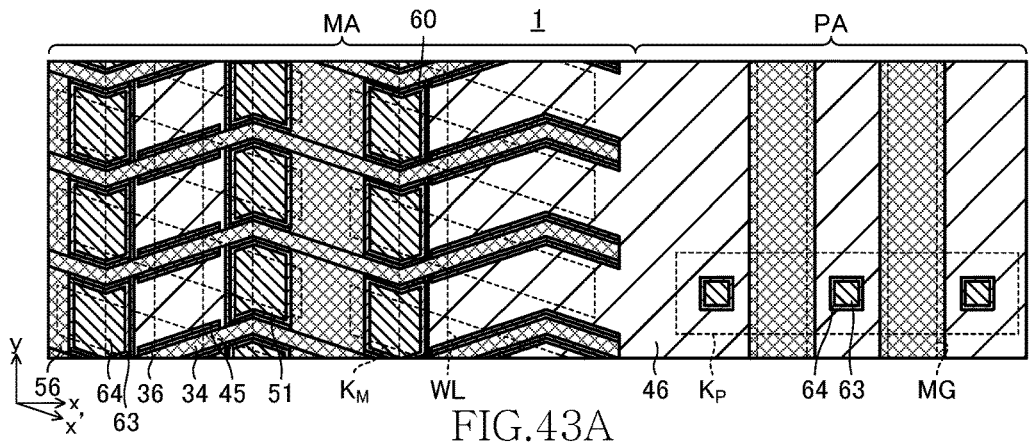
Figure 43B:
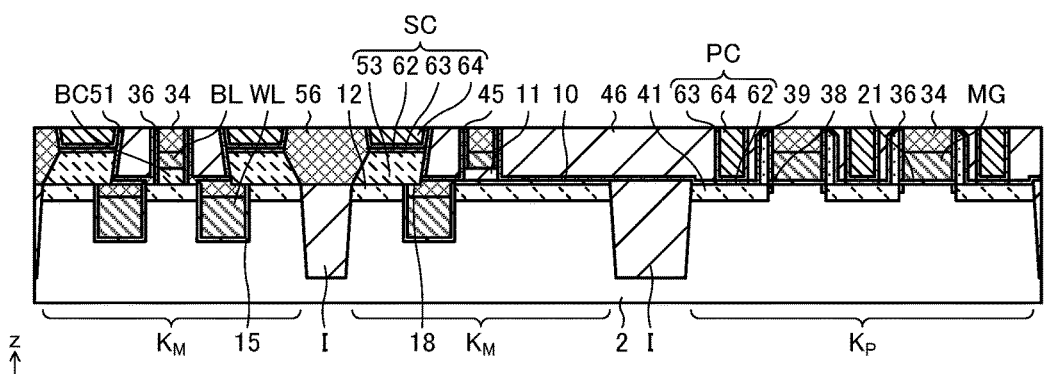
Figure 43C:
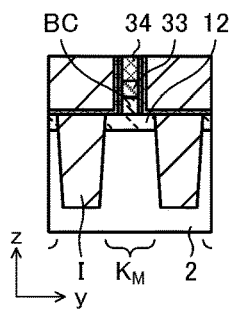
Figure 43D:
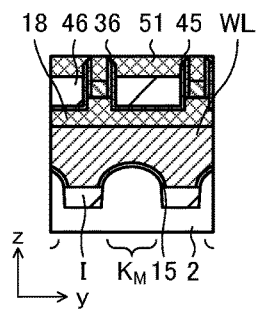
Figure 43E:
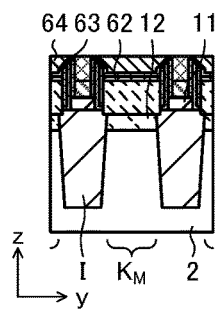
Figure 43F:
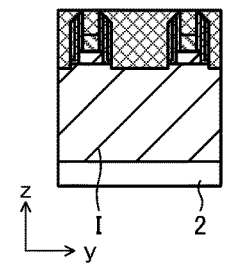
Figure 44A:
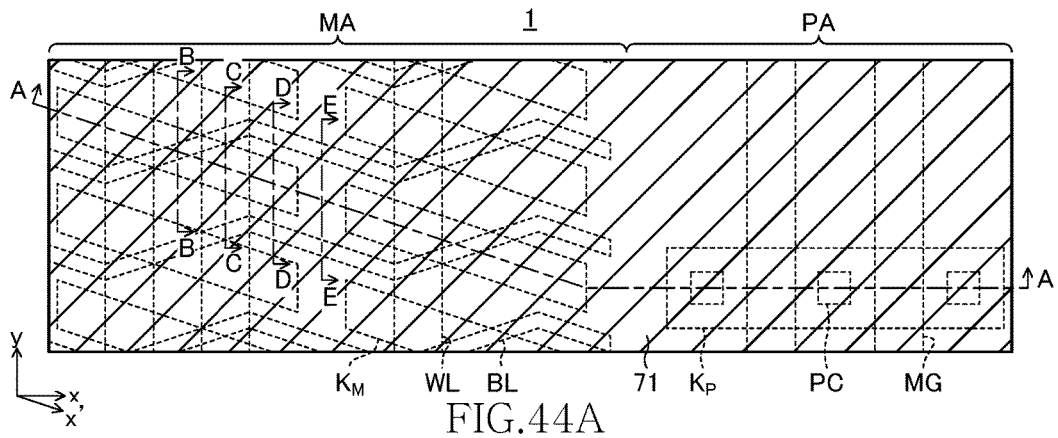
Figure 44B:
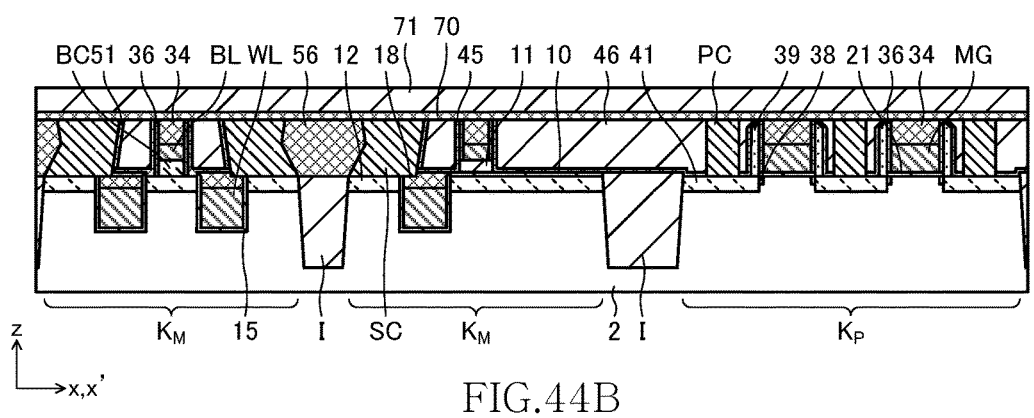
Figure 44C:
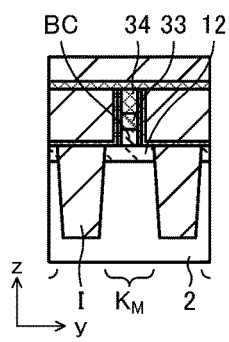
Figure 44D:
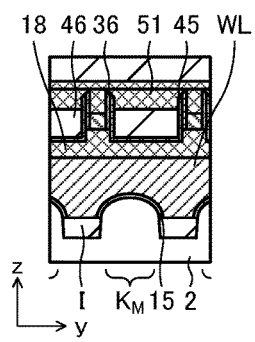
Figure 44E:
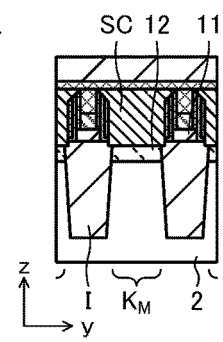
Figure 44F:
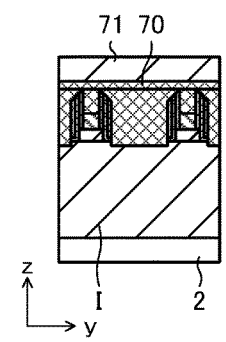
Figure 46A:
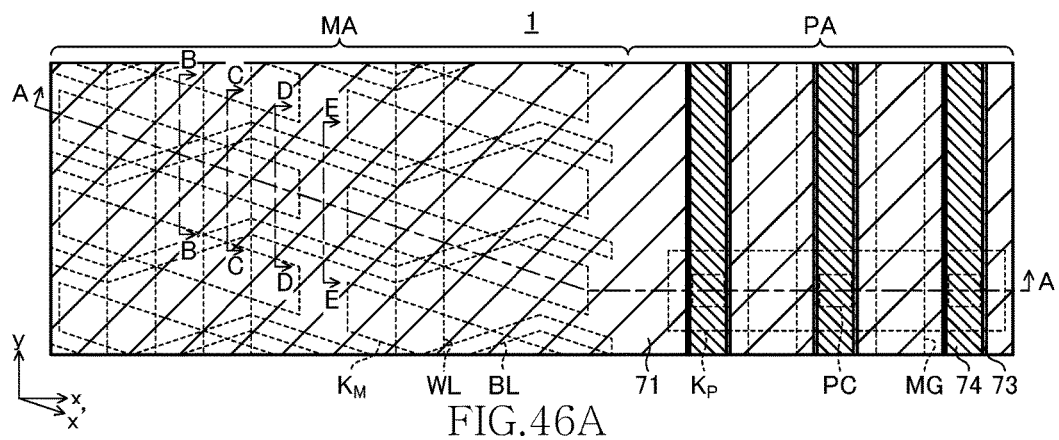
Figure 46B:
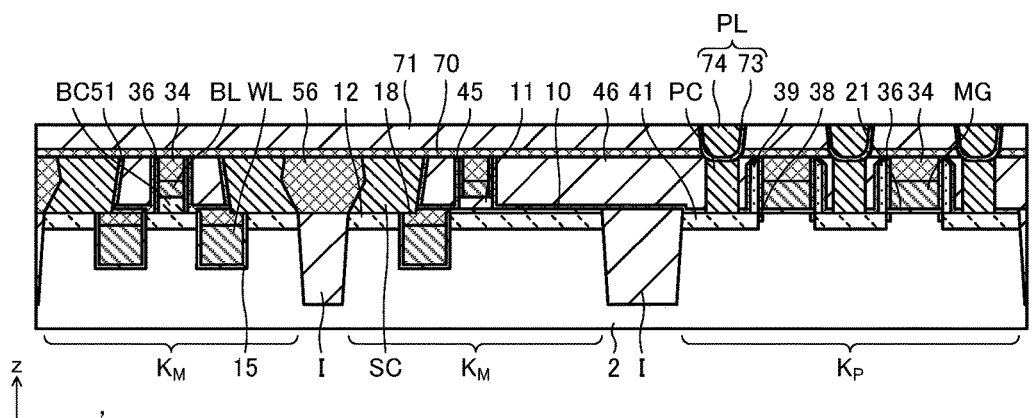
Figure 46C:
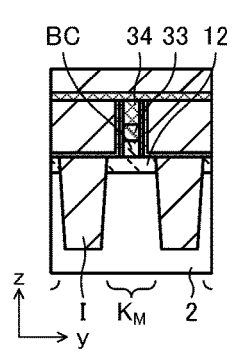
Figure 46D:
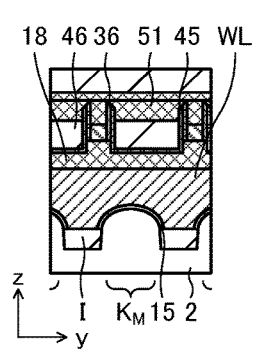
Figure 46E:
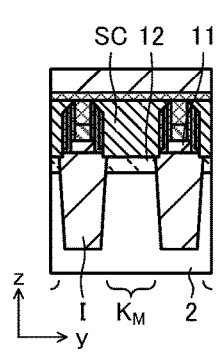
Figure 46F:
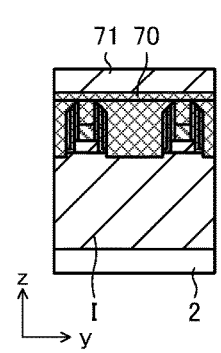
Figure 48A:
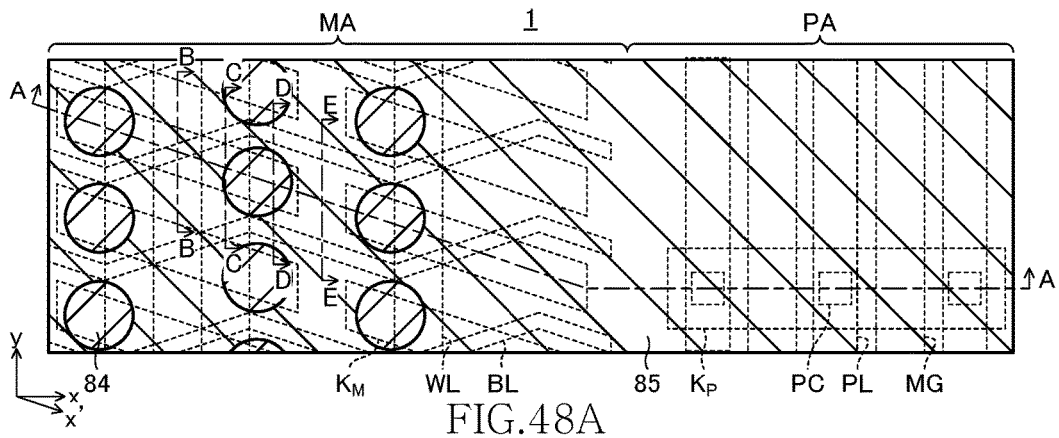
Figure 48B:
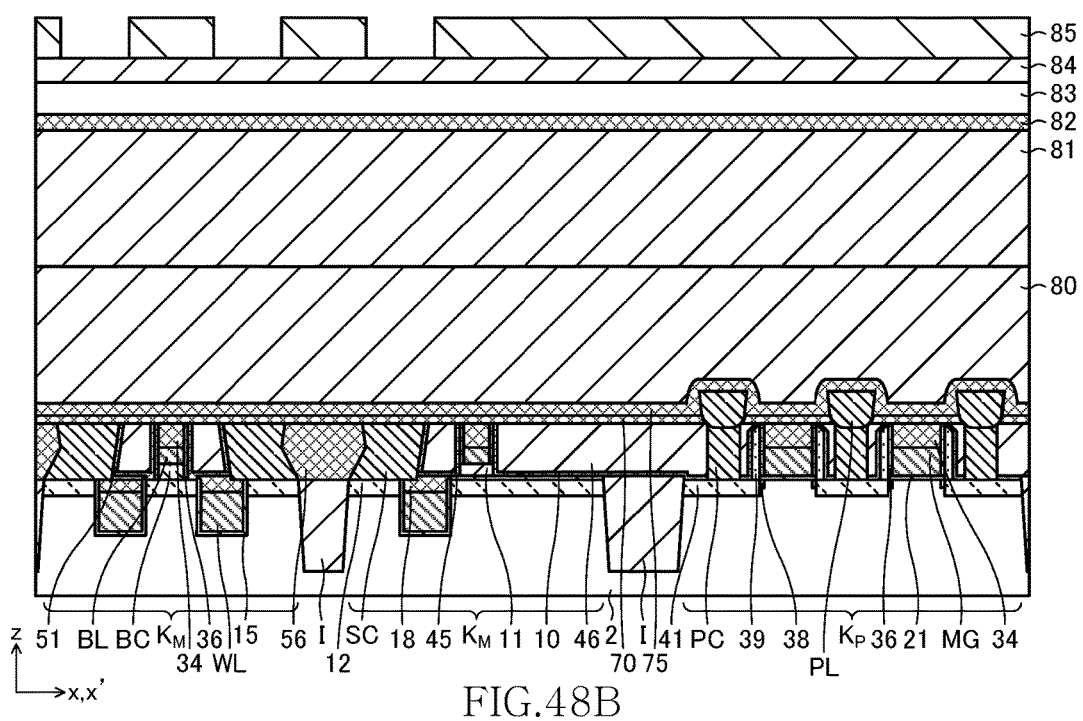
Figure 48C:
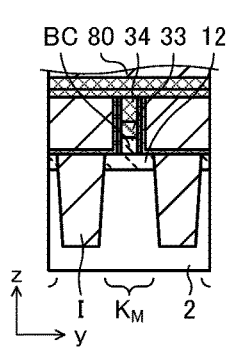
Figure 48D:
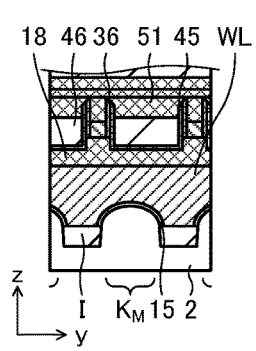
Figure 48E:
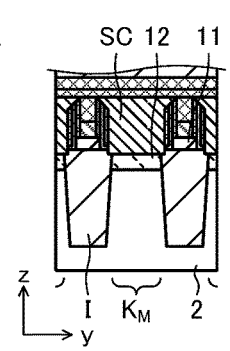
Figure 48F:
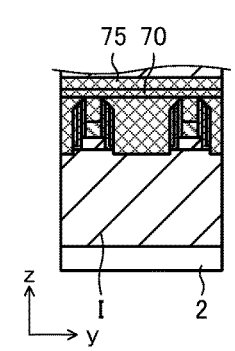
Figure 49A:
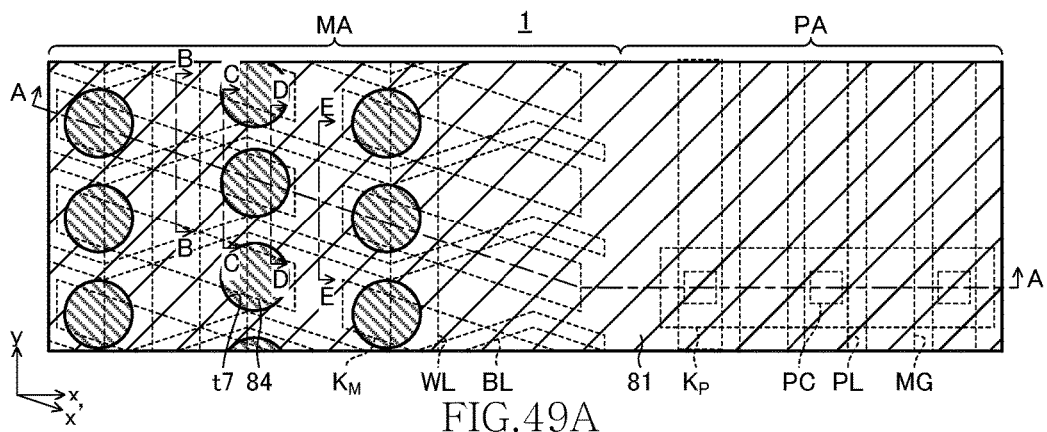
Figure 49B:
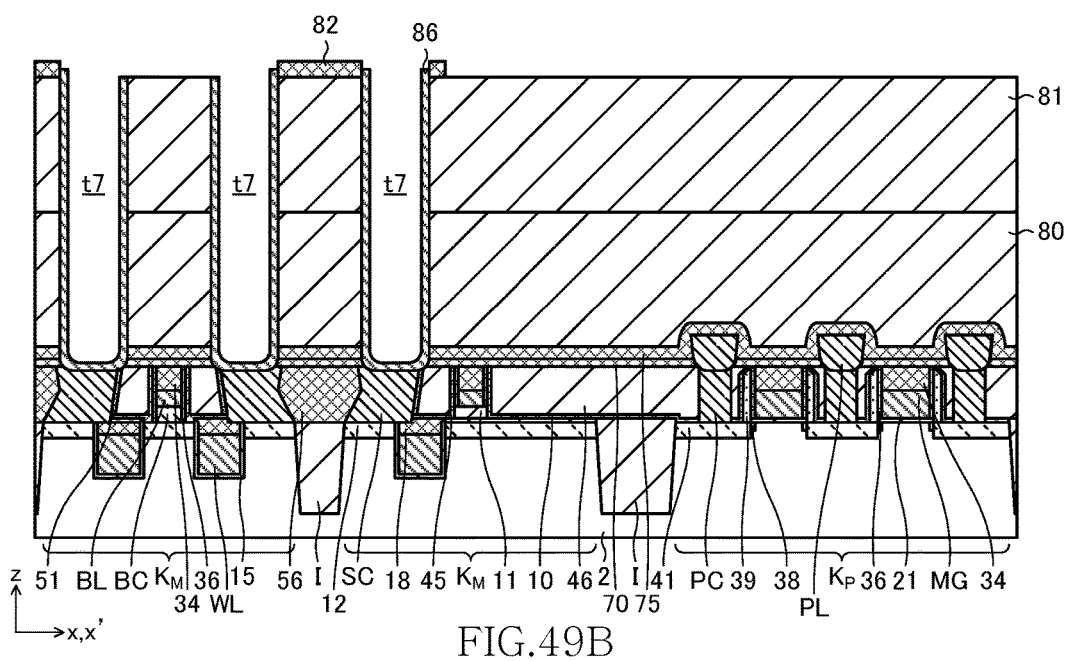
Figure 49C:
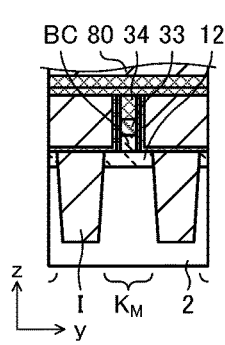
Figure 49D:
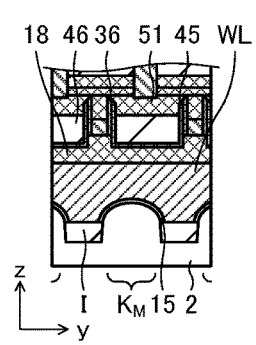
Figure 49E:
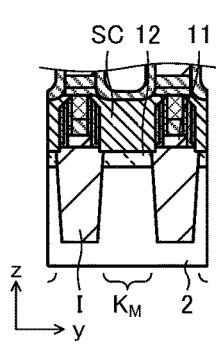
Figure 49F:
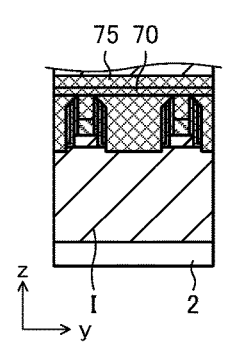
Figure 50A:
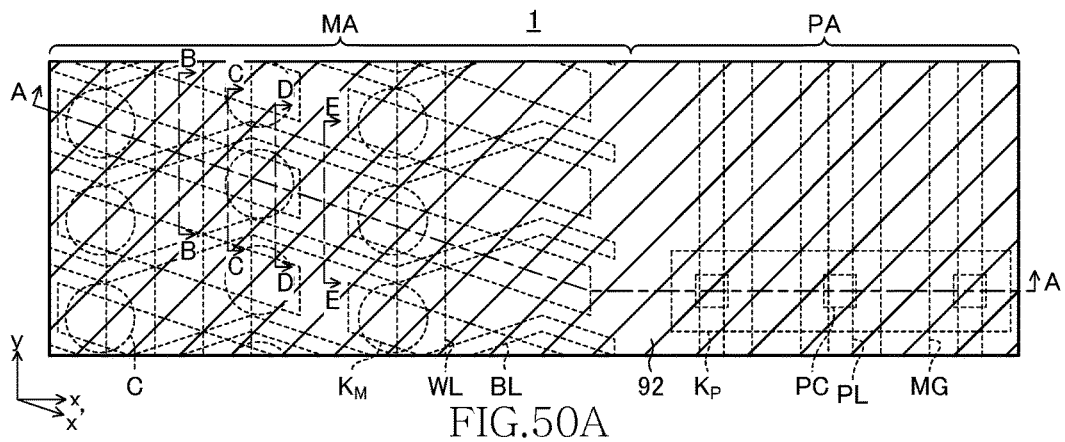
FIG. 50A is a plan view showing a semiconductor device according to a first modified embodiment of the present invention.
Figure 50B:
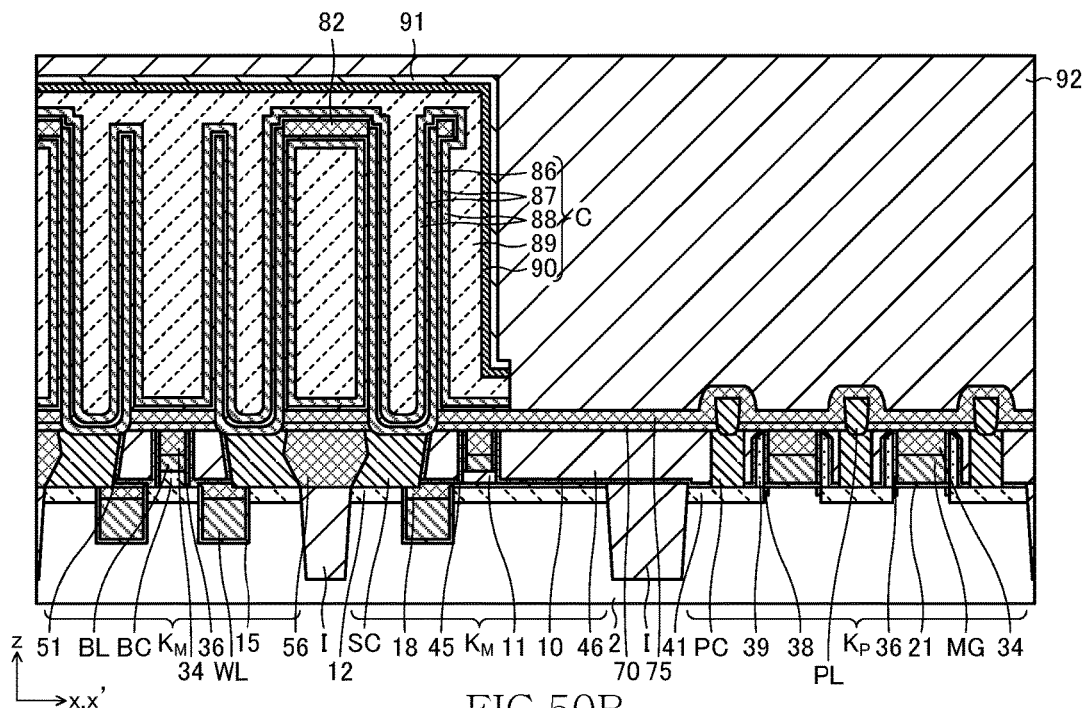
FIGS. 50B to 50F are respectively cross sectional views of the semiconductor device along lines A-A to E-E in FIG. 50A.
Figure 50C:
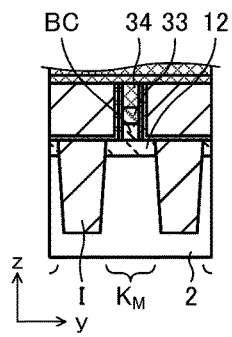
Figure 50D:
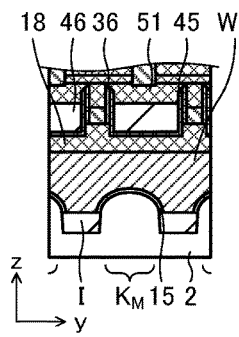
Figure 50E:
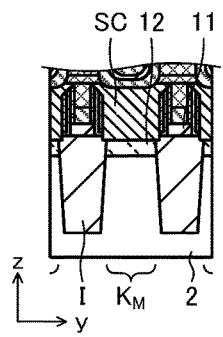
Figure 50F:
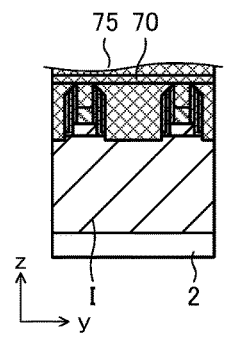

The storage-node contact plugs SC and the peripheral contact plugs PC shown in FIG. 1 is then formed. Specifically, as shown in FIGS. 34A to 34F, a resist 50 is first formed on the entire surface and openings that spread in the x direction in both sides of the element isolation region I extending in the y direction in the memory cell area MA are provided in the resist 50 as shown in FIG. 34A. Etching is then performed using the resist 50 having the openings as a mask to form storage-node contact sack holes t3 passing through the polysilicon film 48, the silicate glass film 47, and the interlayer insulating film 46 as shown in FIGS. 34A to 34F. The liner film 45 is exposed on the bottom surfaces of the storage-node contact SAC holes t3 formed in this way.

A silicon nitride film is then formed on the entire surface and etchback is then performed to form a side-wall insulating films 51 that covers the inner side surfaces of the storage-node contact SAC holes t3 as shown in FIGS. 35A to 35F. This etchback also removes the liner film 45 exposed on the bottom surfaces of the storage-node contact SAC holes t3 and the thermal oxide film 10 located thereunder together with parts of the silicon nitride film formed on a horizontal plane.

A polysilicon film 53 doped with N-impurities is then formed and etched back, whereby the polysilicon film 53 is embedded in lower portions of the storage-node contact SAC holes t3 as shown in FIGS. 35A to 35F. The residual film thickness of the polysilicon film 53 may be set to locate the upper surface of the polysilicon film 53 at a position higher than the upper surfaces of the bit lines BL and higher than the upper surface of the hard mask film 34.

A silicon nitride film 55 is then formed on the entire surface by the CVD method as shown in FIGS. 36A to 36F. The silicon nitride film 55 is then etched back to cause the silicon nitride film 55 to remain only on the inner side surfaces of the storage-node contact SAC holes t3 as shown in FIGS. 37A to 37F. Then the polysilicon film 53 is etched by dry etching using the remaining silicon nitride film 55 as a mask. This etching is performed until the polysilicon film 53 is divided in the x direction and the element isolation region I is completely exposed on the bottom surfaces of the storage-node contact SAC holes t3.

The silicon nitride film 56 is then formed on the entire surface by the CVD method as shown in FIGS. 38A to 38F. The silicon nitride film 56 is formed so that spaces in the storage-node contact SAC holes t3 (areas between adjacent parts of the polysilicon film 53 divided in the x direction) are completely filled with the silicon nitride film 56. After the silicon nitride film 56 is formed, polishing according to CMP is performed until the upper surface of the polysilicon film 53 is exposed as shown in FIGS. 39A to 39F.

The polysilicon film 53 is then selectively etched back to form concave portions t4 (second contact holes) on an upper side of the polysilicon film 53 as shown in FIGS. 40A to 40F. Mask patterns (not shown) are further formed and the interlayer insulating film 46 and the liner film 45 are etched using the mask patterns as a mask to form peripheral contact holes t5 (first contact holes) that expose the impurity diffusion layers in formation areas of the peripheral contact plugs PC as shown in FIGS. 41A to 41F.

A cobalt film (not shown) is then formed on the entire surface including the bottom surfaces of the concave portions t4 and the peripheral contact holes t5 by sputtering. Then, parts of the cobalt film in contact with silicon or polysilicon are changed into a cobalt silicide film by heat treatment. In this way, a cobalt silicide film 62 shown in FIGS. 42A to 42F is formed on the bottom surfaces of the concave portions t4 and the peripheral contact holes t5. Parts of the cobalt film not having changed into the cobalt silicide film 62 are all removed by wet etching after the heat treatment.

A stacked film 63 including titanium nitride and titanium and a tungsten film 64 are then successively formed on the entire surface by the CVD method as shown in FIGS. 42A to 42F. Polishing according to CMP is then performed until the silicon nitride film 56 is exposed. Accordingly, the storage-node contact plugs SC (second contact plugs) and the peripheral contact plugs PC (first contact plugs) are formed as shown in FIGS. 43A to 43F. A structure of each of the storage-node contact plugs SC formed in this way is a two-layer structure including a lower-layer contact plug formed of the polysilicon film 53 and an upper-layer contact plug formed of the cobalt silicide film 62, the stacked film 63 including titanium nitride and titanium, and the tungsten film 64. The peripheral contact plugs PC are formed of the cobalt silicide film 62, the stacked film 63 including titanium nitride and titanium, and the tungsten film 64.

The conductive lines PL shown in FIGS. 1A to 1F are then formed. Specifically, as shown in FIGS. 44A to 44F, the silicon nitride film 70 (second insulating layer) and a silicon oxide film 71 are successively formed on the entire surface including the upper surface of the interlayer insulating film 46. In FIGS. 44A to 44F and the following figures, the polysilicon film 53, the cobalt silicide film 62, the stacked film 63 including titanium nitride and titanium, and the tungsten film 64 are illustrated collectively as the storage-node contact plugs SC. The cobalt silicide film 62, the stacked film 63 including titanium nitride and titanium, and the tungsten film 64 are illustrated collectively as the peripheral contact plugs PC.

Wiring trenches t6 having patterns of the conductive lines PL are then formed in the silicon nitride film 70 and the silicon oxide film 71 by photolithography and etching as shown in FIGS. 45A to 45F. Each of the wiring trenches t6 has a depth slightly exceeding a depth that passes through the silicon nitride film 70 and the silicon oxide film 71. Accordingly, the upper surfaces of the peripheral contact plugs PC are exposed on the bottom surfaces of the wiring trenches t6.

A titanium nitride film 73 and a tungsten film 74 are then successively formed by the CVD method and are polished according to CMP until the upper surface of the silicon oxide film 71 is exposed. Thereby the wiring trenches t6 are filled with a stacked film (first conductive layer) including the titanium nitride film 73 and the tungsten film 74 as shown in FIGS. 46A to 46F. The stacked film 73 and 74 thus formed in the wiring trenches t6 constitutes the conductive lines PL. After the conductive lines PL are formed, the silicon oxide film 71 is selectively removed by etching and then the silicon nitride film 75 (third insulating layer) is formed on the entire surface as shown in FIGS. 47A to 47F. The silicon nitride film 75 has a thickness that the side and upper surfaces of the conductive lines PL are completely covered with the silicon nitride film 75.

A principle effect of this embodiment of the present invention is provided by these formation steps of the conductive lines PL. That is, in the above steps, the conductive lines PL are formed not by patterning a conductive film, but by first forming the silicon nitride film 70, forming the wiring trenches t6 therein, and embedding a conductive film in the wiring trenches t6. Therefore, it can be said that the storage-node contact plugs SC and the hard mask film 34 are covered with the silicon nitride film 70 at a time of etching of the conductive film that constitutes the conductive lines PL and that damaging of the storage-node contact plugs SC and the hard mask film 34 at the time of formation of the conductive film that constitutes the conductive lines PL is thus suitably prevented.

The cell capacitors C shown in FIGS. 1A to 1F are then formed. Specifically, the interlayer insulating film 80 made of BPSG (Boron phosphorus Silicon Glass), the silicon oxide film 81, the silicon nitride film 82, a silicon film 83, and a silicon oxide film 84 are successively formed as shown in FIGS. 48A to 48F. A resist 85 is then further formed on the upper surface of the silicon oxide film 84 and openings are formed in the resist 85 on formation areas of the cell capacitors C. Formation patterns of the cell capacitors C are first transferred onto the silicon oxide film 84 and the silicon film 83 by etching using the resist 85 as a mask, and the formation patterns of the cell capacitors C are then transferred onto the silicon nitride film 82, the silicon oxide film 81, and the interlayer insulating film 80 by etching using the silicon oxide film 84 and the silicon film 83 as a mask. Accordingly, cylinder holes t7 (openings) passing through the silicon nitride film 82, the silicon oxide film 81, and the interlayer insulating film 80 are formed in the formation areas of the cell capacitors C, respectively, as shown in FIGS. 49A to 49F. The upper surfaces of the corresponding storage-node contact plugs SC are exposed on the bottom surfaces of the cylinder holes t7, respectively.

A stacked film including titanium nitride and titanium is then formed on the entire surface, and a silicon oxide film doped with P-impurities (not shown) is further formed thereon. The silicon oxide film doped with the P-impurities has a poor coverage and thus closes the upper ends of the cylinder holes t7 without entering into the cylinder holes t7. A resist (not shown) is applied on the entire surface in this state and the silicon nitride film 82 is patterned into patterns of the support film having explained with reference to FIGS. 1A to 1F by photolithography and etching. This etching also etches the stacked film including titanium nitride and titanium at the same time. Accordingly, parts of the formed stacked film including titanium nitride and titanium, formed outside of the cylinder holes t7 are removed and the lower electrode 86 in a bottomed cylinder shape is formed in each of the cylinder holes t7 to cover the inner surface. The lower surfaces of the lower electrodes 86 thus formed are in contact with the upper surfaces of the corresponding storage-node contact plugs SC, respectively.

After the silicon oxide film 81 and the interlayer insulating film 80 are then removed by etching, the capacitor insulating film 87 (fourth insulating layer), the upper electrode 88 (third conductive layer) being a titanium nitride film, and the upper electrode 89 being a polysilicon film doped with boron are successively formed on the entire surface by the CVD method. The capacitor insulating film 87 may be a stacked film (a LAZO film) including an amorphous zirconium oxide film and an aluminum oxide. Further, the upper electrode 90 being a tungsten film and the silicon oxide film 91 are successively formed on the entire surface by sputtering as shown in FIGS. 1A to 1F. With the foregoing steps, the cell capacitors C are completed. Parts of the films formed in the peripheral circuit area PA are then removed by photolithography and etching, and the silicon oxide film 92 is further formed on the entire surface and is flattened according to CMP, whereby the semiconductor device 1 shown in FIGS. 1A to 1F is completed.

As explained above, with the semiconductor device 1 and the manufacturing method thereof according to the present embodiment, the conductive lines PL connected to the peripheral contact plugs PC can be formed in a state where the silicon nitride film 70 covers the storage-node contact plugs SC and the hard mask film 34. Therefore, damaging of the storage-node contact plugs SC and the hard mask film 34 at the time of formation of the conductive lines PL can be prevented. Accordingly, a reduction in a short margin between the bit lines BL and the lower electrodes 86 can be also prevented.

It is apparent that the present invention is not limited to the above embodiments, but may be modified and changed without departing from the scope and spirit of the invention.

For example, the widths of the conductive lines PL are larger than the widths of the peripheral contact plugs PC in the x direction and the entire upper surfaces of the peripheral contact plugs PC are in contact with the lower surfaces of the wires PL in the above embodiment. However, the widths of the wires PL can be alternatively set to be smaller than the widths of the peripheral contact plugs PC in the x direction to cause only parts of the upper surfaces of the peripheral contact plugs PC to be in contact with the lower surfaces of the conductive lines PL as shown in FIGS. 50A to 50F.

Furthermore, not only the silicon nitride film 70 but also the silicon oxide film 71 is formed before the wiring trenches t6 for embedding therein the conductive lines PL are formed and the wiring trenches t6 are formed to pass through the silicon nitride film 70 and the silicon oxide film 71 in the above embodiment. However, it is alternatively possible to form the silicon nitride film 70 thickly and to form the wiring trenches t6 only in the silicon nitride film 70 as shown in FIGS. 51A to 51F. In this case, the silicon oxide film 71 and the silicon nitride film 75 are not used. However, this causes the silicon nitride film 70 serving as an etching stopper to be too thick while simplifying the manufacturing steps. Therefore, it is more difficult to ensure a short margin between the bit lines BL and the lower electrodes 86 than in the above embodiment.

In addition, while not specifically claimed in the claim section, the applicant reserves the right to include in the claim section of the application at any appropriate time the following methods:

A1. A manufacturing method of a semiconductor device, the manufacturing method comprising:

forming a first insulating layer on a surface of a semiconductor substrate;

forming first and second contact holes in the first insulating layer;

forming a conductive film filling the first and second contact holes;

forming first and second contact plugs in the first and second contact holes, respectively, by partially removing the conductive film on the first insulating layer;

forming a second insulating layer on the first insulating layer;

forming a wiring trench exposing an upper surface of the first contact plug in the second insulating layer;

filling the wiring trench with a first conductive layer;

forming a third insulating layer on the second insulating layer;

forming an opening passing through at least the second and third insulating layers to expose an upper surface of the second contact plug; and forming a second conductive layer on an inner surface of the opening.

A2. The manufacturing method of a semiconductor device as described in A1, further comprising implanting impurities into the surface of the semiconductor substrate to form first and second diffusion layers, wherein the first and second contact plugs are connected to the first and second diffusion layers, respectively.

A3. The manufacturing method of a semiconductor device as described in A1, further comprising:

forming a fourth insulating layer covering the second conductive layer; and forming a third conductive layer facing the second conductive layer across the fourth insulating layer.

A4. The manufacturing method of a semiconductor device as described in A3, wherein the second and third conductive layers and the fourth insulating layer constitute a capacitive element.

A5. The manufacturing method of a semiconductor device as described in A2, further comprising:

implanting impurities into the surface of the semiconductor substrate to form a third diffusion layer; and forming a wiring layer connected to the third diffusion layer before the first insulating layer is formed.

What is claimed is:

1. A semiconductor device comprising:
   a substrate comprising a memory cell area and a peripheral circuitry area laterally of the memory cell area;
   a conductive line disposed within the peripheral circuitry area, the conductive line including a side surface and a upper surface;
   a capacitor disposed within the memory cell area, the capacitor including a lower electrode, the lower electrode including a side surface;
   a first insulating material extending continuously between the conductive line and the lower electrode, the first insulating material being in direct physical contact with a part of the side surface of the conductive line and in direct physical contact with a part of the side surface of the lower electrode of the capacitor; and
   a second insulating material covering and in direct physical contact with the upper surface of the conductive line, the second insulating material extending continuously over the first insulating layer and being in direct physical contact with a remaining part of the side surface of the conductive line and being in direct physical contact with the side surface the lower electrode of the capacitor.

2. The device of claim 1, wherein capacitor further comprises:
   an upper electrode surrounding the lower electrode and comprising a cup shape protruding upwardly; and
   a capacitor insulating film intervening between the upper and the lower electrodes of the capacitor.

3. The device of claim 1, further comprising:
   a third insulating material extending continuously over the capacitor and over the second insulating layer, wherein the second insulating material intervenes between the third insulating layer and the conductive line.

4. The device of claim 1, wherein the conductive line comprises a trapezoidal shape.

5. The device of claim 4, wherein the trapezoidal shape includes a planar upper surface and a rounded bottom portion.

6. A semiconductor device comprising:
   a first conductive structure including a side surface and an upper surface;
   a second conductive structure laterally spaced from the first conductive structure, the second conductive structure including a side surface;
   a first insulating material in direct physical contact with a lower portion of the side surface of the first conductive structure, the first insulating material extending to the second conductive structure and being in direct physical contact therewith; and
   a second insulating material extending over the first insulating material, the second insulating material covering and being directly against a remaining portion of the side surface of the first conductive structure and being in direct physical contact with the side surface of the second conductive structure, the second insulating material being directly against and covering the upper surface of the first conductive structure.

7. The device of claim 6, wherein the first conductive structure is in a trapezoidal shape.

8. The device of claim 6, wherein the second conductive structure protrudes upwardly from the second insulating layer.

9. A semiconductor device comprising:
   a first conductive layer including a side surface and an upper surface;
   a second conductive layer including a side surface and spaced from the first conductive layer;
   a first insulating layer extending from a part of the side surface of the first conductive layer in contact therewith and terminating at a part of the side surface of the second conductive layer in contact therewith; and
   a second insulating layer extending from a remaining part of the side surface of the first conductive layer in contact therewith and terminating at another part of the side surface of the second conductive layer in contact therewith, the second insulating layer being elongated over the upper surface of the first conductive layer to cover the first conductive layer, wherein the second conductive layer protrudes upwardly from the second insulating layer and serves as a lower electrode of a capacitor, the capacitor comprising a third conductive layer serving as a upper electrode and surrounding the second conductive layer, and a capacitor insulating film intervening between the second and the third conductive layers.

10. The device of claim 9, wherein the third conductive layer is elongated over the second insulating layer to terminate between the first and the second conductive layers.

11. A semiconductor device comprising:
    a conductive line disposed within a peripheral circuitry area of a substrate, the conductive line including a side surface and an exposed upper surface;
    a capacitor disposed within the memory cell area, the capacitor including a lower electrode having a side surface;
    a first insulating layer extending between the conductive line and the lower electrode in contact with a part of the side surface of the conductive line and in contact with a part of the side surface of the lower electrode of the capacitor; and a second insulating layer covering and in direct physical contact with the exposed upper surface of the conductive line and extending over the first insulating layer.

\* \* \* \* \*